US009833802B2

(12) United States Patent
Kalistaja et al.

(10) Patent No.: US 9,833,802 B2
(45) Date of Patent: Dec. 5, 2017

(54) METHODS AND APPARATUS FOR CONDUCTIVE ELEMENT DEPOSITION AND FORMATION

(71) Applicant: PULSE FINLAND OY, Oulunsalo (FI)

(72) Inventors: Esa Kalistaja, Oulu (FI); Elli Galla, Muhos (FI); Dan Kuehler, San Diego, CA (US); Winthrop Childers, San Diego, CA (US)

(73) Assignee: Pulse Finland OY, Oulunsalo (FI)

( * ) Notice: Subject to any disclaimer, the term of this patent is extended or adjusted under 35 U.S.C. 154(b) by 0 days.

(21) Appl. No.: 14/736,040

(22) Filed: Jun. 10, 2015

(65) Prior Publication Data
US 2015/0375246 A1    Dec. 31, 2015

Related U.S. Application Data

(60) Provisional application No. 62/018,410, filed on Jun. 27, 2014, provisional application No. 62/026,560, filed on Jul. 18, 2014.

(51) Int. Cl.
H05K 1/00       (2006.01)
B05B 12/04     (2006.01)
(Continued)

(52) U.S. Cl.
CPC ............. B05B 12/04 (2013.01); B05B 17/04 (2013.01); B05D 1/28 (2013.01); H05K 3/12 (2013.01);
(Continued)

(58) Field of Classification Search
CPC ........... B05B 12/04; B05B 17/04; B05D 1/28; H05K 3/12; H05K 3/1241; H05K 3/125
(Continued)

(56) References Cited

U.S. PATENT DOCUMENTS 3,614,554 A    10/1971  Shield et al.
4,253,231 A    3/1981   Nouet
(Continued)

FOREIGN PATENT DOCUMENTS

CN    1262492 A    8/2000
CN    1484935 A    3/2004
(Continued)

OTHER PUBLICATIONS

Ahn, et al., Omnidirectional Printing of Flexible, Stretchable, and Spanning Silver Microelectrodes, Mar. 20, 2009, vol. 323, www.sciencemag.com, 4 pages.
(Continued)

Primary Examiner — Tremesha S Willis
(74) Attorney, Agent, or Firm — Gazdzinski & Associates, PC

(57) ABSTRACT

A conductive element such as an antenna, for use in electronic devices, including mobile devices such as cellular phones, smartphones, personal digital assistants (PDAs), laptops, and wireless tablets, and methods of, and apparatus for, forming the same. In one exemplary aspect, the present disclosure relates to a conductive antenna formed using deposition of conductive fluids as well as the method and equipment for forming the same. In one embodiment, a complex (3D) conductive trace is formed using two or more different print technologies via creation of different domains within the conductive trace pattern.

20 Claims, 27 Drawing Sheets

(51) Int. Cl.
*H05K 3/12* (2006.01)
*B05B 17/04* (2006.01)
*B05D 1/28* (2006.01)
*H05K 1/11* (2006.01)
*H05K 3/14* (2006.01)

(52) U.S. Cl.
CPC ........... *H05K 3/125* (2013.01); *H05K 3/1241* (2013.01); *H05K 1/111* (2013.01); *H05K 3/14* (2013.01); *H05K 2201/0245* (2013.01); *H05K 2201/0391* (2013.01); *H05K 2201/0999* (2013.01); *H05K 2201/10098* (2013.01); *H05K 2203/1366* (2013.01); *H05K 2203/1476* (2013.01)

(58) Field of Classification Search
USPC ............ 174/250, 251, 253, 255–258; 29/829
See application file for complete search history.

(56) References Cited

U.S. PATENT DOCUMENTS

| | | | |
|---|---|---|---|
| 4,547,961 A | 10/1985 | Bokil et al. | |
| 4,847,986 A | 7/1989 | Meinel | |
| 5,055,816 A | 10/1991 | Altman et al. | |
| 5,126,714 A | 6/1992 | Johnson | |
| 5,257,000 A | 10/1993 | Billings et al. | |
| 5,487,214 A | 1/1996 | Walters | |
| 5,781,091 A | 7/1998 | Krone et al. | |
| 6,165,386 A | 12/2000 | Endo et al. | |
| 6,184,833 B1 | 2/2001 | Tran | |
| 6,285,327 B1 | 9/2001 | See | |
| 6,421,013 B1 | 7/2002 | Chung | |
| 6,440,750 B1 | 8/2002 | Feygenson et al. | |
| 6,445,271 B1 | 9/2002 | Johnson | |
| 6,533,866 B1 | 3/2003 | Franz et al. | |
| 6,745,058 B2 | 6/2004 | Boulay et al. | |
| 6,962,511 B2 | 11/2005 | Gutierrez et al. | |
| 7,112,246 B2 | 9/2006 | Schucker | |
| 7,241,181 B2 | 7/2007 | Machado et al. | |
| 7,311,937 B2 | 12/2007 | Hashimoto | |
| 7,345,645 B2 | 3/2008 | Cho | |
| 7,477,194 B2 | 1/2009 | Coleman | |
| 7,480,979 B2 | 1/2009 | Moren | |
| 7,642,918 B2 | 1/2010 | Kippelen et al. | |
| 7,782,211 B2 | 8/2010 | Yamaguchi et al. | |
| 7,859,481 B2 | 12/2010 | Muraoka | |
| 8,115,684 B2 | 2/2012 | Palin | |
| 8,148,818 B2 | 4/2012 | Yamazaki et al. | |
| 8,237,248 B2 | 8/2012 | Yamazaki et al. | |
| 8,284,117 B2 | 10/2012 | Kim et al. | |
| 8,405,561 B2 | 3/2013 | Handy et al. | |
| 8,659,487 B2 | 2/2014 | Fan et al. | |
| 8,679,573 B2 | 3/2014 | Van Sciver et al. | |
| 2001/0043135 A1 | 11/2001 | Yamada et al. | |
| 2002/0118350 A1* | 8/2002 | Cabiri | G03F 7/70383 355/72 |
| 2002/0121959 A1 | 9/2002 | Fontana et al. | |
| 2003/0173678 A1 | 9/2003 | Mizukoshi | |
| 2004/0144958 A1 | 7/2004 | Conaghan et al. | |
| 2004/0203173 A1 | 10/2004 | Peck et al. | |
| 2005/0266154 A1 | 12/2005 | Devos et al. | |
| 2006/0159899 A1 | 7/2006 | Edwards et al. | |
| 2006/0176139 A1 | 8/2006 | Pleskach et al. | |
| 2006/0290457 A1 | 12/2006 | Lee et al. | |
| 2007/0001796 A1 | 1/2007 | Waffenschmidt et al. | |
| 2007/0102685 A1 | 5/2007 | Kodas et al. | |
| 2007/0216510 A1 | 9/2007 | Jeong et al. | |
| 2008/0204516 A1 | 8/2008 | Kim et al. | |
| 2008/0314165 A1* | 12/2008 | Rosenberg | A63B 71/0605 73/862.621 |
| 2009/0124195 A1 | 5/2009 | Kamijoh et al. | |
| 2009/0145640 A1 | 6/2009 | Toyoda | |
| 2009/0146658 A1 | 6/2009 | McDowell et al. | |
| 2009/0207198 A1 | 8/2009 | Muraoka | |
| 2009/0226605 A1 | 9/2009 | Chopra et al. | |
| 2009/0229108 A1 | 9/2009 | Shamblin et al. | |
| 2010/0011568 A1 | 1/2010 | Harding | |
| 2010/0052997 A1 | 3/2010 | Kan et al. | |
| 2010/0127084 A1 | 5/2010 | Pavate et al. | |
| 2010/0141533 A1 | 6/2010 | Gardner et al. | |
| 2011/0050381 A1 | 3/2011 | Olson | |
| 2011/0096388 A1 | 4/2011 | Agrawal et al. | |
| 2011/0140978 A1 | 6/2011 | Maruyama | |
| 2011/0285492 A1 | 11/2011 | Wang et al. | |
| 2011/0304520 A1 | 12/2011 | Djordjevic et al. | |
| 2012/0038514 A1 | 2/2012 | Bang | |
| 2012/0058676 A1 | 3/2012 | Schaffer et al. | |
| 2012/0081420 A1 | 4/2012 | Yu et al. | |
| 2012/0146855 A1 | 6/2012 | Spencer et al. | |
| 2012/0235879 A1 | 9/2012 | Eder et al. | |
| 2012/0319905 A1 | 12/2012 | Fan et al. | |
| 2013/0076572 A1 | 3/2013 | Lee et al. | |
| 2013/0076573 A1 | 3/2013 | Rappoport et al. | |
| 2013/0076574 A1 | 3/2013 | Rappoport et al. | |
| 2013/0176176 A1 | 7/2013 | Vos et al. | |
| 2013/0229314 A1 | 9/2013 | Kuehler et al. | |
| 2013/0234899 A1 | 9/2013 | Pope et al. | |

FOREIGN PATENT DOCUMENTS

| | | |
|---|---|---|
| CN | 101189625 A | 5/2008 |
| CN | 101577361 A | 11/2009 |
| EP | 2065837 A1 | 6/2009 |
| EP | 2418924 A1 | 2/2012 |
| EP | 2693564 A1 | 2/2014 |
| JP | H0210705 A | 1/1990 |
| JP | 2013065838 A | 4/2013 |
| KR | 20030064889 A | 8/2003 |
| KR | 20040084747 A | 10/2004 |
| KR | 20060063821 A | 6/2006 |
| KR | 20060133239 A | 12/2006 |
| TW | 201030628 A | 8/2010 |
| TW | 201043114 A | 12/2010 |
| TW | M419240 U | 12/2011 |
| WO | WO-02054841 A1 | 7/2002 |

OTHER PUBLICATIONS

Amin, et al., Performance-Optimized Quadrate Bowtie RFID Antennas for Cost-Effective and EGO-Friendly Industrial Applications, Progress in Electromagnetics Research, vol. 126, 49-64, 2012, 16 pages.
Barrio, et al., Screen-Printed Silver-Ink Antennas for Frequency-Reconfigurable Architectures in L TE Phones, Electronics Letters, Nov. 6, 2014, vol. 50, No. 23, pp. 1665-1667, 2 pages.
Filton, The Printed World, Briefing 3D Printing, The Economist, Feb. 12, 2011, 3 pages.
Koski, et al., Inkjet-printed passive UHF RFID tags: review and performance evaluation, Inti. Journal of Advanced Manufacturing Technology, reed Jun. 28, 2011, accepted Nov. 14, 2011, 18 pages.
Kuilla, et al., Recent Advances in Graphene Based Polymer Composites, Progress in Polymer Science 35 (2010) 1350-1375, 26 pages.
Maimaiti, Study of Inkjet printing as an Ultra-Low-Cost Antenna Prototyping Method and its Application to Conformal Wraparound Antennas for Sounding Rocket Sub-Payload, Utah State Univ., 2013, 85 pages.
Montanero J.M., et al., "Micrometer Glass Nozzles for Flow Focusing," Journal of Physics D, vol. 41, 2008, pp. 1-10.
Ortego, et al., Research article, Inkjet Printed Planar Coil Antenna Analysis for NFC Technology Applications, reed Dec. 15, 2011, accepted Jan. 9, 2012, 7 pages.
Perelaer, et al., Inkjet Printing and Alternative Sintering of Narrow Conductive Tracks on Flexible Substrates for Plastic Electronic Applications, Feb. 2010, 23 pages.
Qu, et al., The Pad Printing Technology Evaluation in Mobile Phone Antenna Manufacture, Foxconn Inti Holding Group, 2010 IEEE, 4 pages.

(56) References Cited

OTHER PUBLICATIONS

Sowpati, et al., Performance of Printable Antennas with Different Conductor Thickness, Progress in Electromagnetics Research Letters, vol. 13, 59-65, 2010, 7 pages.
Walker, et al., Reactive Silver Inks for Patterning High-Conductivity Features at Mild Temperatures, Journal of the American Chemical Society (JACS), reed Oct. 1, 2011, 3 pages.

* cited by examiner

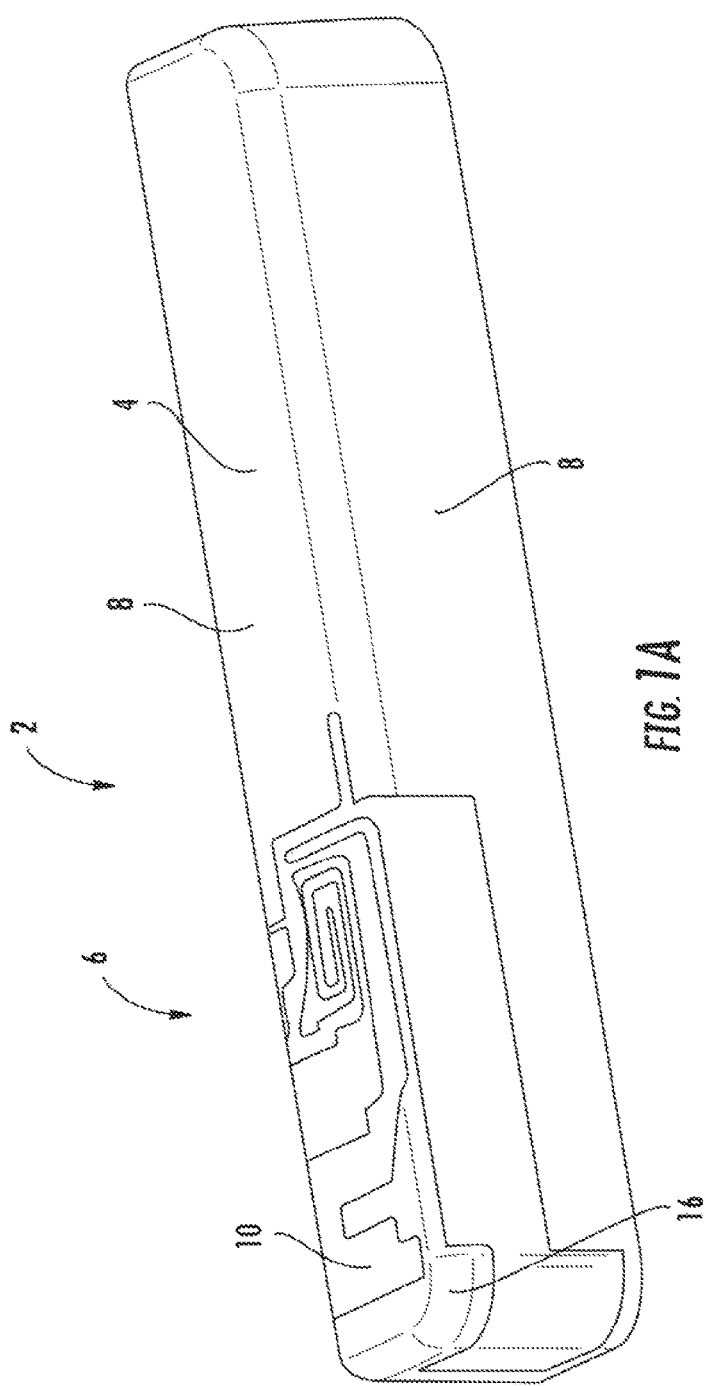

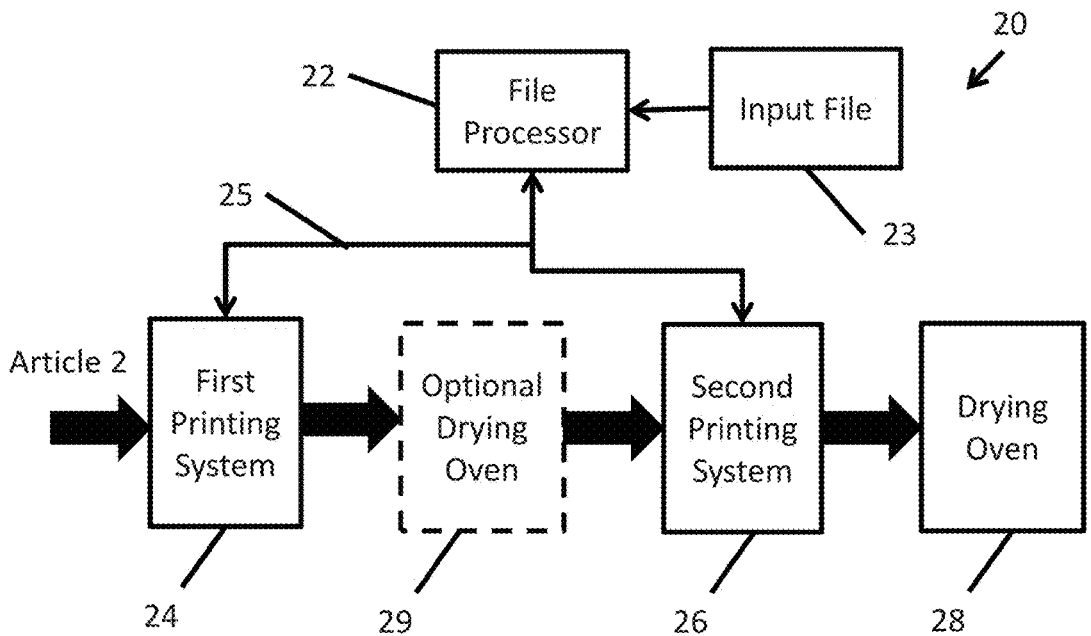
FIG. 2: FABRICATION SYSTEM WITH 2 DIFFERENT PRINTING SYSTEMS
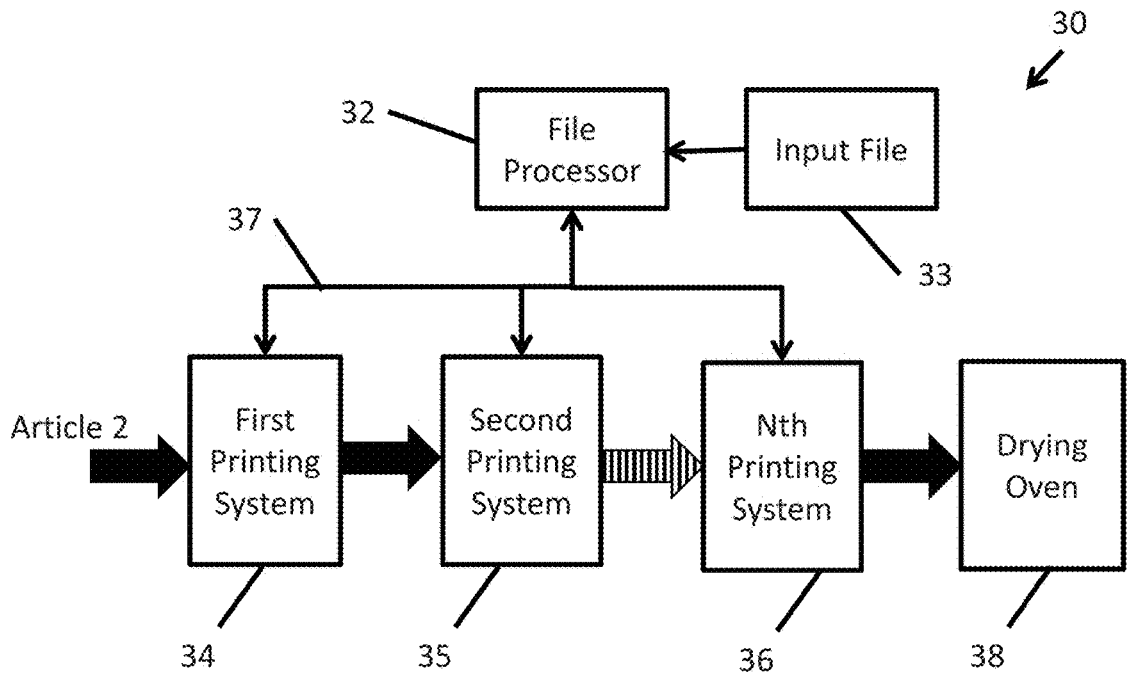
FIG. 3: FABRICATION SYSTEM WITH 3 OR MORE DIFFERENT PRINTING SYSTEMS

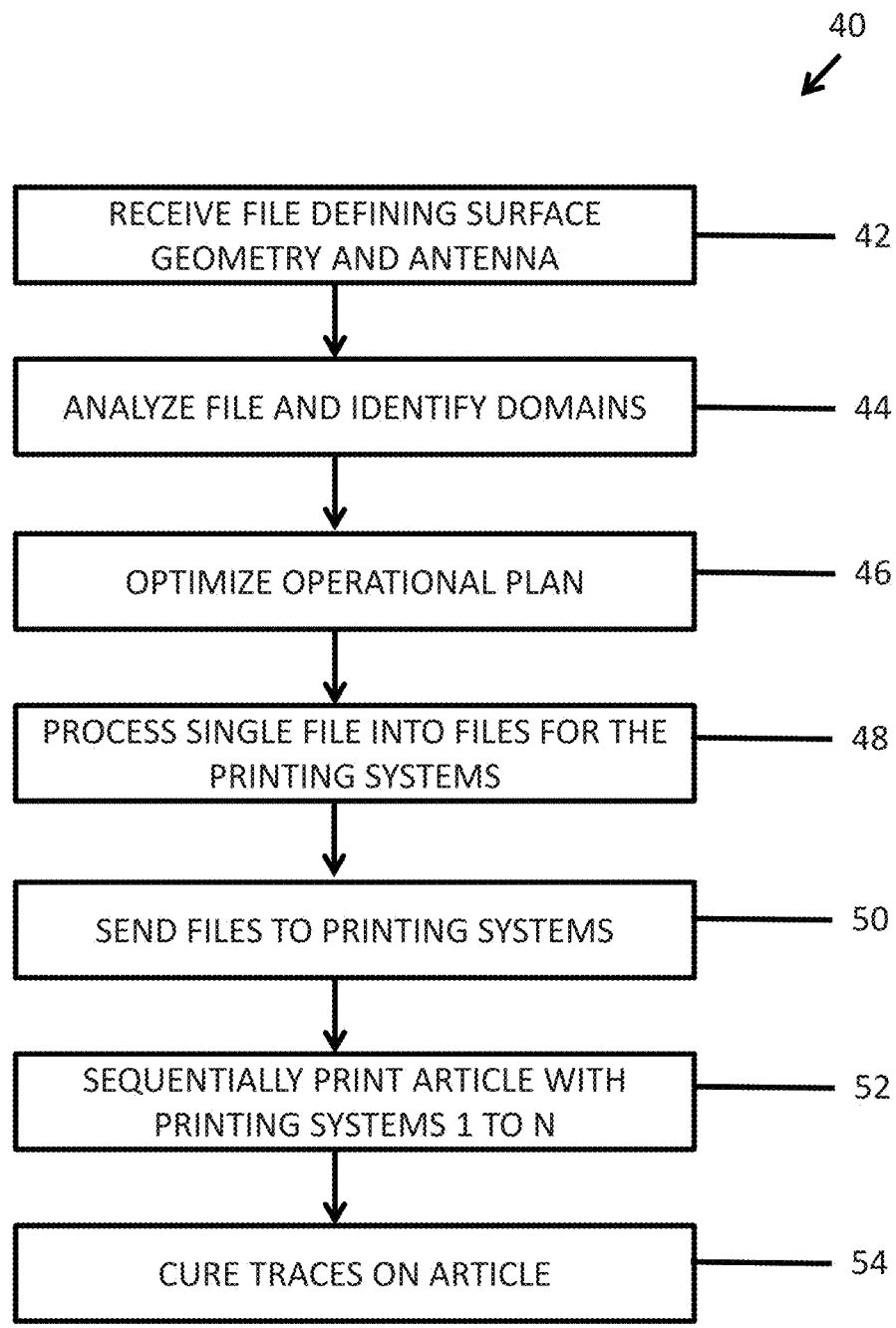
FIG. 4: FABRICATION METHOD FOR CONDUCTIVE TRACE PATTERN

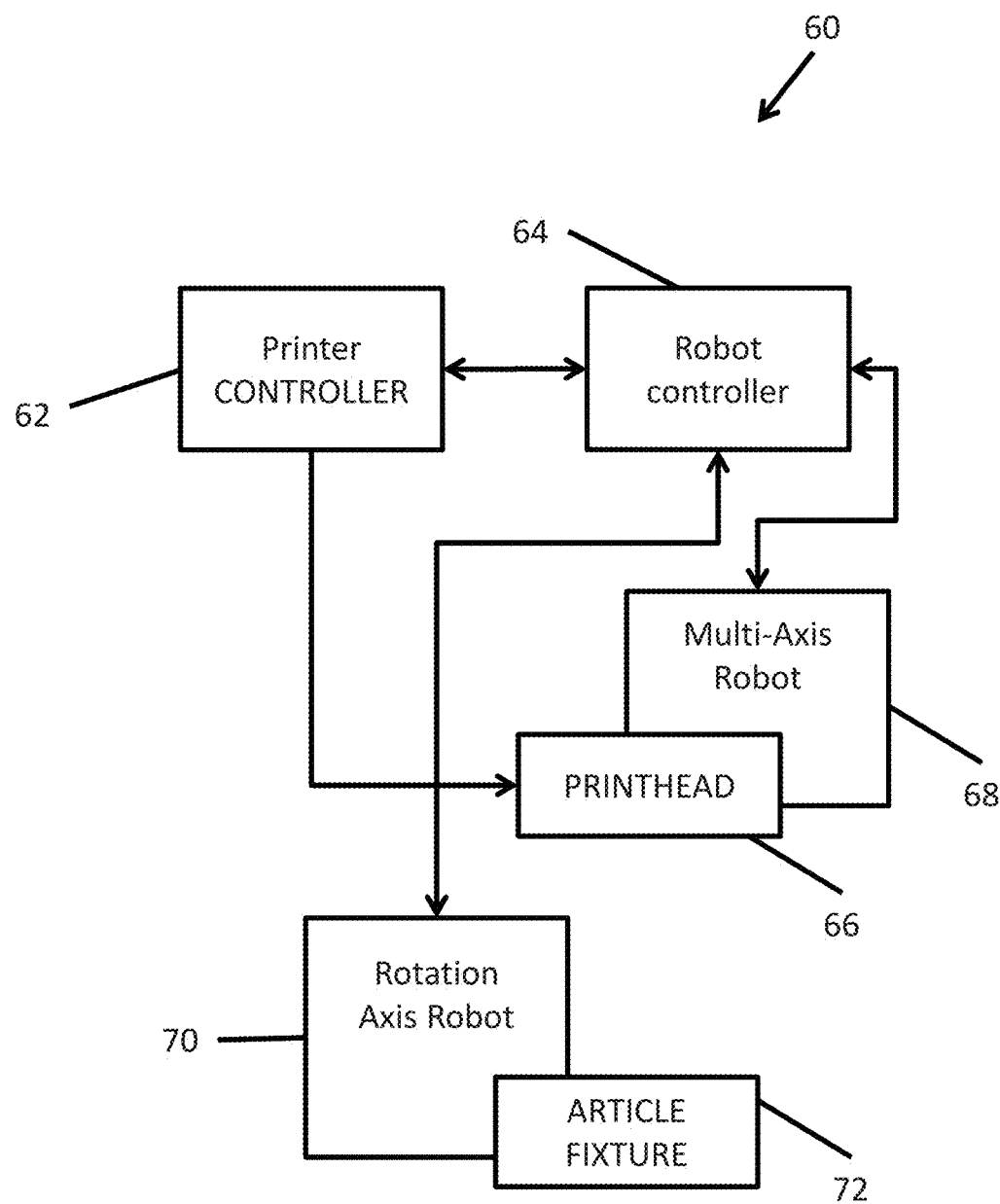
FIG. 5: BLOCK DIAGRAM OF PRINTING SYSTEM

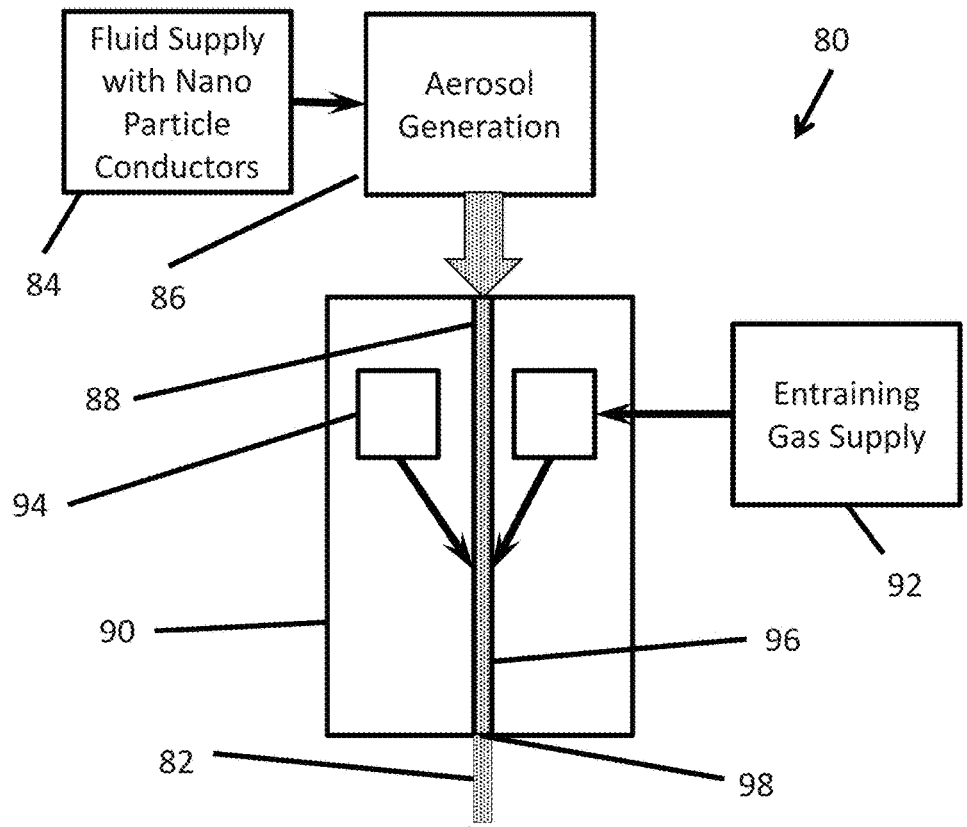
FIG. 7: CROSS SECTION OF AEROSOL PRINTHEAD
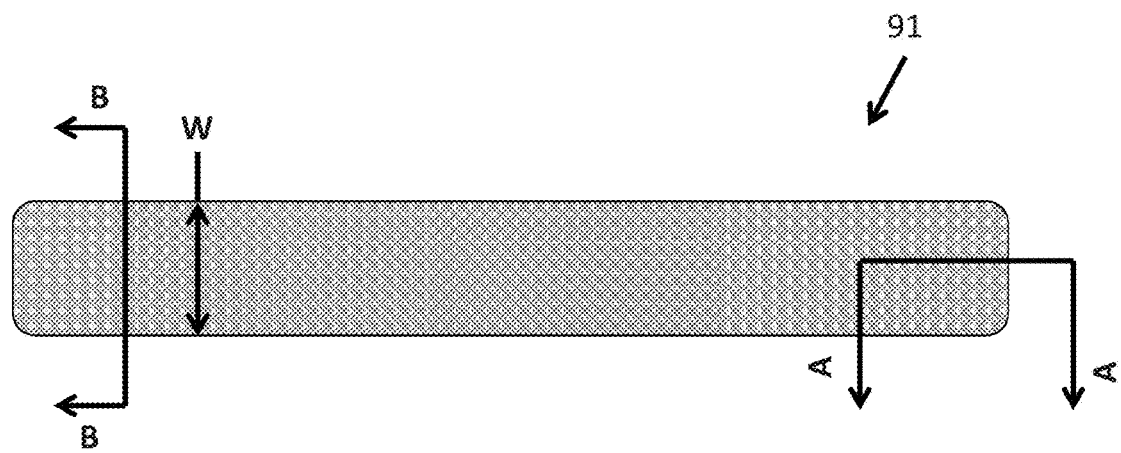
FIG. 8: FINE CONDUCTIVE TRACE FORMED BY AEROSOL PRINTHEAD FIG. 13: METHOD FOR FORMING A CONDUCTIVE TRACE PATTERN UTILIZING AEROSOL PRINTHEAD AND FLUID DISPENSE PRINTHEAD

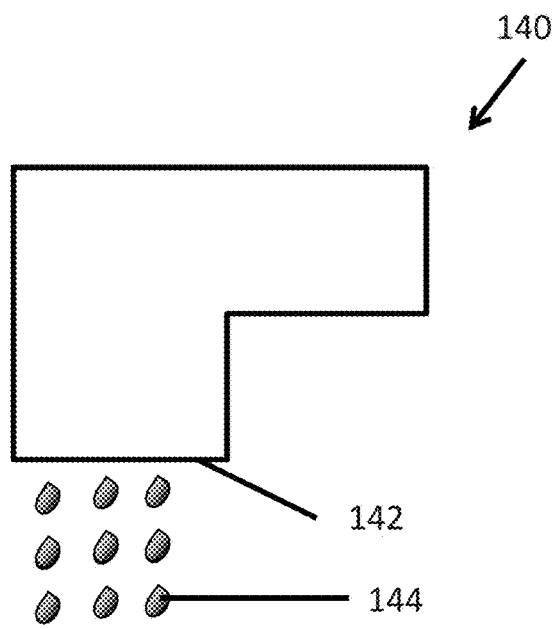
FIG. 15A: SIDE VIEW OF PIEZO ARRAY PRINTHEAD
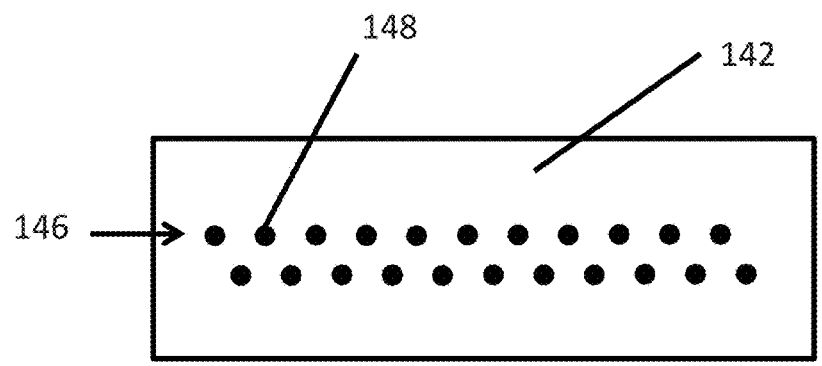
FIG. 15B: COLUMNAR ARRANGEMENT OF PIEZOELECTRIC NOZZLES

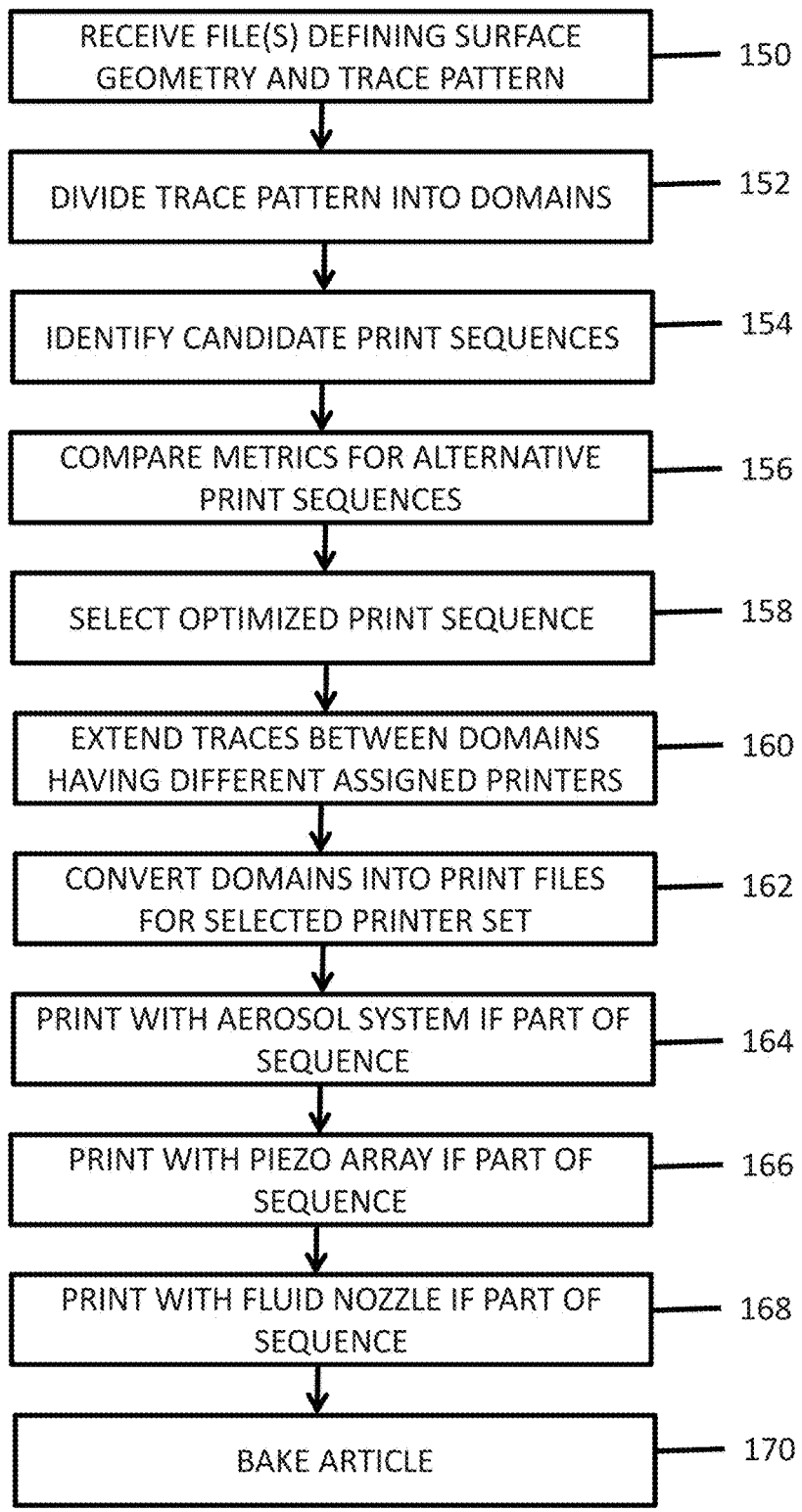
FIG. 16: METHOD FOR FORMING CONDUCTIVE TRACE PATTERN

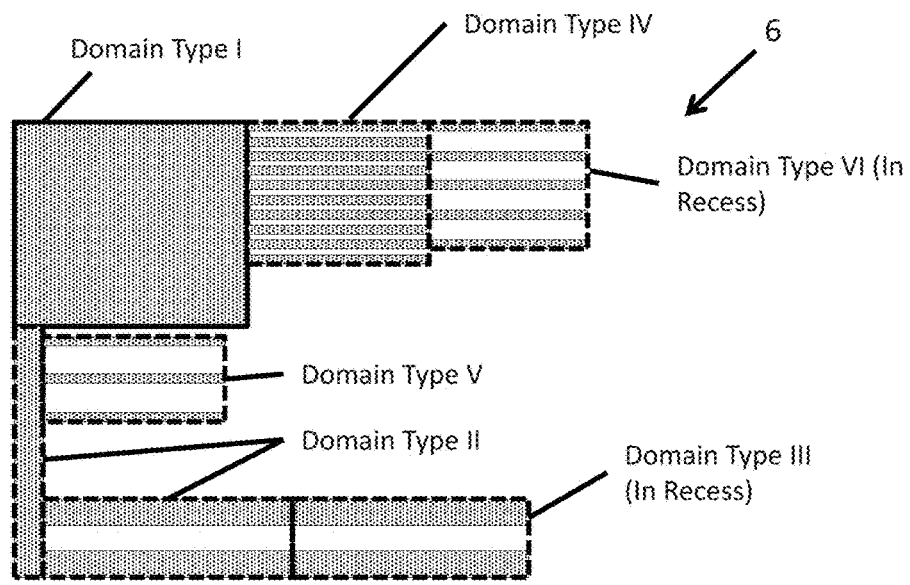
FIG. 17: METALLIC TRACE PATTERN DIVIDED INTO DOMAINS
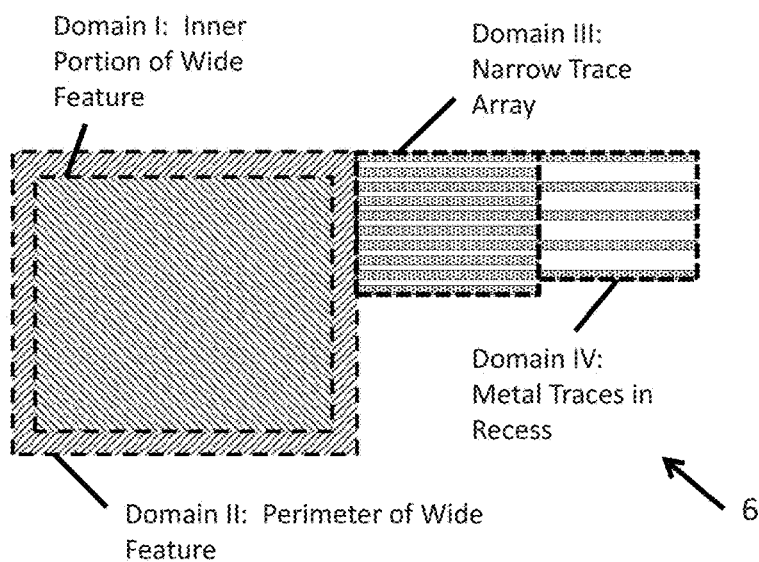
FIG. 19: METALLIC TRACE PATTERN DOMAINS WITH VERY WIDE FEATURE

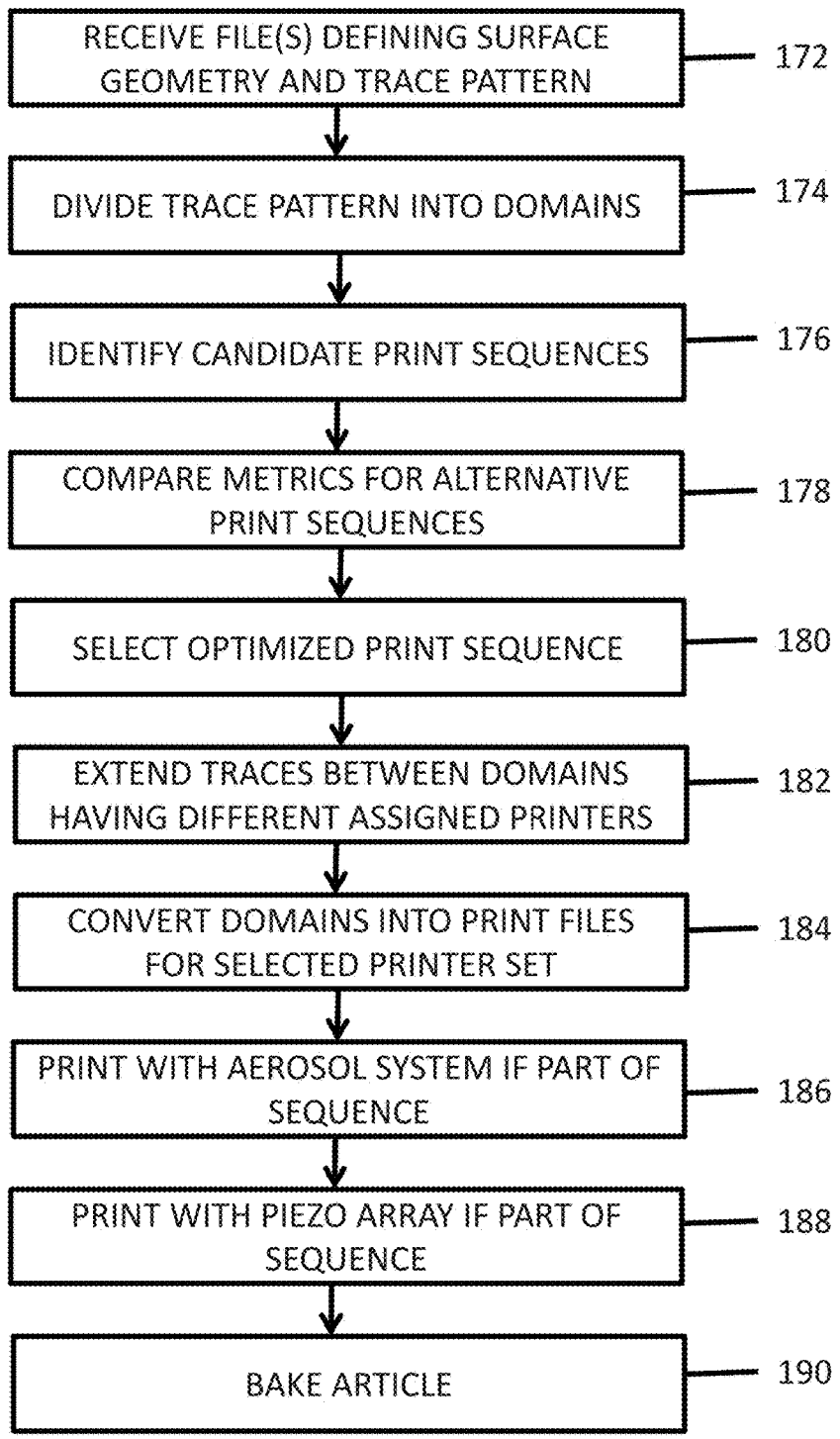
FIG. 18: METHOD FOR FORMING CONDUCTIVE TRACE PATTERN

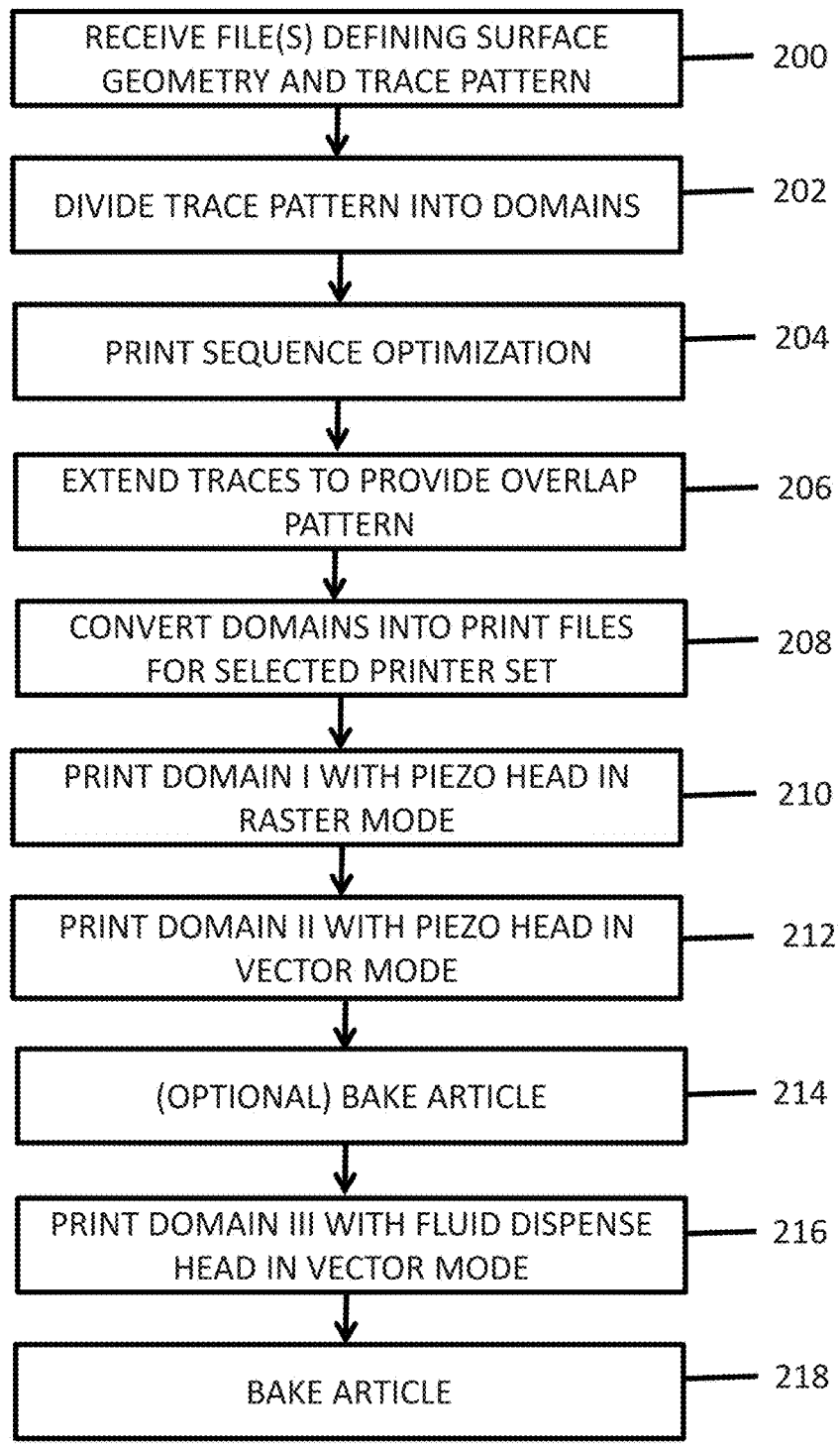
FIG. 20: METHOD FOR FORMING CONDUCTIVE TRACE PATTERN

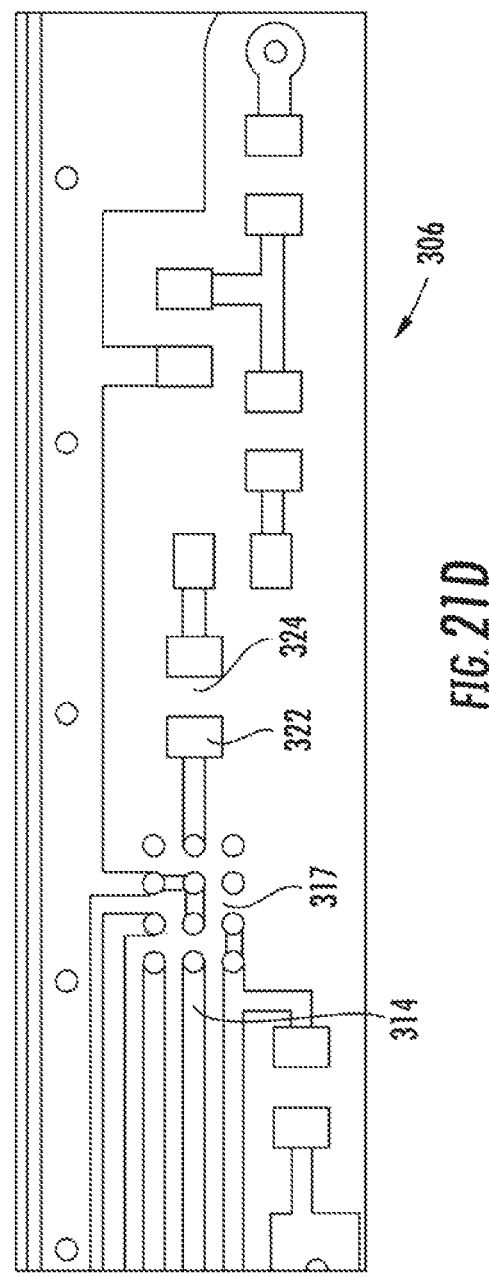

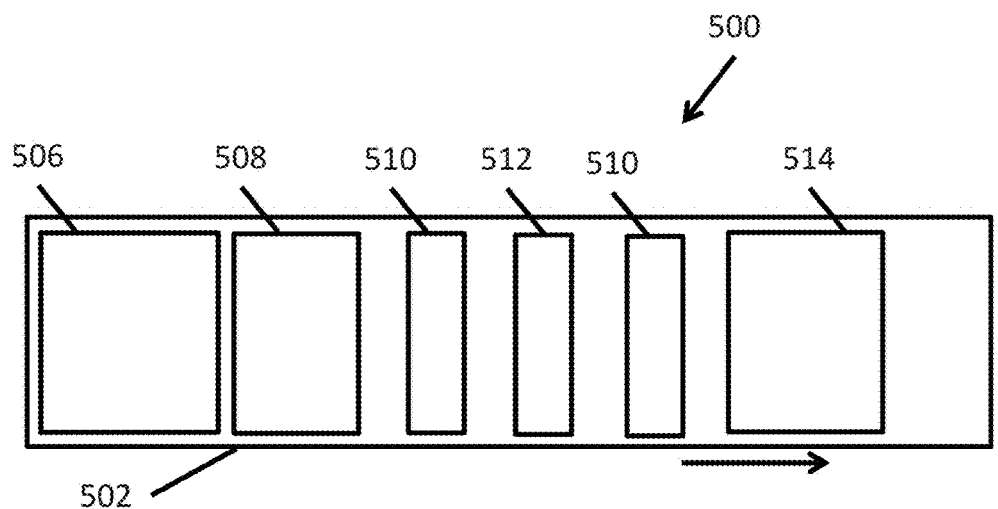
FIG. 22A: TOP VIEW OF INKJET PRINTING SYSTEM
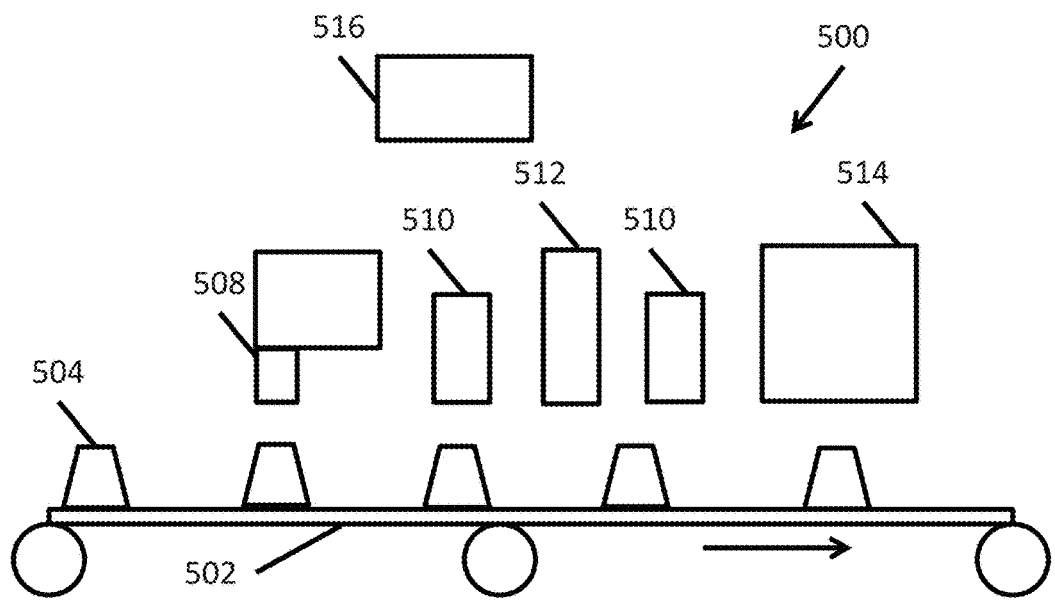
FIG. 22B: SIDE VIEW OF INKJET PRINTING SYSTEM

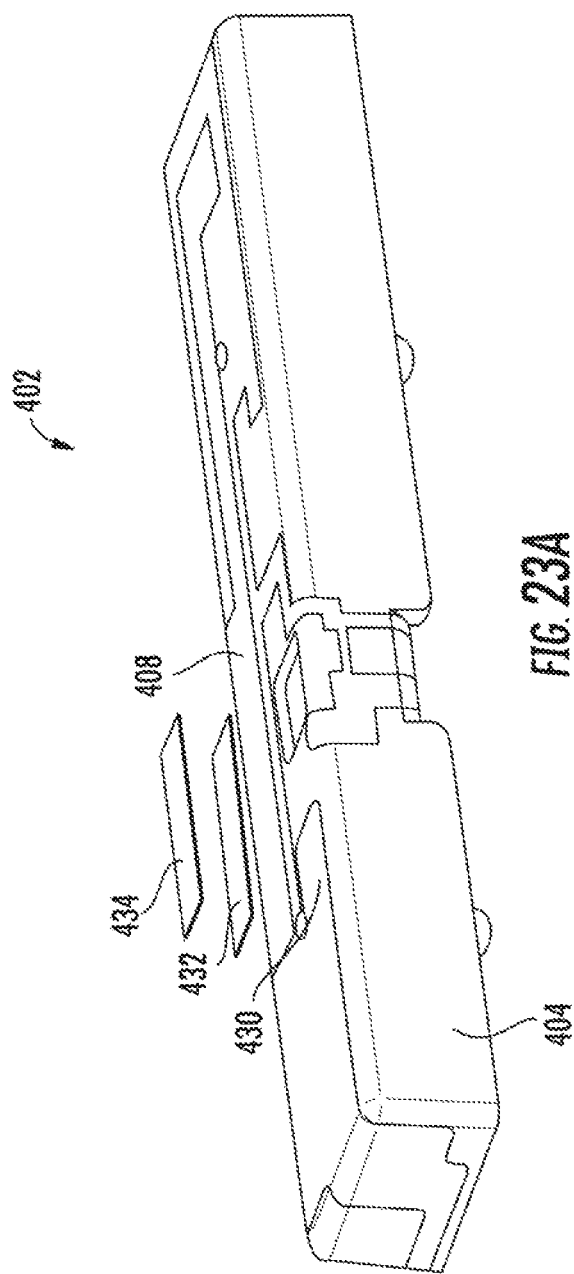

METHODS AND APPARATUS FOR CONDUCTIVE ELEMENT DEPOSITION AND FORMATION

PRIORITY AND RELATED APPLICATIONS

This application claims priority to U.S. Provisional Patent Application Ser. No. 62/018,410 filed Jun. 27, 2014 entitled "METHODS AND APPARATUS FOR CONDUCTIVE ELEMENT DEPOSITION AND FORMATION", as well as U.S. Provisional Patent Application Ser. No. 62/026,560 filed Jul. 18, 2014 entitled "METHODS AND APPARATUS FOR CONDUCTIVE ELEMENT DEPOSITION AND FORMATION", each of the foregoing incorporated herein by reference in its entirety.

This application is related to co-owned U.S. patent application Ser. No. 13/782,993 entitled "DEPOSITION ANTENNA APPARATUS AND METHODS" filed Mar. 1, 2013, which claims priority to U.S. Provisional Patent Application Ser. No. 61/606,320 of the same title filed Mar. 2, 2012, U.S. Provisional Patent Application Ser. No. 61/609,868 of the same title filed Mar. 12, 2012, and U.S. Provisional Patent Application Ser. No. 61/750,207 of the same title filed Jan. 8, 2013, each of the foregoing incorporated herein by reference in its entirety.

This application is also related to U.S. patent application Ser. No. 14/620,108 filed Feb. 11, 2015 and entitled "METHODS AND APPARATUS FOR CONDUCTIVE ELEMENT DEPOSITION AND FORMATION", which claims priority to U.S. Provisional Patent Application Ser. No. 61/939,197 entitled "METHODS AND APPARATUS FOR CONDUCTIVE ELEMENT DEPOSITION AND FORMATION" filed Feb. 12, 2014, each also incorporated herein by reference in its entirety.

COPYRIGHT

A portion of the disclosure of this patent document contains material that is subject to copyright protection. The copyright owner has no objection to the facsimile reproduction by anyone of the patent document or the patent disclosure, as it appears in the Patent and Trademark Office patent files or records, but otherwise reserves all copyright rights whatsoever.

TECHNOLOGICAL FIELD

The present disclosure relates generally to an article of manufacture and methods of producing the same, including in one exemplary variant a conductive element for use in, inter alia, mobile electronic devices such as cellular phones, smartphones, personal digital assistants (PDAs), laptops, and wireless electronic devices. In one exemplary aspect, the present disclosure relates to a conductive element (e.g., an antenna) formed using deposition of conductive fluids as well as the methods and equipment for forming the same in which the equipment utilizes more than one type of printing system.

BACKGROUND

Antennas and other conductive elements are commonly found in electronic devices, including most modern radio devices (such as mobile computers, mobile phones, tablet computers, smartphones, personal digital assistants (PDAs), or other personal communication devices (PCD)). Typically, antennas comprise a planar radiating plane and a ground plane parallel thereto, which are often connected to each other by a short-circuit conductor in order to achieve the matching of the antenna. The structure is configured so that it functions as a resonator at the desired operating frequency or frequencies. Typically, these internal antennas are located internal to the device (such as within the outer plastic housing), whether free-standing, disposed on a printed circuit board (PCB) of the radio device, or on another device component, so as to permit propagation of radio frequency waves to and from the antenna(s).

Aside from the high cost of manufacturing, such prior art antennas and approaches to antenna fabrication also generally consume appreciable space within the host device. As personal electronic devices such as smartphones and tablet computers continue to shrink, greater demands are place on the antenna utilized therein both from a performance perspective and a space consumption perspective. The latter is particularly acute, since the antenna must be able to operate effectively in the desired frequency band(s), yet consume the absolute minimum space possible. With largely planar antenna solutions such as those described above, a good deal of space may be wasted, since the antenna plane must be contained entirely within the housing, and often cannot be deformed or curved, such as to accommodate the curvature of a cellular telephone exterior housing. Such housings also have internal molded features or other components attached thereto, which cause further difficulty for one trying to adapt an antenna of a particular electromagnetic configuration to the housing while using only a minimum of interior volume.

As an attempt to address some of the foregoing issues, recent advances in manufacturing processes have enabled the construction of conductive elements such as antennas directly onto the surface of a specialized material (e.g., thermoplastic material that is doped with a metal additive). The doped metal additive is activated by means of a laser in a process known as laser direct structuring (LDS), which enables the construction of antennas onto more complex 3-dimensional geometries. In various typical smartphone and other applications, the underlying smartphone housing, and/or other components on which the antenna may be disposed inside the device, may be manufactured using this specialized material, such as for example using standard injection molding processes. A laser is then used to activate areas of the (thermoplastic) material that are to be subsequently plated. Typically an electroless copper bath followed by successive additive layers such as nickel or gold are then added to complete the construction of the antenna.

Although being very capable technology, LDS has also some disadvantages; specialized thermoplastics' material properties do not meet the properties of traditional polymer materials, but are typically more brittle or fragile. Another disadvantage is the total cost; specialized thermoplastics resins cost more than traditional ones, and lasering and plating processes are expensive. The capital cost of the LDS capacity also represents a significant barrier to entry into the technology.

One consequence of the high capital cost is a need to have dedicated LDS facilities for manufacturing articles having antennas. This may require that an antenna portion of a product be manufactured in one facility, with the product being integrated in another facility. This approach adds the cost of carrying and transporting an inventory of the antenna portions.

Accordingly, there is a salient need for an improved conductive element solution for e.g., the antenna(s) of a portable radio device, that offers comparable electrical performance to prior art approaches while being manufactured at lower cost and using more flexible, manufacturing processes. Certain implementations of such solution would also ideally provide enhanced economies of space, and complex geometric rendering capabilities, and moreover would reduce capital investment costs and reduce barriers to entry. Additionally, it is preferable to enable antenna manufacturing to be integrated with final product assembly.

Another requirement for antenna designs having large variations in metallic densities and minimum geometries over widely varying surface geometries create additional challenges. What is needed is a flexible manufacturing system and process that enables low cost and efficient manufacturing while addressing these needs.

SUMMARY

In one aspect of the disclosure, a method of manufacturing is disclosed. In one embodiment, the method is for manufacturing an article of manufacture with a conductive trace pattern thereon, and the method includes: receiving information defining the conductive trace pattern; analyzing the information to define at least first and second domains; generating a first output relating to the first domain and a second output relating to the second domain; sending the first output to a first printing apparatus; and sending the second output to a second apparatus.

In one implementation, the method of manufacturing includes: receiving a file defining at least a portion of the conductive trace pattern to be formed upon a surface of an article of manufacture; analyzing the file to define at least two domains, including a first domain and a second domain, based at least in part upon a geometry of the surface; generating first and second print files corresponding to the first and second domains respectively; and sending the first and second print files to first and second printing systems respectively for use thereby.

In another implementation, the method includes: receiving a file defining at least a portion of the conductive trace pattern to be formed upon a surface of an article of manufacture; analyzing the file to define at least two domains, including a first domain and a second domain, based at least in part upon a trace geometry including one or more of trace width and trace thickness; generating first and second print files corresponding to the first and second domains respectively; and sending the first and second print files to first and second printing systems respectively for use thereby.

In a further implementation, the method includes: receiving a file defining at least part of the conductive trace pattern to be formed upon a surface of an article of manufacture; analyzing the file to define at least two domains, including a first domain and a second domain, the at least two domains having at least one boundary therebetween; generating first and second print files corresponding to the first and second domains respectively; extending traces in the first print file to overlap connecting traces of the second print file by a distance at least exceeding a misalignment tolerance between two printing systems; and sending the first and second print files to first and second printing systems respectively for use thereby.

In another implementation, the method includes: receiving a file defining at least part of the conductive trace pattern; analyzing the file to define at least two domains including a first domain and a second domain that are different based at least in part upon a geometric threshold, the at least two domains defining the entire conductive trace pattern and having a boundary therebetween; generating a first print file based upon the first domain and a second print file based upon the second domain; extending traces in the first print file to overlap connecting traces of the second print file by a distance at least exceeding a misalignment tolerance between two printing systems; and sending the first print file to a first printing system; and sending the second print file to a second printing system for use thereby.

In another aspect of the disclosure, an article of manufacture is disclosed. In one embodiment, the article comprises one or more conductive traces disposed on a substrate or other component so as to form an electrically operative element (such as e.g., an antenna). In one variant, the one or more traces include regions deposited using different deposition technologies.

In one implementation, the article of manufacture defines a surface having a conductive trace pattern formed thereon. The conductive trace pattern includes a plurality of domains including at least a first domain and a second domain. The plurality of domains collectively define the entire conductive trace pattern. The first and second domains have been formed utilizing different first and second printing technologies respectively, and have a boundary region therebetween. Traces from the first and second domains overlap in the boundary region to assure electrical continuity between traces of the first and second domains.

In another implementation, the article of manufacture defines a surface having a conductive trace pattern formed thereon. The conductive trace pattern includes a plurality of domains including at least a first domain and a second domain. The first domain is defined at least in part by relatively fine and/or thin traces formed primarily from conductive substantially spheroid particles having an average diameter that is between 1 and 100 nanometers. The second domain is defined at least in part by relatively wider and/or thicker traces formed primarily from conductive flakes having an average major dimension ranging from 2 to 20 microns.

In a further implementation, the article of manufacture defines a surface having a conductive trace pattern formed thereon. The conductive trace pattern includes a plurality of domains including at least a first domain and a second domain. The first domain is defined at least in part by traces deposited from a piezoelectric array of nozzles that each eject drops, such as those forming a dry volume in the range of 1 to 100 picoliters. The second domain is defined at least in part by traces deposited from a fluid dispensing nozzle that deposits drops, such as those forming a dry volume in the range of 500 to 10,000 picoliters.

In another implementation, the article of manufacture defines a surface having a conductive trace pattern formed thereon. The conductive trace pattern includes a plurality of domains including at least a first domain and a second domain. The first domain is defined at least in part by traces deposited based upon an aerosol stream that entrains drops, such as those each forming a dry volume that is less than 1 picoliter in volume. The second domain is defined at least in part by traces deposited from a fluid dispensing nozzle that deposits drops, such as those each forming a dry volume in the range of 500 to 5000 picoliters.

In yet a further implementation, the article of manufacture defines a surface having a conductive trace pattern formed thereon. The conductive trace pattern includes a plurality of domains including at least a first domain and a second domain. The first domain is defined at least in part by traces deposited from a piezoelectric array of nozzles that each eject drops, such as those each forming a dry volume in the range of 1 to 100 picoliters. The second domain is defined at least in part by traces deposited based upon an aerosol stream that entrains drops each forming a dry volume that is less than 1 picoliter in volume.

In another implementation, the article of manufacture defines a surface having a conductive trace pattern formed thereon. The conductive trace pattern includes a plurality of domains including at least a first domain, a second domain, and a third domain. The first domain is defined at least in part by traces deposited from a piezoelectric array of nozzles that each eject drops, such as those each forming a dry volume in the range of 1 to 100 picoliters. The second domain is defined at least in part by traces deposited based upon an aerosol stream that entrains drops, such as those each forming a dry volume that is less than 1 picoliter in volume. The third domain is defined at least in part by traces deposited from a fluid dispensing nozzle that deposits drops, such as those each forming a dry volume in the range of 500 to 5000 picoliters.

In still another implementation, the article of manufacture defines a surface having a conductive trace pattern formed thereon. The conductive trace pattern includes a plurality of domains including at least a first domain and a second domain. The first domain is defined at least in part by traces deposited from a piezo printhead operating in raster area fill print mode utilizing at least linear scans of the piezo printhead. The second domain is defined at least in part by traces deposited from a second printhead operating in a vector mode that moves non-linearly to define traces. The second printhead may be one or more of, e.g., a piezo printhead, an aerosol printhead, and/or a fluid dispensing printhead.

In a further implementation, the article of manufacture defines a surface having an insulative pattern and conductive trace pattern formed thereon. The insulative pattern separates portions of the conductive trace pattern to provide a capacitive structure. The conductive and insulative patterns are formed according to a method including: (1) using a first printhead to print a first portion of the conductive trace pattern, (2) using a second printhead to print the insulative pattern over a first area of the first portion of the conductive trace pattern, and (3) using a third printhead to print a second portion of the conductive trace pattern which partially overlays the insulative pattern and over a second area of the first portion of the conductive trace pattern. The first and third printheads can be the same printhead, or separate printheads.

In another implementation, the article of manufacture includes antenna traces (having an ability to resonate or radiate at least partly as a function of trace thickness), sensor traces (ability to detect capacitive changes), and/or connecting traces (ability to conduct versus insulate). The properties of the trace can determine what printhead has been selected during manufacture of the article.

In another aspect, a deposition apparatus is disclosed. In one embodiment, the apparatus includes at least two print apparatus, each configured to deposit at least part of a conductive trace or component on a substrate or surface. In one implementation, the two or more print apparatus are heterogeneous in technology; i.e., use different deposition technologies.

In one implementation, the deposition apparatus includes a first printing system and a second printing system for printing on a surface of an article of manufacture. The first printing system and second printing system are in data communication with one or more file processors. The file processor(s) receive(s) one or more input files defining a conductive trace pattern. The file processor generates a first print file and a second print file based upon the input file(s).

The file processor sends the first print file to the first printing system, which then prints a first portion of the conductive trace pattern. The file processor sends the second print file to the second printing system, which then prints a second portion of the conductive trace pattern. The actions of the file processor can be fully automatic or can be based on human inputs to a user interface. Moreover, the operations of the first and second printing systems can be sequential (i.e., one after the other), overlapping but shifted in time, or completely concurrent, depending on the design and implementation of each.

In another implementation, the deposition apparatus includes a first printing system and a second printing system for printing on a surface of an article of manufacture. The first printing system is configured for printing at least fine traces, and includes a printhead generating smaller drops, such as those having a dry volume of less than 100 picoliters. The smaller drops contain spheroidal conductive particles, such as those having an average diameter of 1 to 100 nanometers. The second printing system is configured for printing antenna traces and includes a printhead generating larger drops, such as those having a dry volume of greater than 500 picoliters. The larger drops contain conductive flakes having e.g., an average major dimension of 2 to 20 microns.

In a further implementation, the deposition apparatus includes a first printing system and a second printing system for printing on a surface of an article of manufacture. The first printing system includes a piezoelectric printhead including an columnar arrangement or array of drop generators, at least a portion of which generate drops having e.g., an average drop volume in the range of 1 to 100 picoliters. The second printing system includes a fluid dispensing printhead generating drops having e.g., an average drop volume in the range of 500 to 5000 picoliters.

In yet another implementation, the deposition apparatus includes a first printing system and a second printing system for printing on a surface of an article of manufacture. The first printing system includes an aerosol-based printhead and can generate drops having an average drop volume of less than 1 picoliter. The second printing system includes a fluid dispensing printhead generating drops having an average drop volume in the range of 500 to 5000 picoliters.

In a further implementation, the deposition apparatus includes a first printing system and a second printing system for printing on a surface of an article of manufacture. The first printing system includes a piezoelectric printhead including an array of drop generators, at least a portion of which generating drops having an average drop volume in the range of e.g., 1 to 100 picoliters. The second printing system includes an aerosol-based printhead and can generate drops having an average drop volume of less than 1 picoliter.

In another implementation, the deposition apparatus includes a first printing system, a second printing system, and a third printing system for printing on a surface of an article of manufacture. The first printing system includes a piezoelectric printhead including an array of drop generators, at least some of which generating drops having an average drop volume in the range of e.g., 1 to 100 picoliters. The second printing system includes an aerosol-based printhead and can generate drops having an average drop volume of e.g., less than 1 picoliter. The third printing system includes a fluid dispensing printhead generating drops having an average drop volume in the range of e.g., 500 to 5000 picoliters.

In a further aspect, both methods and apparatus are disclosed which contemplate using a common output data structure (e.g., file) for two or more heterogeneous printing or other deposition processes, such as where for example a common data file contains data or information useful to each of the multiple different systems, or where the multiple systems are substantially contained within the same host system or apparatus.

In another aspect, a computer-readable storage apparatus is disclosed. In one embodiment, the apparatus comprises a medium having at least one computer program disposed thereon, the at least one program having a plurality of instructions which, when executed on a processing apparatus (such as a computer associated with the deposition apparatus referenced above), cause delineation of two or more domains within a prescribed conductive trace pattern (e.g., 3D trace file).

In one implementation, a computer-readable storage apparatus is disclosed. In one embodiment, the apparatus comprises a medium having at least one computer program disposed thereon, the at least one program having a plurality of instructions which, when executed on a processing apparatus (such as a computer associated with the deposition apparatus referenced above), causes at least the following process steps to occur: (1) an input data structure or structures (e.g., file or files) is/are obtained or accessed which defines a surface geometry of an article and at least part of an antenna trace pattern to be printed thereon, (2) the input file(s) is/are processed to define a plurality of print data structures (e.g., files), and (3) each of the plurality of print files are sent to one of a plurality of different printers (or print processes or functions within the same host system/apparatus), each of the different printers/processes/functions utilizing a different printing technology. In some particular embodiments, the steps can include an analysis to optimize a sequence of operation that determines factors such as which printers/processors/functions are utilized and when.

These and other aspects discussed further below will be readily appreciated by those of ordinary skill given the present disclosure.

BRIEF DESCRIPTION OF THE FIGURES

FIG. 1A is a first view of an exemplary embodiment of an article of manufacture 2 including a printed conductor pattern 6.

FIG. 2 is a block diagram depicting a fabrication system 20 according to one embodiment of the disclosure that utilizes two different printing systems 24 and 26. While certain types of printing systems are described with respect to FIG. 2 it is to be understood that FIG. 2 can apply to any two different printing systems.

FIG. 3 is a block diagram depicting a fabrication system 30 according to an embodiment of the disclosure that utilizes three or more printing systems. While certain types of printing systems are described with respect to FIG. 3 it is to be understood that FIG. 3 can apply to any three or more different printing systems.

FIG. 4 is a flow chart representation of a manufacturing or fabrication method of forming conductive trace pattern 6. The method of FIG. 4 can apply to either the block diagram of FIG. 2 or the block diagram of FIG. 3.

FIG. 5 is a block diagram of a printing system 60 that can represent the printing system utilized for any of printing systems 24 or 26 in FIG. 2 or any of printing systems 34-36 of FIG. 3.

FIG. 7 is a schematic cross-sectional representation of an aerosol printhead 80 configured to emit an aerosol stream 82.

FIG. 8 is a plan view of an exemplary portion 91 of a fine conductive trace 14 that is formed by the aerosol printhead 80 of FIG. 7.

FIG. 13 is a flow chart representation of a manufacturing method for forming a conductive trace pattern 6 utilizing an embodiment of fabrication system 20 of FIG. 2 for which the printing system utilizes an aerosol beam printhead and a fluid dispensing printhead.

FIG. 15A is a side view of an exemplary configuration of a piezo array printhead.

FIG. 15B depicts an exemplary face configuration of the piezo array printhead of FIG. 15A, having an columnar arrangement of piezoelectric nozzles.

FIG. 16 is a flow chart representation of one embodiment of a manufacturing method for forming a conductive trace pattern, utilizing an exemplary fabrication system such as that of FIG. 3.

FIG. 17 is a schematic representation of an exemplary metallic trace pattern, illustrating different types of "domains."

FIG. 18 is a flow chart representation of one embodiment of a manufacturing method for forming a conductive trace pattern utilizing the fabrication system of FIG. 2, for which the printing system utilizes an aerosol beam printhead and a piezoelectric array printhead.

FIG. 19 is a schematic representation of an exemplary metallic trace pattern illustrating a plurality of different kinds of domains, including inner and outer portions of a wide or large feature.

FIG. 20 is a flow chart representation of one embodiment of a manufacturing method for forming a conductive trace pattern utilizing the exemplary fabrication system of FIG. 2, for which the printing system utilizes a piezoelectric array printhead and a fluid dispensing printhead.

FIG. 21D is a view of a portion of an exemplary conductive trace pattern.

FIG. 22A is a top plan view of an exemplary inkjet printing system used to form conductive traces.

FIG. 22B is a side view of the exemplary inkjet printing system used to form conductive traces of FIG. 22A.

FIG. 23A is an exploded view depicting various layers formed into an exemplary implementation of an article of manufacture.

All figures © Copyright 2014-2015 Pulse Finland Oy. All rights reserved.

DETAILED DESCRIPTION

The present disclosure concerns, in one aspect, an article of manufacture, including in one variant a conductive element (such as an antenna) formed onto a substrate. The conductive element includes a plurality of connected conductive traces. The traces may extend over a planar or non-planar or three dimensional substrate. According to the present disclosure the traces are formed in one exemplary embodiment using at least two different printing systems to form the conductive traces.

Figure 1B:
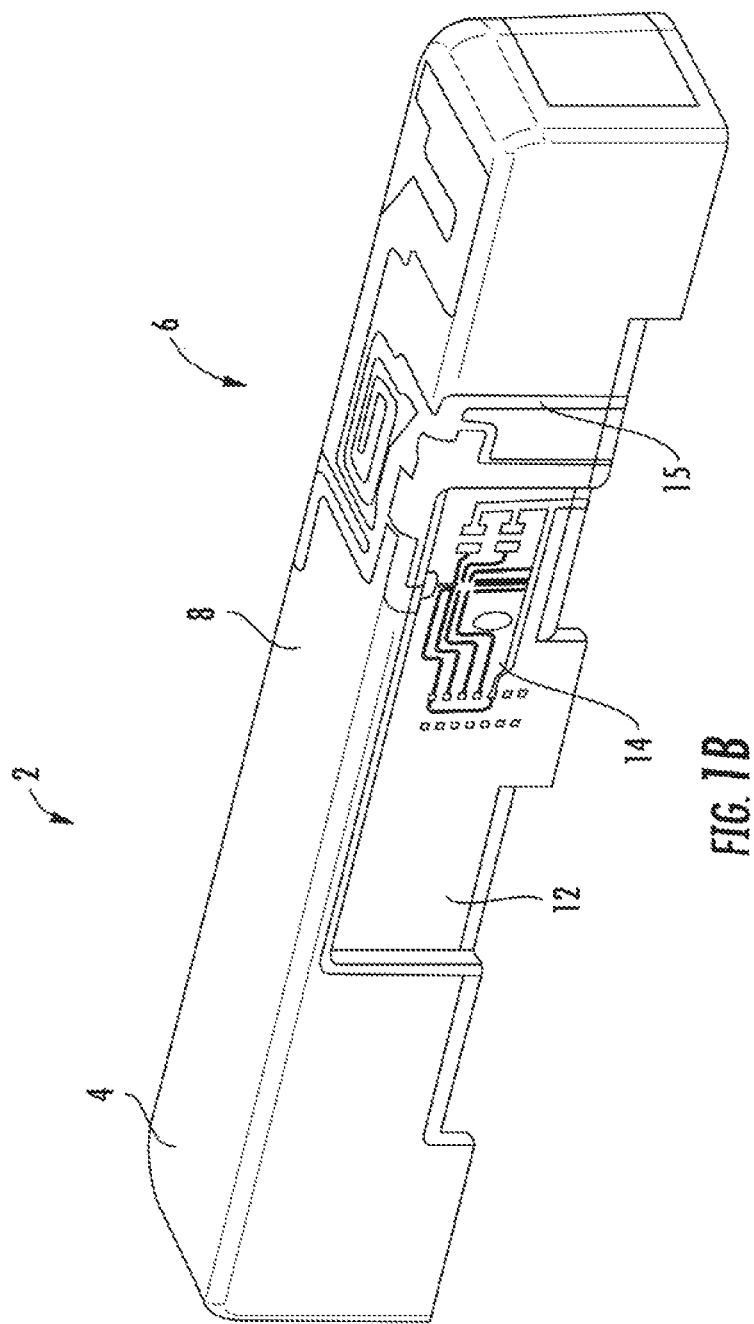
FIG. 1B is a second view of an exemplary embodiment of an article of manufacture 2 including a printed conductor pattern 6.
Figure 1C:
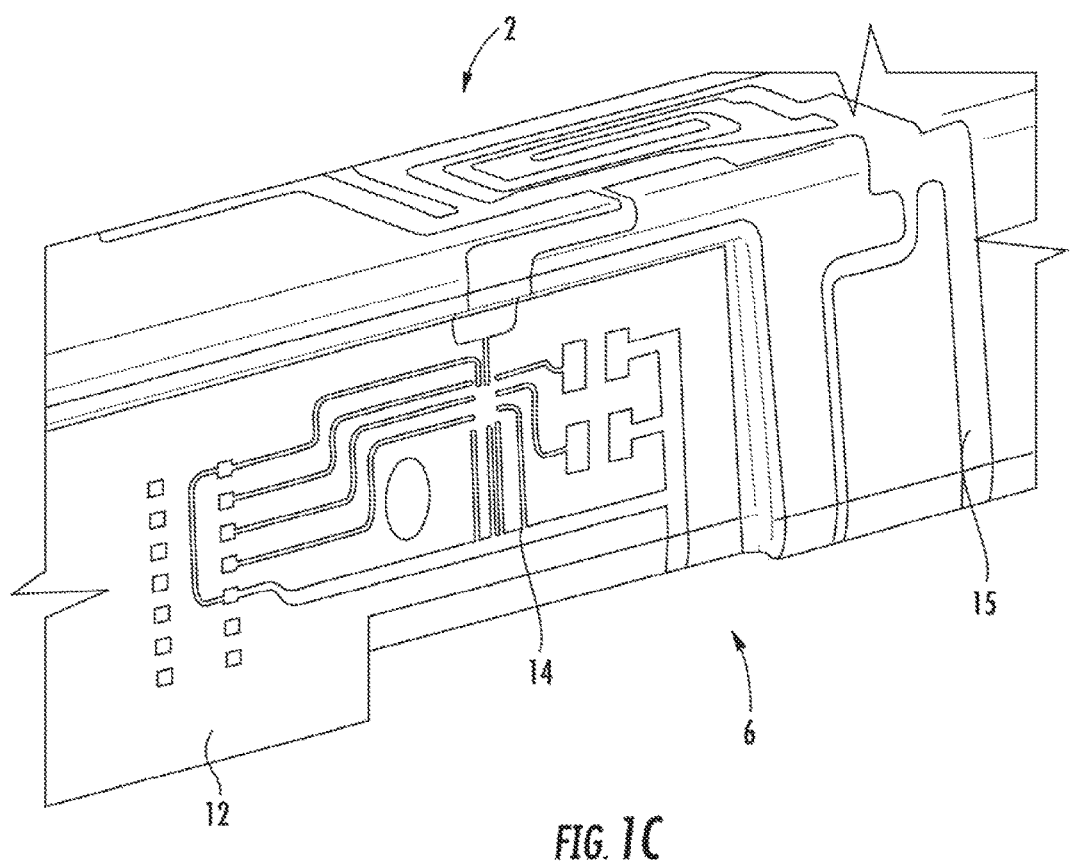
FIG. 1C is an enlarged view of a portion of an article of manufacture 2 included a printed conductive pattern 6 including relatively narrow width traces 14 and relatively wider traces 15.

FIGS. 1A-C are different isometric views depicting an example of an article of manufacture 2 according to the present disclosure. In some embodiments, the article of manufacture 2 forms a portion or all of a housing for a mobile device such as a cellular phone, a PDA (personal data assistant), a smartphone, or a tablet to name a few examples. In some embodiments, the article of manufacture includes a conductive element, such as an antenna structure, to be combined with or used as part of a mobile device.

The article of manufacture 2 begins with a base substrate 4. In a first exemplary embodiment, the substrate 4 is composed of polycarbonate (PC). In a second exemplary embodiment substrate 4 is composed of polyamide (PA). Other embodiments may use other polymers such as PVC (polyvinyl chloride) or PET (polyethylene terephthalate). In some embodiments, the polymers can be filled with glass fibers, carbon fibers, glass beads, minerals, other filler types, and/or combinations thereof to name a few examples. Other possible materials for substrate 4 include metals, glass, and composites that combine different types of materials.

Each article of manufacture 2 includes the base substrate 4 and a conductive trace pattern 6 formed thereon. Various embodiments of the conductive trace pattern 6 can be planar or, as in the variant depicted in FIGS. 1A-C, non-planar. A non-planar conductive trace pattern may span various surfaces 8 that can be individually and/or mutually non-planar such as mutually orthogonal surfaces 8. In various embodiments, the conductive trace pattern 6 can span two, three, four, or more mutually non-planar surfaces 8. In other embodiments, conductive trace pattern 6 can be formed on curved (non-planar) surfaces 8. Various other combinations of the foregoing, and/or other configurations, will be recognized by those of ordinary skill in the art given the present disclosure.

Portions of the conductive trace pattern 6 may define a functional structure, such as e.g., an antenna 10. In one embodiment, portions of conductive trace pattern 6 that define the antenna 10 have a thickness that exceeds a multiple of a "skin depth" $\delta$ at a given operating frequency. Skin depth $\delta$ can be related to a formula describing how alternating current density varies with depth in a conductor which may be under the influence of an external alternating current field. A formula for current density is $J=J_s e^{-d/\delta}$, where J equals a current density at a given depth d into the trace, and $J_s$ equals the current density at the surface of the trace. The value d equals a distance d measured from the outer surface of a conductive body along a direction that is perpendicular to the outer surface. A typical operating frequency is 1 GHz (gigahertz), although it will be appreciated that this value is merely exemplary (and in no way limiting of any operation parameter of the trace), and other values may be readily substituted. In some cases in which a material is a composite between conductors and insulators, we may refer to the skin depth as an "effective skin" depth that is based on material performance. The skin depth $\delta$ at a given frequency can be defined as the depth into the conductive body at which the current density J has fallen by about 63%, or to 1/e of the value at the surface. See, e.g., John R. Reitz, Frederick J. Milford, and Robert W. Christy, "FOUNDATIONS OF ELECTROMAGNETIC THEORY," Third Edition, published in 1980 by Addison-Wesley Publishing Company, incorporated herein by reference in its entirety (see e.g., p. 369). The general formula for skin depth of a given material is $\delta=[2/\omega\mu\sigma]^{1/2}$ wherein $\omega$ equals the angular frequency of the alternating current which may be imparted by incoming radiation, $\mu$ equals the magnetic permeability of the material, and $\sigma$ equals the conductivity of the material. In the estimates that follow, the contribution of $\mu$ is ignored because it tends to be a constant for typical materials used, such as silver. For purposes of discussion the value of $\omega$ can be equal to $2\pi$ times the frequency of 1 GHz.

Each trace of the exemplary embodiment of the antenna 6 is formed from a conductive substance (e.g., fluid) that contains particles of a metal. Preferably, the metal has a high conductivity. Silver is one example of such a metal useful with this disclosure, although it will be appreciated that other metals may be used as well. Solid silver metal has a skin depth that is about 2 $\mu$m measured at 1 GHz. Traces formed from the conductive fluid will generally tend to have lower conductivity than that of bulk silver, at least partly because the particles tend to have low surface area contact with each other and are not perfectly compacted together.

For purposes of the present discussion, it is noted that a relationship can be defined between the skin depth of a printed trace formed from particles of a given metal versus the bulk metal itself. The formula is shown below in Eqn. (1):

$$\delta_{trace}=\delta_{bulk}*\sigma^{1/2}_{bulk}/\sigma^{1/2}_{trace} \qquad \text{Eqn. (1)}$$

In the above relationship, $\delta_{trace}$ is the skin depth of the trace, $\delta_{bulk}$ is the skin depth of the bulk metal, $\sigma^{1/2}_{bulk}$ is the square root of the bulk conductivity, and $\sigma^{1/2}_{trace}$ is the square root of the trace conductivity. This relationship states that the skin depth $\delta$ is inversely proportional to the square root of the conductivity.

Consider an example of silver particles used to make traces. Suppose that the conductivity of the bulk silver is 25 times that of the (particle-based) trace. The skin depth ratio in this example will be about $25^{1/2}$ or about 5-to1. Since bulk silver has a skin depth of about 2 microns, the skin depth of the trace will therefore be on the order of 10 microns (five times that of the bulk material).

Note that the above comparison does not necessarily hold true for comparing traces versus bulk metal for different metals. For example, the formula is generally not accurate for comparison of bulk silver to traces formed from iron particles. This is because the two different metals have different magnetic permeability ($\mu$) values which would then become a factor in comparing skin depths. The above ratios assume the same magnetic permeability, and that the magnetic permeability is not a dominating factor in comparing bulk metal properties to trace properties for a given metal.

According to FIG. 1B, surface 8 includes a recessed portion 12. Within recessed portion 12 are a number of very fine traces 14. A more detailed view of a portion of article 2 is depicted in FIG. 2C illustrating recessed portion 12 of surface 8 and fine traces 14. Fine traces 14 can be 200 μm (microns) or less in width to accommodate very fine geometry requirements such as for fine pitch chip packaging. Other fine traces 14 can have a width of less than or equal to 150 μm, less than or equal to 100 μm, less than or equal to 75 μm, or even less than or equal to 50 μm.

Referring back to FIG. 1A there may be portions of surface 8 such as portion 16 that has a compound curvature—portion 16 curves along two axes. Although not depicted in FIGS. 1A-C, the printing system of the present disclosure is capable of printing upon compound surfaces such as the depicted portion 16, as well as yet other applications.

The conductive trace pattern 6 can also include wider traces 15 if desired. Wider traces 15, in one exemplary implementation, may have a width of at least 250 μm or at least 300 μm. The wider traces 15 can have a width of about 1000 μm in some cases. Generally speaking, in the present context, the term "wider traces" refers without limitation to the larger geometry features of conductive trace pattern 6 that have at least two orthogonal dimensions that exceed 250 μm.

An additive fabrication system according to the present disclosure is capable of efficiently forming conductive trace patterns 6 such as depicted in FIGS. 1A-C. Such a pattern includes challenging geometries and large variations in conductive trace width.

FIG. 2 depicts an embodiment of an additive fabrication system 20 according to the present disclosure. Fabrication system 20 is referred to as "additive" because conductive patterns 6 are formed by "additive processes" such as the dispensing, printing, directing and/or spraying of conductive fluids onto a surface 8 of a substrate 4. This is as opposed to "subtractive processes" that form the pattern through removal of a blanket pattern such as via an etching process. Etching can refer to a process of removing material via an application of light energy (e.g., a laser) and/or via a chemical removal process. Additionally etching can be one or more of dry etching, wet etching, photo chemical milling, metal etching, chemical machining, or photo fabrication whether one sided or two sided etching.

Fabrication system 20 includes a file processor 22, first printing system 24, second printing system 26, and a drying and/or curing oven 28. Optionally system 20 may include another drying oven 29 between the first 24 and second 26 printing systems. File processor 22 is generally a computer configured to receive a file 23 that defines a conductive trace pattern 6 on a substrate 4 such as the conductive trace pattern 6 depicted in FIGS. 1A-C. File processor 22 is also configured to process the input file 23 in order to output print files 25 for each of printers 24 and 26. The output files each define a portion of conductive trace pattern 6 that each of the printers will form on substrate 4.

In an exemplary embodiment the first printing system 24 is configured to print very fine traces 14 such as those depicted in FIG. 1C. In an exemplary embodiment the first printing system 24 can include a printhead that emits an entrained beam of a very fine aerosol particles that can form extremely fine traces that can be equal to or less than 100 μm in width. In this exemplary embodiment the second printing system 26 is configured to print relatively wider traces 15 such as the wider traces 15 depicted in FIGS. 1A-C. In this exemplary embodiment the second printing system 26 includes a printhead that emits relatively large droplets of a viscous conductive ink. The second printing system 26 can form large traces much more rapidly than the first printing system but is limited to relatively large traces that have a width of 250 μm or greater.

In another exemplary embodiment, the first printing system 24 includes a piezoelectric printhead such as piezo array printhead 140 discussed with respect to FIGS. 15A and 15B. In this exemplary embodiment, the piezo array printhead 140 prints traces and/or area fill patterns over a relatively flat surface of the substrate surface 4. The second printing system 26 includes a fluid dispensing printhead such as the fluid dispense fluid dispense printhead 100 described with respect to FIG. 9. The print system 26 prints traces that are at least 200 μm wide and all traces that are formed on portions of the surface 4 that cannot be printed by the piezo array printhead 140. As will be discussed later, the piezo array printhead 140 may print fine and thin traces for mounting components and providing electrical coupling. The other fluid dispense printhead 100 may print thicker traces intended to function as e.g., an antenna 10.

Drying oven 29 may be deployed if desired/needed between first and second printing systems 24 and 26, such as to partially dry or cure conductive traces 6 before article 2 is printed upon by second printing system 26. This may not be necessary with the above-described exemplary embodiment, but may be preferable for other systems. In some cases the first printing operation is performed on a large batch of articles 2 that are stored between use of the first printing system 24 and second printing system 26. In such cases it may be desirable to cure or dry partially formed conductive traces 6 before temporary storage.

FIG. 3 depicts another embodiment of an additive fabrication system 30 configured to print conductive traces 6 on a substrate 4. Fabrication system 30 includes file processor 32, first printing system 34, second printing system 35, third (or $N^{th}$ if there are more than three) printing system 36, and drying and/or curing oven 38. While FIG. 30 depicts three different printing systems 34-36, it is to be understood that fabrication system 30 can include any number of different printing systems. Some examples of possible printing systems will be described. Also, it is to be understood that a drying oven 29 can be utilized between printing systems 34-36.

File processor 32 is configured to receive information or data, such as e.g., a file 33 that defines a conductive trace pattern 6 to be formed on substrate 4. File processor 32 is configured to process the input file 33 and output information (e.g., a print file 37) for each of printing systems 34-36 to be used in a given process.

In an exemplary embodiment of fabrication system 30 the first printing system 34 is a vector based printing system configured to print very fine traces 14. Such a printing system can include for instance a single-nozzle printhead 14 emitting a fine beam of aerosol. The first printing system is referred to as a vector-based system because the fine aerosol beam traces along the surface 8 to define the fine traces 14.

The second printing system 35 can be for example a raster-based printing system configured to print both fine traces 14 and wide traces 15. A typical raster-based printing system has a printhead with an array or columnar arrangement of nozzles that can define an area pattern of conductive traces 14 and/or 15. The exemplary columnar arrangement of nozzles can be, in one implementation, an inch or more in length and have 1000 or more nozzles. Such a columnar arrangement of nozzles can print a conductive pattern 6 very rapidly but has difficulty in printing into concave surfaces or recesses 12 or along compound surfaces 16. The second printing system in this exemplary configuration is referred to as a raster or pixel based system because it generates an area array of printed spots or pixels as opposed to being a vector device that defines a single trace at a time.

The third printing system 36 can be for example a vector-based for printing wide traces 15. Such a printing system can include a single-nozzle printhead that ejects relatively large droplets of conductive ink.

The above-described printing systems are examples for printing systems 34-36. The ordering of such printing systems 34-36 may change relative to the above example. Also, other printing systems may be utilized. For example, a vector-based printing system utilizing a single spray nozzle can be used to print the larger geometry traces and/or areas of metallization.

The exemplary embodiments of the fabrication systems 20 and 30 depicted above can be utilized to print a wide variety of different conductive trace patterns 6 on a wide range of substrate 4 surface geometries. To accommodate such varying designs, a number of different printing systems may be optimal in terms of their application. The following Table 1 illustrates a comparison of some exemplary printing systems.

TABLE 1

| PRINTING SYSTEM, PRINT MODE | TRACE WIDTH RANGE | SURFACE GEOMETRY | DROP VOLUME | CONDUCTIVE PARTICLES |
|---|---|---|---|---|
| AEROSOL, VECTOR | 10-100 μm | RECESSED AND CURVED | LESS THAN 1 PICOLITER | 1 TO 100 nm SPHERES |
| PIEZO ARRAY, RASTER | 250+ μm | PLANAR WITHIN 0.5 mm | 3 TO 100 PICOLITERS | 1 TO 100 nm SPHERES |
| PIEZO ARRAY, VECTOR | 10-100 μm | PLANAR WITHIN 0.5 mm | HIGH OR LOW | 1 TO 100 nm SPHERES |
| FLUID DISPENSE, VECTOR | 250+ μm | RECESSED AND CURVED | 500-5000 PICOLITERS (DRY VOLUME) | 2 TO 20 μm MICRON FLAKES |

The second row of Table 1 (just below the header row) summarizes an aerosol-based printing system operating in vector mode. An exemplary embodiment of an aerosol-based printing system is described with respect to FIGS. 7, 8, 8A, and 8B. Operating in vector mode generally relates to movement along the pathway of a trace to form the trace. Often such a printhead moves along a curved or non-linear path. This system is optimized to print very fine traces along a recessed and/or highly curved surface. Such fine traces can have a small line width W; e.g., of about 10 to 100 microns, and may be printed in highly constrained locations. Drop sizes ejected are entrained in a gaseous jet and are typically less than one picoliter in size. In the exemplary embodiment, the emitted drops contain spheroidal-shaped conductive particles that typically have an average diameter between 1 and 100 nanometers.

The third row of Table 1 summarizes an exemplary piezo-based printing system operating in raster mode. An exemplary embodiment of a piezo-based printing system is described with respect to FIGS. 15A and 15B. Operating in a raster mode generally relates in this context to linearly scanning or passing a columnar arrangement of drop ejecting nozzles across a print area 8 of article 2 to provide a dot-matrix pattern. During the linear scan, the columnar arrangement of nozzles addresses an area that is at least 2 millimeters wide, at least 3 millimeters wide, or at least 4 millimeters wide. Often the nozzle array includes nozzles arranged along a line that is 5 millimeters or more in length. Such a printing system requires a print surface that is planar to within about 0.5 millimeters across the swath so that the distance between nozzles and surface 8 can be kept below about 1.5 millimeters. In some cases, such a printhead can trace along a single axis convex curve however. Drop sizes tend to be in the range of 1 to 100 picoliters. As with the aerosol-based system, the emitted drops in the exemplary implementation contain spheroidal-shaped particles that typically have an average diameter between 1 and 100 nanometers. The operation in a raster print mode is, inter alia, very efficient for rapidly generating large area trace patterns with line width of 800 microns or greater. However, the raster mode does produce "stair step" artifacts due to the rectangular scans that are generally not parallel to the traces being generated. Thus, there may be rectangular "steps" along some traces that are roughly equal in size to the resolution of the printhead and have the effect of setting a lower bound a trace size that can be printed. For this reason, the raster mode may not always be best for forming fine traces.

The fourth row of Table 1 above is the same as the third row except for the piezo head being operated in a vector mode. In this mode, the piezo printhead is optimized for generating very fine traces but not for area fills and large traces. Operating in this vector mode, an exemplary piezo printhead may be able to print widths in a range of 10 to 100 microns, and perhaps even finer than the aerosol head. Between raster and vector modes, a piezo printhead may be able to define any necessary trace width, provided the surface to be printed upon is sufficiently planar.

The fifth row of Table 1 summarizes an exemplary fluid dispense head-based printing system operating in vector mode. One implementation of a fluid dispense head-based printing system is described with respect to FIGS. 9, 10, 10A, 10B, 11A, 11B, and 12. This printing system is particularly optimized for, inter alia, printing antenna traces that are typically at least 250 microns wide and at least about 30 microns in thickness. Such a printhead can print along highly curved and recessed surfaces. Drop sizes in the exemplary system tend to be in the range of 500 to 5000 picoliters (measured as dry volume). The emitted drops tend to contain conductive flakes having an average major dimension that is in a range of 2 to 20 microns.

A method of fabrication 40 that may apply to fabrication system 20 or 30 is depicted in FIG. 4. Elements of FIG. 2 will be utilized in describing method 40 but it is to be understood that method 40 can equally well apply to the fabrication system 30 of FIG. 3. The method 40 is a manufacturing method for fabricating the article of manufacture 2 whereby conductive trace pattern 6 is formed upon substrate 4. Many or all of the steps of method 40 may be performed by the action of one or more computers or other computerized apparatus that receive and execute instructions stored on a non-volatile media. Alternatively some of the steps of method 40 may be performed by a machine or even have some human interaction.

According to step 42 an input file 23 defining a conductive trace pattern 6 is received by file processor 22. The file 23 may be transferred to file processor 22 automatically, such as from a network connection or it may be manually inputted via a human operator using a computer user interface, or yet other approach.

According to step 44 the file is analyzed and domains or regions are defined. In one variant the domains are defined based upon one or more geometric factors such as the width of traces 14 or 15 and/or upon planarity or non-planarity of surface(s) 8. Collectively the domains define the entire conductive trace pattern 6. These domains or regions can relate to the capabilities of each of the printing systems 24 and 26. Yet other schemes for defining domains (which may or may not relate to area, position, geometry, relevant processes, etc.) may be used consistent with the present disclosure.

In one embodiment, at least two domains are defined according to the method of step 44 including a first domain and a second domain. The two domains are different based at least upon a geometric attribute or threshold. The at least two domains define the entire conductive trace pattern 6 and have a boundary therebetween.

According to step 46 an operational plan or sequence is optimized. One operational plan might be to just use one of printing systems 24 or 26. Another operational plan might be to use both printing systems 24 and 26 according to which system is more suitable for printing particular traces. According to step 46 the different operational plans are analyzed and then the one selected that best meets a certain criterion or multiple criteria, such as e.g., manufacturing cycle time (which varies roughly inversely with the number of articles 2 that can be manufactured per unit time). Also according to step 46 an optimal operational plan or sequence is selected.

According to step 48, the input file 23 is processed into at least two print files including a first print file based on the first domain and a second print file based on the second domain. According to step 50 the first print file is transferred to the first printing system 24 and the second print file is transferred to the second printing system 26.

According to step 52 the article of manufacture 2 is printed (e.g., sequentially) with printing systems 24 and 26. Within an exemplary embodiment of step 52 the following occurs: (1) An unprinted article of manufacture 2 is transported to printing system 24 (see block arrow at left). (2) First printing system 24 forms fine traces 14 upon surface 8. (3) Article of manufacture is then transported to printing system 26. (4) Second printing system 26 forms wide traces 15 upon surface 8.

According to step 54 the article of manufacture 2 is transported to drying (and/or curing) oven 28. Oven 28 then bakes article of manufacture 2, curing or driving away organic components of conductive trace pattern 6.

FIG. 5 is a block diagram depicting an exemplary embodiment of a printing system 60 which may be for example any one of printing systems 24, 26, or 34-36. Printing system 60 includes a printer controller 62 that is coupled to robot controller 64 and printhead 66. Robot controller 64 is coupled to multi-axis robot 68 and rotation-axis robot 70. The article of manufacture 2 is supported and secured by article fixture 72.

The printer controller 62 sends commands to robot controller 64 which in turn controls robots 68 and 70 to provide positioning and movement of article of manufacture 2 relative to printhead 66. Printer controller 62 sends commands to printhead 66 to eject aerosol, spray, and/or droplets of conductive ink onto article 2 while the printhead 66 is in proper proximity and orientation relative to surface 8 of article 2.

Figure 6A:
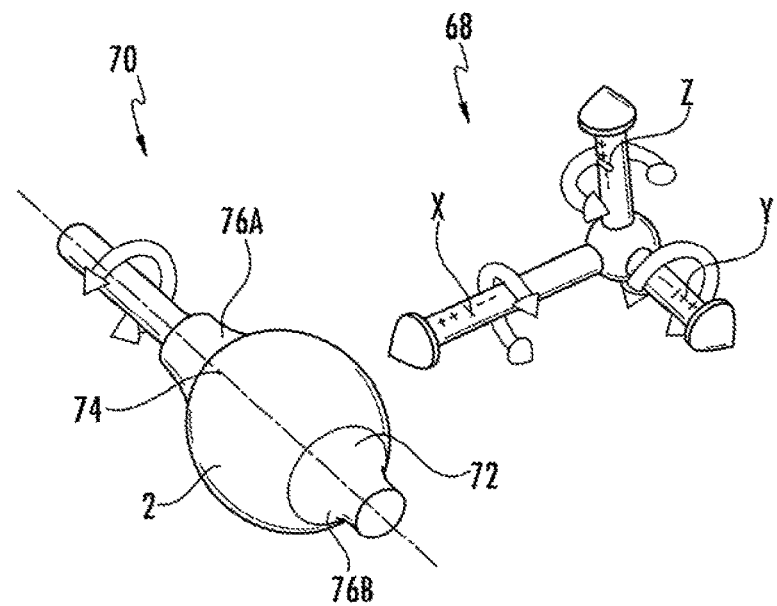
FIG. 6A is a schematic representation of a first embodiment of a motion control system used for positioning a printhead with respect to an article of manufacture.
Figure 6B:
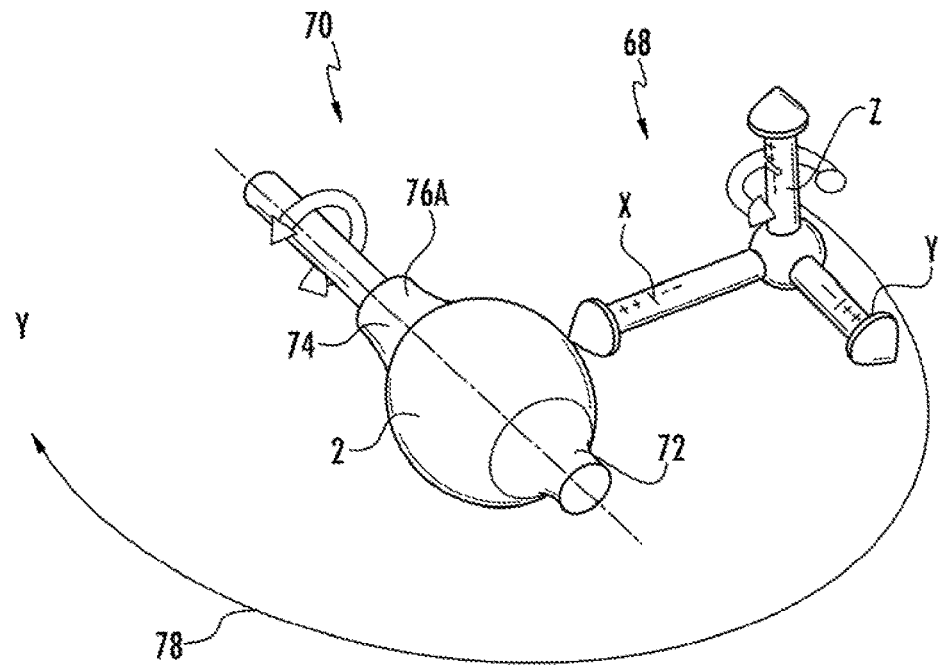
FIG. 6B is a schematic representation of a second embodiment of a motion control system used for positioning a printhead with respect to an article of manufacture.
Figure 6C:
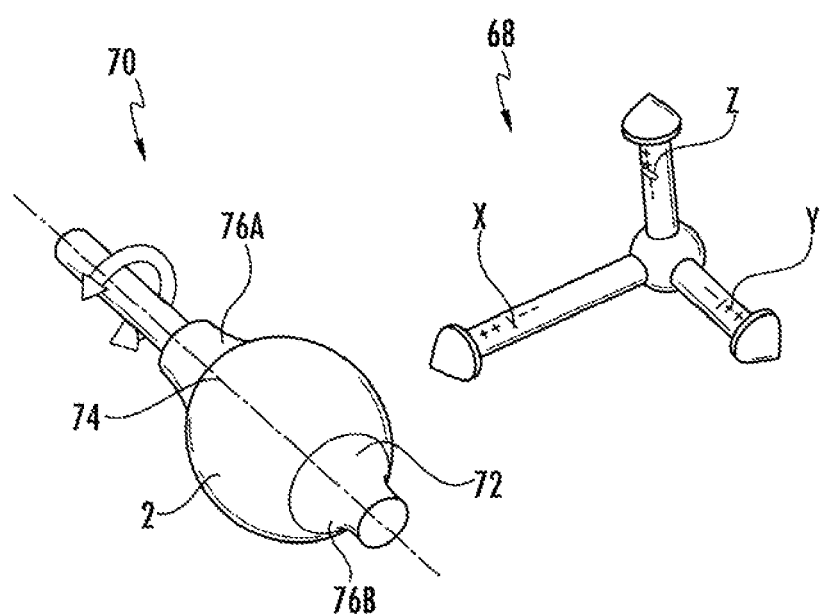
FIG. 6C is a schematic representation of a third embodiment of a motion control system used for positioning a printhead with respect to an article of manufacture.

FIGS. 6A, 6B, and 6C depict alternative embodiments of a motion control portion of the printing system 60, which includes a rotation robot 70 and multi-axis robot 68. For each embodiment, the robot controller 64 controls the cooperative motion of both robots 70 and 68. In a first embodiment, the robot controller 64 can halt the rotation axis robot 70 while the multi-axis robot 68 moves the printhead 66 over the article 2 during a dispensing operation that forms the conductive trace pattern 6. Thus, in this first embodiment, the conductive trace pattern 6 is formed through a series of alternating motions of the rotation axis robot 70 and multi-axis robot 68 under control of the robot controller 64.

In a second embodiment, the robot controller continuously controls simultaneous synchronized cooperative motion of the rotation axis robot 70 and the multi-axis robot 68 to form conductive traces 6. This second embodiment has an advantage of potentially a shorter cycle time for dispensing the conductive trace(s) 6. A third embodiment is in effect a combination of the first embodiment and the second embodiment, whereby for some traces, the robots 70 and 68 move continuously in cooperation, and for some traces the robot 70 is halted while the robot 68 moves during a dispensing operation.

Referring to FIG. 6A, the rotation axis robot 70 supports the article fixture 72 at two ends of article fixture 72 along an axis 74. Thus the fixture 72 is supported at a first end 76A and a second end 76B arranged along axis 74. Rotation axis robot 70 rotates the article fixture about the axis 74 to allow the printhead 66 to obtain access to different surfaces of the article 2. Multi-axis robot 68 is in the exemplary implementation a six-axis robot that can translate along linear axes X, Y and Z, as well as rotate about axes X, Y and Z.

Referring to FIG. 6B, the rotation axis robot 70 supports the article fixture 72 at a single end 76A of the article fixture 72 along axis 74. Rotation axis robot 70 rotates the article fixture about the axis 74. Because the article fixture 72 is supported at only one end, the multi-axis robot on this case can be rotationally translated around the fixture 72 as indicated by arc-shaped arrow 78. Multi-axis robot 68 is a four axis robot that can translate along linear axes X, Y and Z and rotates relative to the Z-axis along the indicated path 78.

Referring to FIG. 6C rotation axis robot 70 supports article fixture 72 at two ends of article fixture 72 along an axis 74. Thus fixture 72 is supported at a first end 76A and a second end 76B arranged along axis 74. Rotation axis robot 70 rotates article fixture 72 about axis 74 to allow printhead 66 to obtain access to different surfaces of article 2. Multi-axis robot 68 is a three axis robot that can translate along linear axes X, Y and Z.

FIG. 7 depicts an exemplary aerosol-based embodiment 80 of a printhead 66. Aerosol printhead 80 is configured to emit a very fine beam 82 of aerosol particles suitable for forming fine conductive traces 14. A fluid supply 84 supplies a fluid containing conductive nanoparticles to an aerosol device or chamber 86. The aerosol device 86 aerosolizes the fluid—a resultant aerosol stream 88 is then directed into an entrainment head 90. An entraining gas supply 92 provides a gas to a chamber 94 from which gas is supplied to surround and entrain aerosol stream 88. A resultant gas-entrained aerosol stream 96 passes out of an exit orifice 98 as aerosol beam 82. Typically the exit orifice 98 has a very small diameter so as to provide a very fine aerosol beam 82.

In one implementation, the gas stream is focused to allow a considerable "throw distance" between exit orifice 98 and substrate 4, while still providing an ability to define very fine traces. The term "throw distance" generally refers in the present context to how far a printhead nozzle can be from a substrate during operation while still effectively forming traces on the substrate, without an unacceptable loss in quality. In one embodiment, the exit orifice 98 can be between 2 to 8 millimeters from surface 4 during trace formation. In another embodiment, the exit orifice 98 can be between 3 and 8 millimeters from surface 4 during trace formation. In yet another embodiment, the exit orifice 98 can be between 3 and 6 millimeters from surface 4 during trace formation. Having sufficient throw distance enables, inter alia, the printing system to print over highly irregular and curved surfaces, including into deep recesses.

In an exemplary embodiment, aerosol printhead 80 is part of a single-nozzle vector based system for "tracing out" the formation of fine conductive traces 14. This will be a premise behind an exemplary embodiment of printing system 24 of fabrication system 20. However, it is to be understand that an embodiment of aerosol printhead 80 can be comprised of a linear and/or staggered array of such nozzles 98, such that aerosol printhead 80 can form an area pattern of fine features. An array embodiment of aerosol printhead 80 could be used, for example, an "area fill" version of printing system 60.

The size of aerosol drops emitted by exit orifice 98 can be less than 1 picoliter (1 picoliter equals $10^{-12}$ liter) in drop volume. The size can be less than 100 femtoliters (1 femtoliter equals $10^{-15}$ liter), less than 10 femtoliters, or even less than 1 femtoliter. The directed aerosol beam 82 forms traces whose width is correlated more to the aerosol beam diameter than to the size of the individual aerosol drops.

The resultant dots or line widths that can be formed onto substrate 8 are advantageously very small. For example, individual dots can be, in the exemplary implementation, less than 25 microns, less than 20 microns, less than 15 microns, or even less than or equal to about 10 microns in diameter. This enables the formation of narrow conductive traces 14.

The fluid utilized in aerosol printhead 80 contains dispersed conductive nanoparticles. In an exemplary embodiment nanoparticles are approximately spherical or spheroidal in shape. They may be described as having an approximately round shape. Each particle has a diameter (or effective average diameter) D that is roughly equal to the diameter of a solid sphere having the same material and total weight of the nanoparticle which may have some shape irregularities. Generally speaking such nanoparticles have diameters less than 200 nm (nanometers).

In various embodiments the particles can have an average diameter D that is in the range of 1 to 100 nm, 1 to 25 nm, 1 to 10 nm to name some examples. In one such example, the average particle diameter D is about 60 nm. In another example, the average particle diameter D is within a range of 3 to 10 nm. In another embodiment, the average particle diameter D is in a range of 5 to 50 nm. In yet another example, the median particle size D is about 10 nm.

In an exemplary embodiment, most or nearly all of the solid content is provided by the conductive nanoparticles. By weight, the fluid can be 5 percent to 95 percent conductive nanoparticles. In some embodiments, the fluid can be 10 percent to 90 percent conductive nanoparticles by weight. In other embodiments, the fluid can be 20 weight percent to 80 weight percent conductive nanoparticles by weight. In yet other embodiments, the fluid can be 40 weight percent to 60 weight percent conductive nanoparticles by weight.

In another embodiment, the conductive fluid is about 50 weight percent silver nanoparticles. In this embodiment, the conductive fluid can be about 15 volume percent silver nanoparticles.

The balance of the conductive fluid is a vehicle that can include water and/or organic solvents or co-solvents. In some embodiments, the fluid vehicle includes a mixture of organic solvents. In some embodiments, the fluid vehicle includes an aliphatic hydrocarbon. In some embodiments, the fluid vehicle contains aromatic hydrocarbons. In yet other embodiments, the fluid vehicle can contain a mixture of an aliphatic hydrocarbon and an aromatic hydrocarbon. Some fluid vehicles can include for example one or more of xylene, hexane, toluene, and chloroform.

The conductive fluid viscosity can be for example in a range of 1 to 1000 cP (centipoise). Generally, a pneumatic nebulizer can be used as part of aerosol generation device 86 when the viscosity is in an adequate range (e.g., 20 to 1000 cP). For a pneumatic atomizer, preferably the viscosity is below about 200 cP. Nitrogen ($N_2$) can be used as the atomizing gas. Conductive inks containing solvent vehicles having vapor pressures below about 1 mm Hg can be used. Examples of vehicle solvents can include xylene and ethylene glycol. For maintenance purposes, fluid vehicles that are water soluble can be useful. A pneumatic atomizer can produce aerosol droplets smaller than 1 micron in diameter.

An ultrasonic atomizer can be used as part of aerosol generation device 86, such as when the viscosity is in a range (e.g., of 1 to 20 cP). Some aerosol atomizers are effective with viscosities of about 5 cP or lower, and some are most effective with viscosities below about 3 cP. In one embodiment, the conductive fluid vehicle includes ethanol. An ultrasonic atomizer can produce aerosol droplets smaller than 0.2 micron.

Other operating parameters are possible consistent with the present disclosure and, for intermediate viscosities, either a pneumatic or an ultrasonic atomizer may be utilized depending upon the desired aerosol droplet size and other factors, as will be appreciated by those of ordinary skill. In some embodiments, the parameters utilized allow aerosol printhead 80 to output a focused beam 82 of droplets that are about three (3) microns in diameter.

An exemplary conductive ink suitable for use consistent with certain embodiments of the present disclosure has an average particle size of about 10 nm, a silver nanoparticle load of about 25 to 60 percent by weight, a hydrocarbon solvent, and a viscosity of about 1-30 cP (centipoise). This conductive ink would most likely be atomized with an ultrasonic atomizer.

Another exemplary conductive ink includes silver nanoparticles in a xylene solvent (aromatic hydrocarbon). The silver nanoparticle load is in the range of 25 to 40 weight percent. Due largely to the solvent used, the curing temperature used therewith can be 100 to 120 degrees Celsius.

Another exemplary conductive ink includes silver nanoparticles in a solvent mixture. The silver nanoparticle load is in the range of 25 to 40 weight percent. The curing temperature can be 120 degrees Celsius or higher.

In some embodiments, curing and/or drying the conductive inks (such as in the oven 28) is sufficient to remove the solvent vehicles. In other embodiments, the curing oven may result in a partial or complete sintering of the conductive nanoparticles. Sintering between the particles is often desirable, as it improves conductivity and thus reduces the skin depth. The occurrence of any sintering is a function of several factors, which can include material(s) used, the curing process, and cure temperature.

In various exemplary embodiments the nanoparticles are silver. However, other nanoparticles can be used, including for example aluminum, copper, or any other conductor usable for a given application. Moreover, the present disclosure contemplates mixtures of two or more heterogeneous substances. Silver has advantages of high electrical conductivity, and being relatively inert (including not generally being prone to thermal or other oxidation).

Figure 8A:
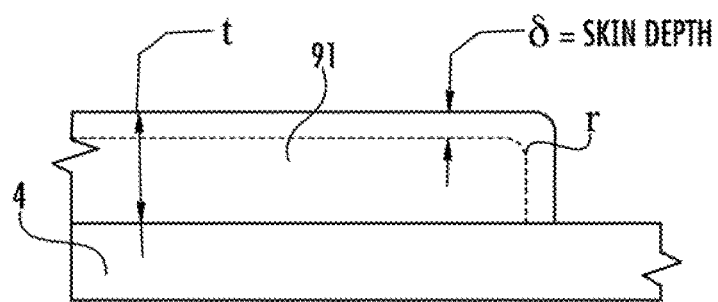
FIG. 8A is a cross section taken from A-A of FIG. 8.
Figure 8B:
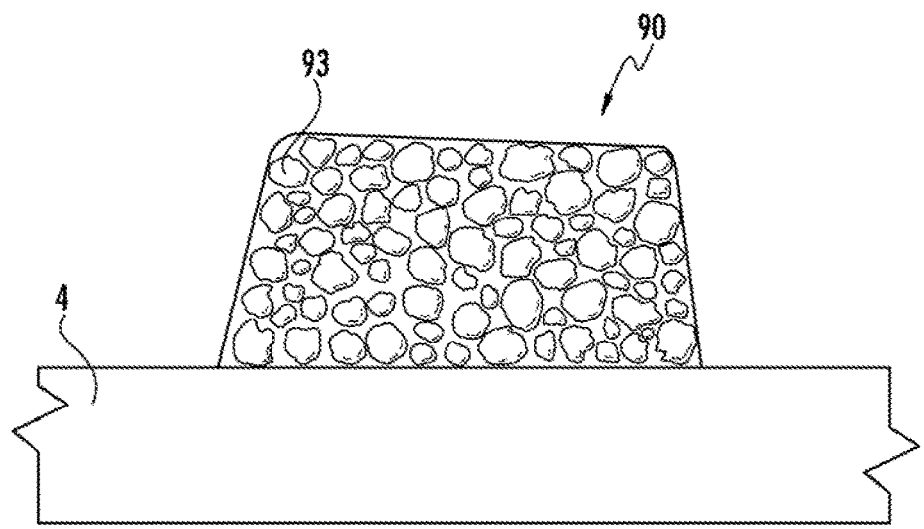
FIG. 8B is a cross section taken from B-B of FIG. 9.

FIGS. 8, 8A, and 8B depict a portion 91 of a single conductive trace 14 formed by aerosol printhead 80. In an exemplary embodiment, the trace portion 91 has a width W that is less than about 200 μm. In a more particular embodiment trace portion 91 can have a width W in a range of 10 to 150 μm. In yet more particular embodiments, the width W can be about 25 μm, about 50 μm, about 75 μm, about 100 μm, about 125 μm about 150 μm or in the range of 20 μm to about 160 μm.

FIG. 8A depicts a cross section of trace portion 91 taken through A-A of FIG. 8. In an exemplary embodiment, trace thickness t is in a range of at least 10 μm for antennas. In another embodiment, the trace thickness t is in a range of 10 to 20 μm for antennas. In yet another embodiment, the trace thickness is about 10 μm, about 15 μm, or about 20 μm for antennas.

FIG. 8B depicts a cross section of trace portion 91 taken through B-B of FIG. 8. Trace portion 91 is formed primarily from spheroidal (nearly spherical) silver particles 93. In an exemplary embodiment, 90% of the particles 93 by weight have a diameter D of less than 100 nm.

Figure 9:
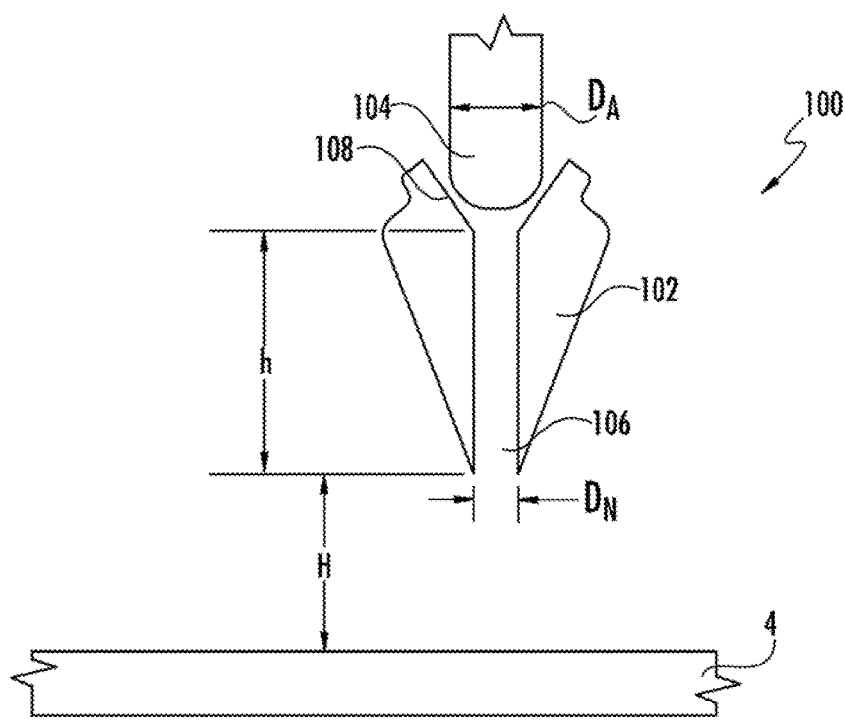
FIG. 9 is a schematic cross-sectional representation of a fluid dispense printhead 100 configured to emit relatively large conductive fluid drops.

FIG. 9 depicts an exemplary embodiment of a fluid dispense printhead 100. The fluid dispense printhead 100 is configured to emit relative large droplets of conductive ink suitable for forming relatively larger conductive traces 15 (FIG. 1C). The fluid dispense printhead 100 is used as part of a vector-based printing system which has been described as printing system 26 with respect to FIG. 2.

FIG. 9 is a cross sectional schematic of the fluid dispense printhead 100, showing details for a single nozzle tip 102, that in this implementation is driven by a piezoelectric hammer 104. The tip of the hammer 104 displaces vertically under the force of a piezoelectric "pusher" transducer and, with each oscillation, ejects a droplet of conductive fluid from nozzle opening 106. As a note, the term "vertical" used in this context does not refer to any gravitational reference but refers to the FIG. 9 illustration and a general direction that droplets of conductive fluid may be ejected onto substrate 4 from the nozzle 106. In fact, this direction may even be horizontal or obliquely inclined relative to a gravitational or any other frame of reference.

The use of a piezo pusher based "drop on demand" dispense head can have certain advantages. "Drop on demand" refers to an ability to programmably eject one droplet at a time at a range of desired drop ejection frequencies, drop sizes, and numbers of drops in a burst of drops.

In an exemplary embodiment, the nozzle opening 106 has a diameter $D_N$ in the range of 50 to 300 μm. In one implementation, the diameter $D_N$ is in a range of 70 to 200 μm. In yet another implementation, $D_N$ is in a range of 80 to 120 μm; e.g., about 100 μm. In an exemplary embodiment, the height h of the nozzle opening can be 0.5 mm to 5 mm (mm=millimeters or thousandths of a meter). In one particular exemplary implementation, h is about 3 mm.

As depicted in FIG. 9, there can be a tapered entrance section 108 leading in to the nozzle opening 106. The piezo hammer 104 impacts the tapered section 108 vertically. In an exemplary embodiment, the piezo hammer 104 has a diameter DA that is in the range of 0.7 to 2.0 mm. In one implementation, diameter DA is about 1.5 mm. In one embodiment, the amplitude of oscillation of piezo hammer 104 is in the range of 0.1 to 0.5 mm; e.g., 0.3 mm. The dimensions thus described have been found to be advantageous in dispensing a conductive fluid which has particles in which 95% of the conductive flakes have a major dimension that is less than 20 μm, although it will be readily appreciated that other sizes and/or dimensions may be used consistent with the present disclosure.

The "throw distance" of the exemplary printhead embodiment (fluid dispense printhead 100) is generally less than that of aerosol printhead 80. In an exemplary embodiment, the nozzle 106 is positioned with a height H that is less than 2 mm above the substrate 4, but more than 0.2 mm. More particularly, in one implementation, H is less than 1 mm but more than about 0.2 mm. In another implementation, H is in the range of 0.4 mm to 1.0 mm. In another exemplary embodiment, H is about 1 mm.

When drops are ejected from the nozzle 106, there can be trajectory errors introduced due to drops that are ejected at some angle from the nozzle 106. Other sources of trajectory errors include airflow, and a translation velocity between the nozzle 106 and the substrate 4 parallel to the substrate 4. This translation velocity introduces a velocity component to ejected droplets of fluid that is not normal to the receiving surface of substrate 4. It is possible to compensate for this component through, e.g., drop ejection timing, but such compensation may introduce errors. One way to improve drop placement accuracy is to minimize H. But at the same time, a value of H that is too small may cause a "crash" between the nozzle tip 106 and the substrate 4 which could result in damage to the fluid dispense printhead 100 or to a resultant article of manufacture 2. Thus, it has been found by the inventors hereof that the discussed ranges for H are typically optimal for dispensing conductive fluid for conductive elements such as e.g., antennas, although other ranges may be used in the broader context of the present disclosure.

A control system within the exemplary implementation of the printing system 60 maintains the distance H to a consistent value while drops of conductive fluid are being dispensed upon the substrate 4. This is despite sometimes having to move the nozzle 106 over a three-dimensional surface 8 of a substrate 4. While moving along a straight or curved path, the nozzle 106 dispenses drops in a manner such that individual dots may be difficult to discern despite the use of large drops of conductive fluid. As defined in the present context, a stroke is the motion of a nozzle 106 relative to a substrate 4 during the formation of a trace portion of conductive pattern 6. The stroke can be linear or nonlinear in shape and/or rate of motion. A stroke can be executed over a non-planar path such that a plane cannot be fitted to the path of the stroke due to a non-planar substrate surface 8.

In an exemplary embodiment, the dispense or fluid dispense printhead 100 described above can form dots on a substrate having a dry volume of each dot (after solvent is dried) in the range of e.g., 1000 to 10000 picoliter (one picoliter is $10^{-12}$ liter). In a more particular embodiment, the dry volume of each dot is in the range of 2000 to 5000 picoliter. In one implementation, the dry volume of each dot is in the range of 2500 to 4500 picoliter. In yet another implementation, the dry volume of each dot is in the range of 3000 to 4000 picoliter, e.g., about 3500 picoliter. Having drop volumes within these ranges can enable the rapid production of exemplary antenna traces while avoiding drop-induced variations in trace impedance that might occur if the drops are too large.

In some embodiments, the fluid dispense head 100 can form dots on a substrate, each dot having a dry volume in the range of 500 to 5000 picoliter. In some embodiments, the fluid dispense head 100 can form dots on a substrate having a dry volume of each dot in the range of 1000 to 2000 picoliter. In yet other embodiments, the fluid dispense head 100 can form dots on a substrate having a dry volume of about 1600 picoliter.

In an exemplary embodiment, the dispense head 100 described above with respect to FIG. 9 can dispense drops that form dots on a substrate having "effective dot diameters" within the range of 100 to 1000 μm. In one implementation, the effective dot diameters are within a range of 200 to 600 μm. In yet another implementation, the effective dot diameters are in a range of 300 to 500 μm, or in a range of 350 to 450 μm. The term "effective dot diameter" is used because the dispensed dots may be irregular in shape. The particular selected effective dot diameter generally depends upon a dimension of the narrowest trace width W desired, although other considerations may be used in selecting appropriate effective dot diameters.

The conductive fluid utilized with fluid dispense printhead 100 includes conductive particles in a fluid vehicle. The particle size and form factor are often important, with conductive flakes having a major dimension D less than about 20 μm preferable in certain implementations (although this number is in no way limiting).

The viscosity of the fluid can also be important in some applications. A more viscous fluid will tend to result in relatively stable drop formation and less flow of the traces after dispensing. However, lower viscosity can enable the use of smaller drops and higher drop ejection operating frequencies. The ranges of viscosities employed have been found to be advantageous and relatively optimal in rapidly forming conductive traces for e.g., antennas. In an exemplary embodiment, the viscosity of the conductive fluid is about 10 to 80 poise. In one implementation, the viscosity of the fluid is about 20 to 60 poise. In yet another implementation, the viscosity of the fluid is about 30 to 50 poise, or in the range of 35 to 45 poise. Viscosity according to these embodiments can be measured using e.g., a viscometer. Viscosities within these ranges have been measured using a cone and plate viscometer using a high shear cap at 50 RPM (revolutions per minute) at 25 degrees Celsius. The viscometer was a Wells-Brookfield Cone/Plate system provided by Brookfield Engineering Laboratories. Other approaches for viscosity determination may be used with equal success.

In some embodiments, the viscosity can be modulated according to a printhead temperature. If the printhead is heated, the viscosity may be reduced. In one embodiment, the viscosity of the conductive fluid is about 35 to 45 poise at 25 degree Celsius, but is about 15 to 20 Poise when heated to about 60 degrees Celsius in the printhead 34 just prior to drop ejection. Lowering viscosity can have the effect, inter alia, of increasing the ejected fluid drop velocity and drop volume for drops ejected from dispense printhead 100.

Additionally, polymers known to be mostly evaporated during the curing (e.g., oven drying) process are preferable to minimize insulative material between the conductive particles. Another component that can in some embodiments be beneficial is to include in the fluid vehicle is a component that will dissolve a thin surface of the substrate 4. This has the potential of yielding an improved bonding interface between the substrate 4 and conductive pattern 6. As an illustrative example, consider a conductive fluid used with a polycarbonate substrate 4. Certain aromatic hydrocarbons and ketones (such as MEK—methyl ethyl ketone) are known to dissolve polycarbonate. Certain other solvents from classes of esters, amines, and alcohols can also be utilized. Of course these are only illustrative and other components can be used depending upon the substrate material used. Including a fraction of such a component can improve adhesion between the conductive fluid and the substrate.

Using the fluid dispense printhead 100 described with respect to FIG. 9 and the inks having the above-mentioned properties, traces having at least two or at least three or at least four or at least five times a skin depth δ can advantageously be deposited with a single stroke. The thickness t per stroke can be in the range of 20 to 100 microns per stroke. In one implementation, the thickness t per stroke can be 20 to 60 microns, or 20 to 40 microns. In one embodiment the thickness t per stroke is about 30 microns. For example, a 100 μm diameter range nozzle diameter $D_N$ with a heated fluid having a viscosity (prior to heating) of about 35 to 45 poise will provide a thickness per stroke of about 40 microns. Given that the skin depth can be in a range of about 5 to 15 microns at 1 Ghz, this provides a bead with about 2 to 8 times the skin depth δ with a single stroke. Of course this particular example is but one set of parameters within the ranges discussed above that enables a high performance conductive (e.g., antenna) trace to be dispensed in an efficient manner.

Referring to FIG. 2, fluid dispense printhead 100 can be part of the second printing system 26. During printing, the nozzle 106 is translated across the surface of substrate 4, and drops of conductive fluid are dispensed onto substrate 4 in order to define wider portions 15 of conductive trace pattern 6. After printing is complete, article 2 is transported to oven 28 to drive solvent from the conductive fluid, and/or provide other desired effects. In an exemplary embodiment, the baking cycle is for 10-60 minutes with a temperature in the range of 90 to 140 degrees Celsius. In one implementation, the oven temperature can be in the range of 100 to 130 degrees Celsius. In one particular embodiment, the baking cycle is about 25 minutes with a temperature of 100 to 110 degrees Celsius. In one embodiment, the oven 26 comprises a zone oven having varying zone temperatures to enable one or more desired drying temperature profiles.

Figure 10:
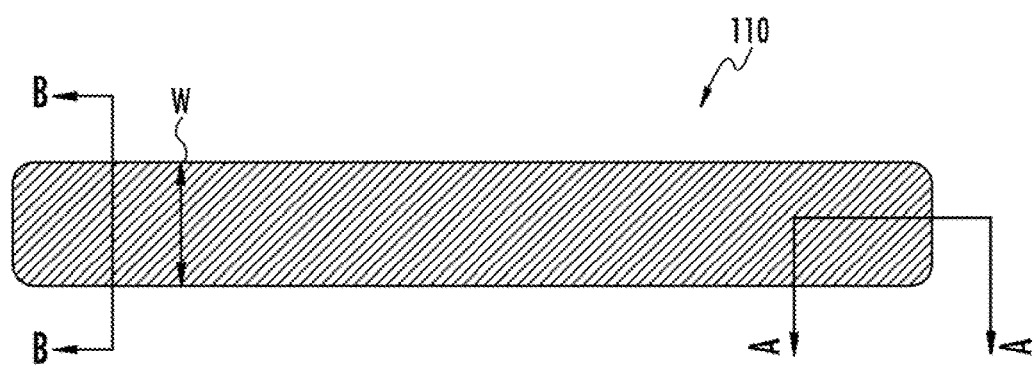
FIG. 10 is a plan view of an exemplary portion 110 of a wide conductive trace 15 that is formed by the fluid dispense printhead 100 of FIG. 9.
Figure 10A:
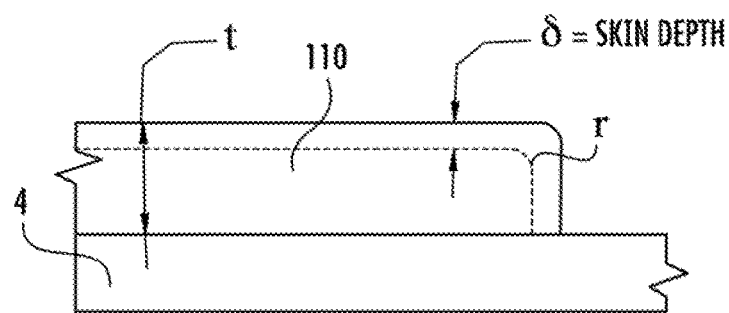
FIG. 10A is a cross section taken from A-A of FIG. 10.
Figure 10B:
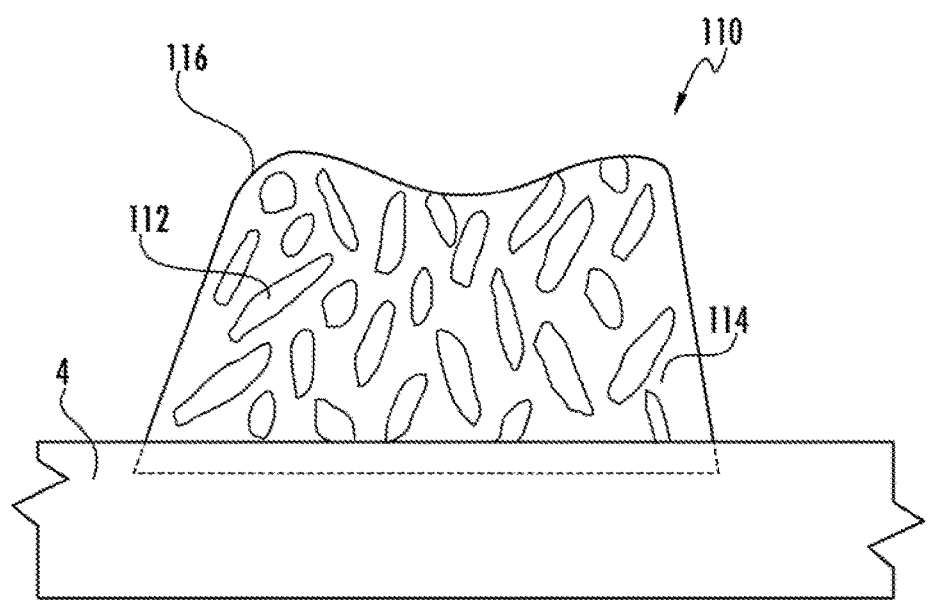
FIG. 10B is a cross section taken from B-B of FIG. 10.

FIGS. 10, 10A, and 10B depict an exemplary portion or segment 110 of a wide conductive trace 15. The segment 10 may also be referred to as a "trace" or "trace portion." Segment 110 has a width W, and thickness t. In one embodiment, the width W can range between 0.25 to 3.0 mm (millimeters). More particularly, the width W in an exemplary implementation falls between 0.3 to 2.0 mm. In another implementation, W falls between 0.5 and 1.5 mm. In yet another implementation, W falls between about 0.6 to 1.4 mm. Yet other values for W may be substituted, as will be recognized by those of ordinary skill when provided the present disclosure. In some cases a trace portion 110 may actually be a large rectangular area of metal.

The selection of a trace width W is in the exemplary embodiment based upon such considerations as impedance, the presence or possibility of voids or other defects, and trace density. As the trace width decreases below a certain value (e.g., 0.3 mm in one particular case), an ability to form the trace based on a particular nozzle design can become increasingly challenging since a void in the trace (caused by, for example, and air bubble) of a given size is going to have a much greater impact on a narrower trace. A void may also provide an electrical constriction in the trace. Resistance at the constriction may be unacceptable. On the other hand, as the trace becomes wider, it may require more dispensing operations and trace geometry becomes constrained for higher density designs. Yet other factors or considerations may be important to the determination of optimal or desired trace width(s).

FIG. 10A depicts a cross section of a trace segment 10 formed on a substrate 4 taken through section AA. In an exemplary embodiment, the trace thickness t is in a range of 20 to 100 μm (microns or micrometers). In another implementation, the trace thickness t falls in the range of 30 to 70 μm. In yet another implementation, the trace thickness t falls in the range of 40 to 60 μm. In yet another implementation, the trace thickness t falls in the range of 20 to 40 microns or 25 to 35 μm or about 30 μm. Other values within the various ranges aforementioned, or yet other ranges, may be used as well consistent with the present disclosure.

In one exemplary embodiment of the present disclosure, any or all of these thicknesses can be formed with a single stroke or pass of a dispensing head nozzle across a substrate surface, including composites of the foregoing (e.g., a first portion at thickness $t_1$ and width $W_1$, a second portion at thickness $t_2$ and $W_2$, and so forth, each of the portions in sequential order). In one embodiment, a single stroke of the dispensing head nozzle over the substrate 4 can form a trace 10 having a thickness t within a range of 30 to 50 μm. In one embodiment, a single stroke of the dispensing head nozzle over the substrate 4 can form a trace 10 having a thickness t within a range of 20 to 40 μm. In one embodiment, a single stroke of the dispensing head nozzle over the substrate 4 can form a trace 10 having a thickness t within a range of 30 to 50 μm or 25 to 35 μm or about 30 μm.

In some implementations it is preferable that the thickness t be at least a prescribed multiple (e.g., at least twice or at least three times) a skin depth δ for a given trace 10 to reduce or minimize an impedance to alternating current. In an exemplary embodiment, the trace 10 depicted in FIG. 2A has a skin depth δ in the range of in the range of 4 to 15 μm (microns or micrometers) at 1 GHz. In some implementations, the trace 10 has a skin depth in a range of 8 to 15 μm. In some implementations, the trace 10 has a skin depth in a range of 10 to 13 μm. It will be appreciated that in referring to the skin depth of a particular implementation described herein, the terms "skin depth" and "effective skin depth" are to be considered to be interchangeable. This is largely due to the fact that the trace 10 is essentially a composite material, as will be explained in greater detail below.

In some implementations it is preferable that the thickness t be at least 4 or 5 times a skin depth δ for a given trace 10. In an exemplary embodiment, the trace 10 depicted in FIG. 2A has a skin depth δ in the range of 4 to 15 μm (microns or micrometers) at 1 GHz. In another implementation, the trace 10 has a skin depth δ in the range of 4 to 8 μm. In yet another implementation, the trace 10 has a skin depth δ in the range of 4 to 6 μm (e.g., about 5 μm). Also, it will be appreciated that the skin depth δ can vary along the length of the trace 10 if desired, according to any desired pattern or to achieve a desired purpose of capability of the trace (e.g., with respect to its radio frequency and/or conductive properties).

FIG. 10B depicts a cross section of a trace portion 110 formed on the substrate 4 taken through section BB. Trace portion 110 is formed from a plurality of conductive particles 112. The particle materials and microstructure are at least partly determinative of the "effective skin depth" δ of trace portion 110. Each of the particles have a characteristic particle dimension $D_p$, which may vary from particle to particle. The effective skin depth δ of trace portion 110 can be at least partly determined by a number of different factors including particle 112 dimensions, the weight percentage of particles 112 of trace portion 110, particle 112 orientation, the electrical properties of matrix 114 between particles 112, electrical properties of particle 112 material, and other factors. In an exemplary embodiment matrix 114 has a much higher resistivity than particles 112, so that the density and geometric arrangement of particles 112 within a less conductive matrix material 114 may dominate in determining an effective skin depth δ.

In an exemplary embodiment, the particles 112 comprise silver particles. In other embodiments, the particles 112 can be formed from copper, aluminum, gold, or platinum, or any other high conductivity metal, or even alloys thereof. Moreover, the particles may be mixed with other (heterogeneous) particles, such as where silver particles and gold particles are mixed in a desired proportion (contrast, alloyed together).

Figure 11A:
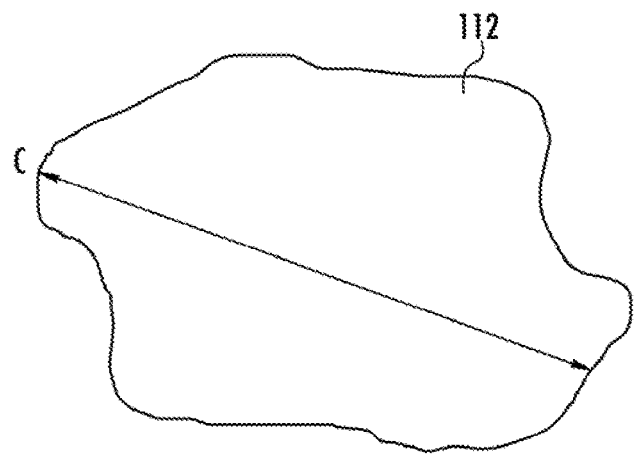
FIG. 11A is a "top view" of a silver flake 112.
Figure 11B:
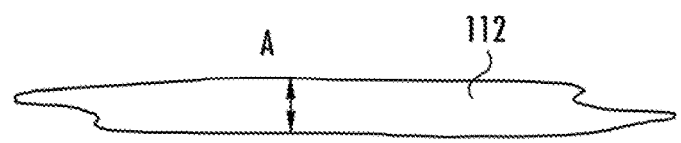
FIG. 11B is a "side view" of a silver flake 112.

In an exemplary embodiment, the particles 112 are substantially flattened, irregular-shaped particles such as "flakes". Top and side views of an exemplary silver flake are depicted in FIGS. 11A and 11B, respectively. The top view in FIG. 11A depicts an irregular outline having a major dimension B. The side view in FIG. 11B depicts thickness A of the flake. Other shapes may be used consistent with the present disclosure, where it is determined that such shape(s) provide the desired properties and performance.

It will also be appreciated that one or more of the particle characteristics (such as e.g., C, A above) may be statistically distributed according to a function; e.g., a Gaussian or "normal" distribution, or other such function. For instance, most particles may fall within a given parametric range, with lesser portions of the whole falling within other ranges. In an exemplary embodiment, at least 95 percent by weight of the particles 112 have a dimension C that is less than 20 μm. In one particular implementation, at least 95 percent by weight of particles 112 have a dimension C that is less than 16 μm. It can be advantageous in certain cases to have a majority of particles (by weight) having a value of C that is e.g., larger than about 4 microns, larger than about 6 microns, larger than about 8 microns, or larger than about 10 microns. However, particles 112 having a major dimension C larger than about 20 μm can be difficult to dispense using the exemplary fluid dispense printhead 100. It is also noted that particles having a flake-like or plate-like or oblate (flattened sphere) form factor can provide advantages of a larger dimension C while being more amenable to nozzle dispensing. Hence, the present disclosure recognizes that particle shape, among other things, can be a significant determinant of performance, and in fact can be controlled to achieve one or more desired properties or characteristics such as e.g., reduced nozzle clogging, enhanced flow, better pattern consistency, etc.

In an exemplary embodiment, the minor dimension A (thickness of particle 112) is in the range of 0.3 to 4.0 μm for the majority of particles by weight. In another implementation, A is in the range of 0.5 to 2.0 μm for the majority of particles by weight. In yet another implementation, A is in the range of 0.5 to 1.0 micron, or even in the range of 1.0 to 2.0 micron for the majority of particles by weight. For instance, one particular embodiment uses particles having A on the order of 0.6 micron for the majority of particles by weight.

The form factor of particles 112 can be defined by any number of metrics, such as the ratio of C (the major dimension) to A (the minor dimension or thickness). In an exemplary embodiment, the ratio of C to A is more than 2 for the majority of the particles by weight. In another implementation, the ratio of C to A is more than 4 for the majority of the particles by weight. In yet another implementation, the ratio of C to A is more than 8 for the majority of the particles by weight.

It has been observed that in certain cases, when the conductive trace portion 110 is dispensed and cured, a fraction of particles 112 often tend to align themselves along an outside surface 116 of the trace portion 110, whereby the major axis C of a particle 12 is in general alignment with the outside surface 116. Of course there is some degree of random orientation, but it has been noted by the inventors hereof that such alignment tends to occur particularly for particles 112 having a longer major axis C, such as those having a value of C that is 4 microns or more. Also the particles 112 disposed away from the outside surface 116 appear to tend to have more of a random orientation.

Figure 12:
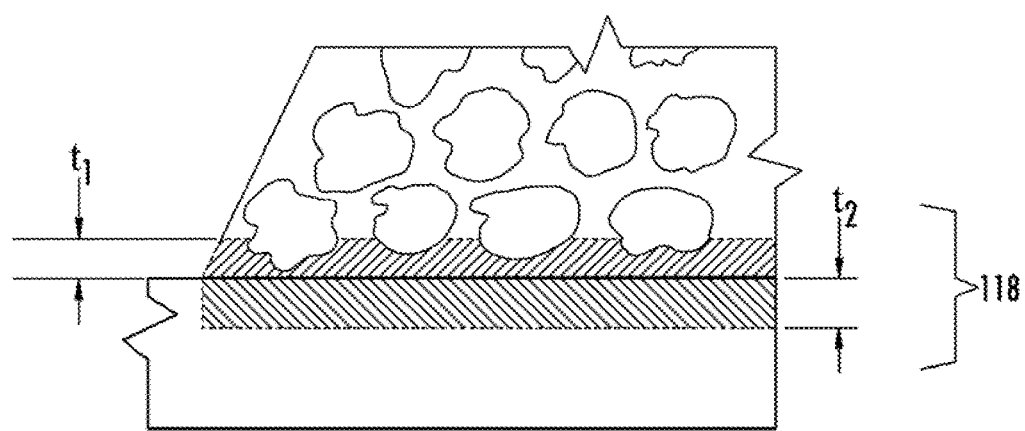
FIG. 12 is a cross sectional representation of a portion of an exemplary conductive trace 15 formed on a substrate illustrating an adhesion zone.

FIG. 12 depicts an illustrative embodiment of a bonding interface 118 between the substrate 4 and conductive trace material 10. With some substrate dissolution there is a surface adhesion effect. A portion of the substrate 4 having thickness $t_2$ has been dissolved. A zone within conductive particles 112 of thickness $t_1$ has been penetrated by dissolved matter from substrate 4. The overall zone of influence 81 may have a thickness $t_1+t_2$ ranging from 0.1 μm to 5 μm. In one particular embodiment, the zone of influence thickness $t_1+t_2$ can range from 0.2 to 2 μm. This can provide a mechanical lock between substrate 4 and trace portion 110 by through the interpenetration of substrate material up into conductive particles 112.

Other bonding chemical and/or mechanical mechanisms at the interface 118 can be possible. For example, the bonding mechanism at interface may include any or all of polar, van der Waals, ionic, and/or covalent bonding. The fluid used to form trace portion 110 may includes an adhesion promoter which forms a coupling agent between trace 110 and substrate 4.

FIG. 13 depicts a simplified method of manufacturing article 2 including forming a conductive trace pattern 6 utilizing the fabrication system 20 depicted in FIG. 2 in which first printing system 24 utilizes aerosol printhead 80 described with respect to FIG. 7 and in which second printing system 26 utilizes fluid dispense printhead 100 described with respect to FIG. 9. This method of manufacturing assumes that the conductive trace pattern 6 includes narrow traces 14 that require the use of aerosol printhead 80. If that was not the case, then the conductive trace pattern would preferably be formed by fluid dispense printhead 100 and not aerosol printhead 80.

According to step 120 an input file 23 is received by file processor 22. According to step 122 the file is analyzed and all traces having a width W less than a certain threshold are identified. In an exemplary embodiment this width W is 300 μm. For purposes of illustration it is assumed that some of the traces have a width above this threshold and some have a width below the threshold.

Also according to step 122 at least two domains are defined including a first domain having traces whose width W is below the threshold and a second domain having traces whose width W is above the threshold. At least two domains collectively contain the entire conductive trace pattern 6 to be printed.

According to step 124, two process times are computed: (1) the process time required to print the entire trace pattern using the aerosol printhead 80 and (2) the process time required to use aerosol printhead 80 to print all traces below 300 μm in width and to use fluid dispense printhead 100 to print all traces having a width of 300 μm and above. According to step 126 a decision is made based upon comparison of process times. If using fluid dispense printhead 100 does not reduce the process time then a single aerosol print file is generated according to step 128 and the entire trace pattern 6 is printed using aerosol printhead 80 according to step 130.

For most situations requiring small traces 14, however, the process time will be reduced by using both printheads 80 and 100. This is particularly true because many conductive patterns 6 will only have a relatively small percentage—sometimes less than 5 or 10 percent—of the total area of conductive traces below the width threshold for system 100.

According to step 132, two overlapping files including a first file and a second file are created based upon the first and second domains respectively. The files are overlapped to provide a suitable contact area between nanoparticle traces from aerosol printhead 80 and silver flake traces from fluid dispense printhead 100. The overlap is defined to exceed a combined misalignment tolerance between aerosol printhead 80 and fluid dispense printhead 100. The first file defines the narrower geometry traces 14. The second file defines the wider geometry files 15. In an exemplary embodiment the narrower geometry traces 14 are extended into the wider traces 15 in order to define the overlap. In another exemplary embodiment the wider geometry traces 15 are extended into the narrower traces 14 in order to define the overlap. Also according to step 132, the first file is transferred to first printing system 24, and the second file is transferred to the second printing system 26.

According to step 134, the first printing system 24 prints the fine geometry traces 14 using the aerosol based aerosol printhead 80. According to step 136, the second printing system 26 prints the larger geometry traces 15 using the fluid dispense printhead 100.

Figure 14:
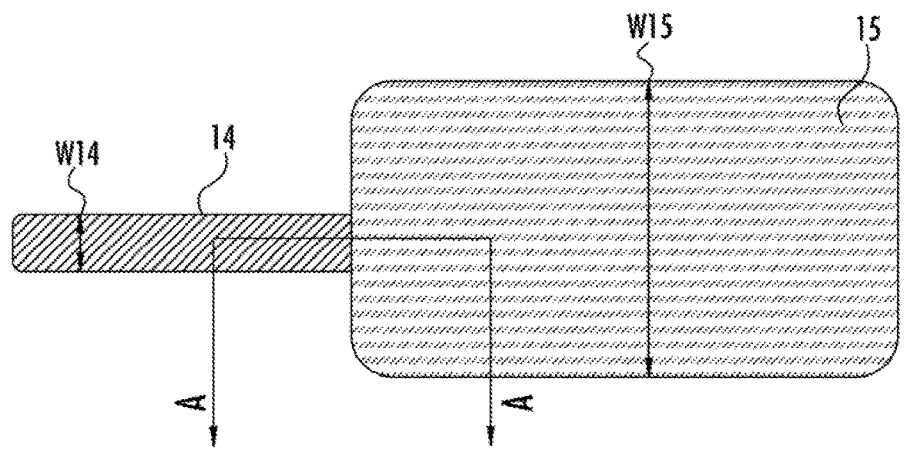
FIG. 14 a plan view of a junction between a fine trace 14 and a wide trace 15.
Figure 14A:
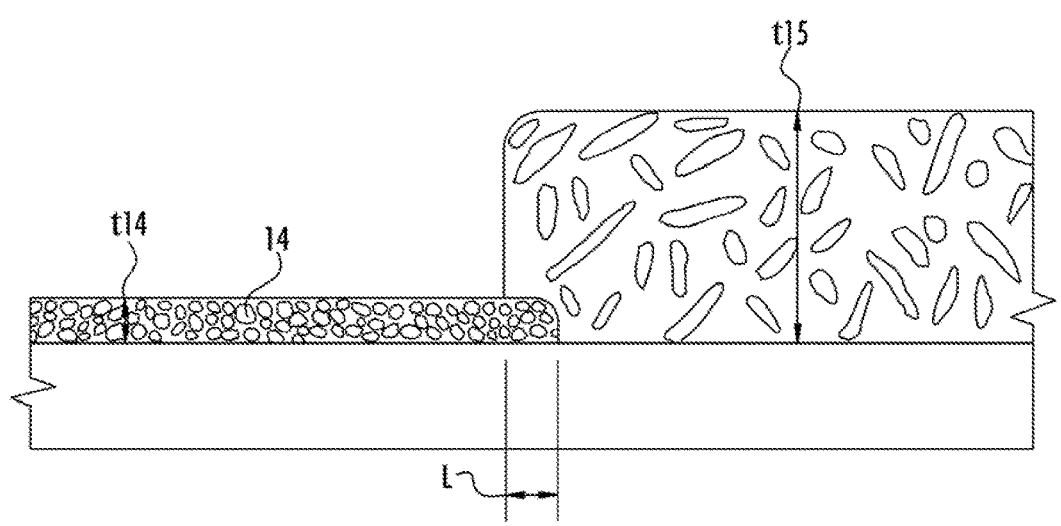
FIG. 14A is a cross section taken from A-A of FIG. 14.

FIGS. 14 and 14A depict a portion of a conductive trace pattern 6 including a junction between a narrower trace 14 and a wider trace 15. In an exemplary embodiment a width threshold for the fabrication system 20 utilized to define the trace pattern is 300 μm. In the illustrated FIG. 14 a width W14 of trace 14 is about 100 μm. In the illustrated FIG. 14 a width W15 of trace 15 is more than 300 μm.

Aspects of trace 14 have been discussed with respect to FIGS. 7, 8, 8A, and 8B such as the aerosol printhead 80 used for formation and particle sizes. Aspects of trace 15 have been discussed with respect to FIGS. 9, 10, 10A, 10B, 11A, 11B, and 12.

FIG. 14A depicts a cross-sectional view of the junction between traces 14 and 15 taken from section A-A of FIG. 14. As depicted there is an overlap distance L between traces 14 and 15. During step 132 of FIG. 13 the length of trace 14 has been lengthened. In one embodiment overlap L can be in the range of 25 to 500 μm. In another embodiment overlap L can be in the range of 50 to 200 μm. In yet another embodiment overlap L can be in the range of 75 to 150 μm.

In an alternative embodiment, the fine geometry trace 14 is formed with a piezo array printhead 140 (to be discussed with respect to FIGS. 15A and 15B). The larger geometry trace is printed with fluid dispense printhead 100 (discussed with respect to FIGS. 9, 10, 10A, and 10B).

FIGS. 15A and 15B depict a piezo array printhead 140 that may be utilized as an embodiment of printhead 66 (FIG. 5) utilized in printing system 35 (FIG. 3). FIG. 15A depicts a side view of piezo array printhead 140 having a nozzle face 142 ejecting droplets 144. FIG. 15B depicts a view of a nozzle face 142 having two substantially linear arrays or columnar arrangements 146 of nozzles 148.

In one embodiment, each of the columnar arrangements 146 is at least 0.5 inches in extent, and includes at least 100 nozzles. In another embodiment, each of the columnar arrangements is about one inch in extent and includes at least 300 nozzles. Other embodiments can include 600, 1200, or even 2400 nozzles. Yet other numbers and/or configurations of nozzles may be used consistent with the present disclosure.

Each nozzle is configured to eject a conductive ink containing conductive nanoparticles similar to those ejected by aerosol printhead 80. In one embodiment, the nanoparticles have diameters of less than 100 nm (nanometers). An exemplary ink can have nanoparticles with a diameter between 3 to 10 nm, a solid content of about 45 percent, a viscosity of about 4 to 5 cP (centipoise), with an organic fluid vehicle. This is but one example, and it will be recognized that the particle size and fluid properties can vary greatly. In an exemplary embodiment, the nanoparticles are silver nanoparticles, although others may be used (including heterogeneous mixes) as previously described.

In an exemplary embodiment, each nozzle 148 is configured to eject droplets having a fluid volume in the range of 0.2 to 200 pL (picoliter). In a more particular embodiment, the fluid drops are in the range of 1 to 100 pL (picoliter). In another particular embodiment, the fluid drops are in a volume range of 1 to 30 pL (picoliter).

The printing system 35 is configured to move the nozzle face over substrate 4 in a direction that is perpendicular to a long axis of the columnar arrangement 146. As the nozzle face is moved, the nozzles 148 are actuated to form a dot matrix arrangement of conductive ink drops over substrate 4 to define a portion of conductive trace pattern 6. This type of printing system is referred to as a "raster" printing system, and is very efficient at defining high density and high area coverage arrangements of conductive traces. Vector printing systems such as those utilizing aerosol printhead 80 or fluid dispense printhead 100 tend to be less efficient and more time consuming in forming such a high density conductive trace arrangement.

However, despite the efficiency advantages of raster printing, there may be reasons to operate piezo array printhead 140 in a vector mode, whereby one or more nozzles 148 trace out a portion of a conductive trace pattern 6 in a manner similar to that of fluid dispense printhead 100. An advantage of the vector mode is that much finer traces are enabled with a given nozzle 148.

The effective "throw distance" of a piezo array printhead 140 is dependent upon at least drop size. For smaller drops, the distance between nozzle face 142 and substrate 4 may need to be less than 2 millimeters. Preferably the distance is in the range of 0.5 to 1.5 millimeter or from 0.8 to 1.2 millimeter. If the surface 8 to be printed upon is highly irregular, this may be difficult due the physical extent of nozzle face 142.

FIG. 16 depicts an implementation of a method of printing the conductive trace pattern 6 using an embodiment of fabrication system 30 utilizing three printing systems 34-36 (FIG. 3). The printing system 34 includes an aerosol printhead 80 that operates in a vector dispense printing mode. Printing system 35 utilizes a piezo array printhead 140 that operates in a raster area fill printing mode. Printing system 36 utilizes a fluid dispense printhead 100 that operates in a vector dispense printing mode. A printing system 60 that can be any of printing systems 34-36 has already been described with respect to FIGS. 5 and 6A-6C. The exemplary aerosol printhead 80 has already been described with respect to FIGS. 7, 8, 8A, and 8B, and the exemplary fluid dispense printhead 100 has already been described with respect to FIGS. 9, 10, 10A, 10B, 11A, 11B, and 12. The exemplary piezo array printhead 140 has already been described with respect to FIGS. 15A and 15B. In the description that follows, it is preferable that piezo array printhead 140 is a high resolution piezo array printhead 140 capable of printing a grid array pattern of at least about 1000 dots per inch across surface 8 in order to define fine metal traces 14 in a raster print mode, although this is not a requirement of practicing the disclosure.

One or all of printing systems 34-36 can be utilized for a given conductive trace pattern 6. According to this exemplary embodiment systems 34, 35, and 36 utilize printheads 80, 100, and 140 respectively. To understand why more than one printhead 80, 100, and/or 140 would be used, it is useful to describe the conductive trace pattern 6 in terms of domains which are in one embodiment defined as portions of conductive trace pattern 6 each having particular geometric attributes of the traces 6 and/or the surface 8. Table 2 below defines some of these domains. FIG. 17 depicts an exemplary conductive trace pattern including some examples of the domain types.

TABLE 2

| DOMAIN NUMBER | TRACE WIDTH | SURFACE GEOMETRY | METAL DENSITY | CAPABLE PRINTING SYSTEMS |
| --- | --- | --- | --- | --- |
| I | WIDE | PROUD, SA CURVE | HIGH | 34, 35, 36 |
| II | WIDE | PROUD, SA CURVE | LOW | 34, 35, 36 |
| III | WIDE | RECESSED OR DA CURVE | HIGH OR LOW | 34, 36 |
| IV | NARROW | PROUD, SA CURVE | HIGH | 34, 35 |
| V | NARROW | PROUD, SA CURVE | LOW | 34, 35 |
| VI | NARROW | RECESSED OR DA CURVE | HIGH OR LOW | 34 |

Domain number (type) I includes wide traces 15 having a width above a predetermined threshold. In an exemplary embodiment, this threshold is 300 μm. The geometry of surface 8 within domain type I is "proud"—meaning that it is not recessed or concave. More specifically the surface 8 does not have points that are recessed relative to surrounding points beyond a certain threshold. In an exemplary embodiment, "proud" means that points are not recessed more than a given value; e.g., 0.5 millimeters relative to surrounding points. "SA CURVE" (single axis curvature) indicates that domain type I does not have two axes of curvature that result in a height difference exceeding a threshold along two axes within the domain. In an exemplary embodiment, the threshold would be about 0.5 millimeter. As indicated above, domain I can be printed upon by all three printheads including aerosol printhead 80, piezo array printhead 140, and fluid dispense printhead 100. However, because the metal density is high, the piezo array printhead 140 can probably print domain I most efficiently. Note that a high metal density can refer to a very high density of narrower traces, or it can refer to a very wide trace that is a multiple of the width that can be printed by fluid dispense printhead 100 requiring a number of strokes to achieve the width, or yet other definitions.

Domain type II is the same as domain type I, except that the trace density is low. While all three printhead types (80, 100, 140) can print domain type II, it may be most efficient to print domain type II with fluid dispense printhead 100.

Domain type III has a surface geometry that is either recessed or has double axis curvature. In an exemplary embodiment, the term "recessed" refers to the surface having points that are recessed more than a certain predetermined threshold relative to surrounding points. In one implementation, this threshold is 0.5 millimeters. In an exemplary embodiment, the term "double axis curvature" means that the surface is "crowned" or peaked, and that the surface falls away by a distance exceeding a threshold, such as e.g., 0.5 millimeters along two approximately orthogonal axes. With domain type III, the piezo array printhead may not be able to effectively print the traces because the increased distance between printhead nozzles and the print surface 8 may cause unacceptable printing errors. Therefore, vector dispense printheads 80 or 100 (or other comparable performance techniques) may be needed to print domain type III. Because the traces are comparatively wide, the fluid dispense printhead 100 can generally print domain type III most efficiently.

Domain type IV is the same as domain type I, except having narrow traces 14. Narrow trace width is defined as having traces below some threshold, such as below 300 µm. Either aerosol printhead 80 or piezo array printhead 140 can print domain IV. However, the piezo array printhead 140 can probably print domain type IV most efficiently due to the high trace density (provided that piezo array printhead 140 has a sufficiently high resolution).

Domain type V is the same as domain type II, except having narrow traces 14. Domain type V is also the same as domain type IV, except having a low trace density. Either aerosol printhead 80 or piezo array printhead 140 can print domain IV. However, aerosol printhead 80 may be able to print domain type V most efficiently, due to the low trace density.

Domain type VI is the same as domain type III, except for having narrow traces 14. As a result, aerosol printhead 80 may be the only viable candidate for printing domain type VI.

Table 3 below lists a number of exemplary printing sequences that can be utilized to form the conductive trace pattern 6. The numbers 1, 2, and 3 indicate the order in which a given printing system is used. For example, sequence B utilizes the aerosol printhead 80 first (indicated by 1 as first in the sequence) and then the piezo array printhead 140 second (indicated by 2 as second in the sequence). However, sequence B does not utilize the fluid dispense printhead 100. Using sequence B all of the domains can be printed. But this may not be the most efficient sequence for some conductive trace patterns 6. While table 3 depicts a certain ordering of printhead use other orders are possible such as one starting with the piezo array printhead 140 or any other ordering utilizing the various printheads described. Therefore other sequences other than those listed in table 3 are possible.

TABLE 3

| SEQUENCE | AEROSOL BEAM | PIEZO ARRAY | CONDUCT FLUID NOZZLE | POSSIBLE DOMAINS |
|---|---|---|---|---|
| A | 1 | NOT USED | NOT USED | I-VI |
| B | 1 | 2 | NOT USED | I-VI |
| C | 1 | 2 | 3 | I-VI |
| D | NOT USED | 2 | NOT USED | I, II, IV, V |
| E | NOT USED | 2 | 3 | I-V |
| F | NOT USED | NOT USED | 3 | I-III |

Sequence A only utilizes aerosol printhead 80 to print the entire conductive trace pattern 6. This sequence A can be used to print all six domain types. This sequence may be effective if the conductive trace pattern 6 only includes a small total length of fine traces 15. However, if the conductive trace pattern has a large number of wide traces and/or a large and high trace density, sequence A can have an unacceptably long cycle time.

Sequence B includes the use of the aerosol printhead 80 followed by the piezo array printhead 140. Like sequence A, this sequence can also print all six domain types.

Sequence C includes the use of all three printheads in sequence including aerosol printhead 80 followed by piezo array printhead 140, and finally the fluid dispense printhead 100. Sequence C can print all fix domain types.

Sequence D only utilizes piezo array printhead 140 to print the entire conductive trace pattern 6. Sequence D can be utilized to print domain types I, II, IV, and V. This is typically the most efficient sequence for printing a conductive trace pattern 6 that is planar to within a predetermined threshold such as 0.5 mm. However, sequence D will generally not be effective if the surface to be printed has recessed or compound bend geometries meeting the criteria of domains III or VI.

Sequence E utilizes the piezo array printhead 140 followed by the fluid dispense printhead 100. Sequence E is effective for printing all domain types except for domain type VI, since type VI requires fine traces 14 that are on a surface geometry not addressable by piezo array printhead 140.

Sequence F only utilizes fluid dispense printhead 100. Sequence F can be utilized if the entire conductive trace pattern is formed from wide traces 15.

Referring again to FIG. 16, an exemplary embodiment of a method for manufacturing a portion of an article of manufacture 2 is depicted in flow chart form. Some or all of the steps of FIG. 16 can be controlled by a computer by executing instructions stored on a non-volatile memory. Alternatively, some of the manufacturing steps depicted by FIG. 16 can be performed by a user utilizing portions of fabrication system 30 (FIG. 3).

According to step 150, one or more file(s) 33 defining a conductive trace pattern 6 are received by file processor 32. According to step 152, the file processor 32 analyzes the file(s) and then divides the conductive trace pattern up, such as e.g., into domains such as the domains I-VI discussed with respect to Table 2. The domains can be, in one implementation, separated by boundaries along surface 8, or they can be separated according to portions of the conductive trace pattern 6. The domains collectively define the entire conductive trace pattern 6. In an exemplary embodiment, the domains are divided up according to trace width, surface geometry, metallic coverage density (otherwise referred to as trace density), and trace thickness.

According to step 154, candidate print sequences are identified. Candidate print sequences are determined based upon the types of domains identified (which may preclude certain sequences, as is apparent from Table 3).

According to step 156, one or more metrics such as process cycle time are evaluated for the alternative print sequences. According to step 158, an optimal print sequence is selected based upon the metric evaluated. Step 158 includes in one embodiment a mapping of each of the identified domains to one of printing systems 34 (aerosol), 35 (piezo array), or 36 (fluid nozzle). It will be appreciated, however, that the present disclosure further contemplates the instance where a given domain is mapped to two or more of the printing systems 34, such as where a domain may be constructed as a "composite"; e.g., using these two or more systems due to e.g., different features or requirements occurring within that domain.

There are boundaries between various domains into which the conductive trace pattern 6 is divided (see FIG. 17). According to step 160, traces along these boundaries are extended to provide an overlap when the boundary defines the use of two different printing systems, and allow for printhead-to-printhead misalignment tolerances. In an exemplary embodiment, the extension is as follows: (1) along a boundary between the aerosol printing system 34 domain and the piezo printing system 35 domain, the aerosol-printed traces are extended to provide an overlap; (2) along a boundary between an aerosol printing system 34 domain and a fluid nozzle printing system 36 domain, the aerosol printing system traces are extended to provide an overlap; and (3) along a boundary between a piezo printing system 35 domain and a fluid nozzle printing system domain 36, the fluid nozzle printing system 36 traces are extended to provide an overlap. As is apparent, other combinations of printing systems can be use to define an overlap. Moreover, such interfaces/overlaps may actually occur within a given domain, such as where two or more printing approaches are used within that domain as referenced above.

According to step 162, portions of the input file 23 defined by the domains and including any trace extensions are converted into print files each specific to the printer mapped to the domain. According to step, 164 any domains mapped to aerosol printing system 34 are printed. According to step 166, any domains mapped to piezo array printing system 35 are printed. According to step 168, any domains mapped to fluid nozzle printing system 36 are printed. According to step 170, the article 2 is baked in oven 38 to cure and/or dry the conductive trace pattern 6.

Example 1

FIG. 17 depicts an example of a conductive trace pattern 6 to be printed according to the method described with respect to FIG. 16. This conductive trace pattern contains all of the different domain types. Because all six domain types are present, it will be assumed that printing sequence C of Table 3 will be selected (according to step 158 of FIG. 16). The conductive trace pattern as illustrated is planar, except for the illustrated domain types III and IV which are presumed to be in deep recesses. Thus the selected optimal print sequence will include printing domains I, II, IV, and V with piezo array printhead 140, because this can be performed very rapidly and accurately with the piezo array. Domain III will be printed with fluid dispense printheads 100, because the traces are in a deep recess (precluding the piezo printhead) and the traces are too wide to be efficiently printed by aerosol printhead 80. Finally, only the aerosol printhead 80 can print the domain type VI.

Once the optimal sequence is selected the traces need to be extended between domain boundaries (step 160 of FIG. 16) for which different printhead are being used. Consider the boundary between domain IV and VI. The traces in domain IV are extended into domain IV to provide a trace overlap that assures good domain-to-domain electrical continuity, even factoring in printhead to printhead alignment tolerances. In this case, domain VI traces are extended because the aerosol printhead 80 can print planar traces much more capably than the piezo array printhead 140 can print into a recess.

The traces in domain III are also extended into domain II. One primary reason is that fluid dispense printhead 100 can better print on a planar surface than the piezo array printhead 140 can print into a recess. Also, the fluid dispense pattern formed by piezo array printhead 100 is thicker. The trace extension assures proper electrical coupling between traces printed by the two printing systems, despite printhead-to-printhead alignment tolerances.

There are no traces extensions across boundaries between illustrated domains I and IV, I and II, or II and V, because they are all printed by the same piezo array printhead 140. This is one advantage of minimizing the number of printing systems to print the different domains, and can be part of the optimization performed (steps 156 and 158).

Once the traces have been extended, the print files for the printing systems are determined. The resultant print sequence is as follows: (1) the aerosol printhead 80 prints domain VI including traces extending into domain IV; (2) the piezo array printhead 140 prints domains I, II, IV, and V; and (3) the fluid dispense printhead 100 prints domain III extending the traces into domain II. The article of manufacture is then cured (e.g., baked, exposed to electromagnetic or other radiation, or other means).

Example 2

Consider the conductive trace pattern 6 illustrated in FIGS. 1A, 1B, and 1C. This design includes domain types I (note the very wide traces on flat and single axis curved surfaces), II (note individual wide traces), III (note wide traces in recess), and VI (note narrow traces in a recess). The most efficient sequence would, in one implementation, be the following: (1) aerosol printhead 80 to print the fine traces of the recess portion 12 which is domain type VI, (2) piezo array printhead 140 to print all of the traces on the flat and single axis curved surfaces which includes domains I and II, and then (3) fluid dispense printhead 100 to print the wider traces within the recess which is domain III. In this example, it is probably most optimal to use all three printing systems 34-36. It will also be appreciated that the present disclosure contemplates that in certain cases, it may even be feasible to conduct one or more of the foregoing steps in parallel, such as where the domains utilizing different printing techniques are spatially disparate, and the two or more techniques can be implemented within that "separated" environment. This may, in one variant, be accomplished with a multi-purpose fixture.

FIG. 18 depicts another embodiment of a method of printing the conductive trace pattern, using an embodiment of the fabrication system 20 that implements two printing systems 24 and 26. Printing system 24 includes an aerosol printhead 80 that operates in a vector dispense printing mode. Printing system 26 (in this embodiment) utilizes a high resolution piezo array printhead 140 that operates in a raster area fill printing mode.

One or both of printing systems 24 and 26 may be used for a given trace pattern 6 depending upon the geometry of surface 8. Table 4 below describes the trace pattern in terms of domains that may be useful in determining a capable and optimum set of print operations.

TABLE 4

| DOMAIN NUMBER | SURFACE GEOMETRY | METAL DENSITY | CAPABLE PRINTING SYSTEMS |
|---|---|---|---|
| I | PROUD, SA CURVE | HIGH | 24, 26 |
| II | PROUD, SA CURVE | LOW | 24, 26 |
| III | RECESSED OR DA CURVE | HIGH OR LOW | 24 |

Domain type I has a surface 8 that is similar to that described with respect to domain type I of Table 2. The surface is not recessed or crowned (having a high point rising above surrounding points in along two axes) beyond a certain height difference threshold, such as e.g., 0.5 millimeters. For domain type I, the metal trace density is above a certain metal trace density threshold that tends to render printing system 24 inefficient.

Domain type II is similar to domain type I except that the metal trace density is below the metal trace density threshold. While both printing systems 24 and 26 can print domain type II, it may be more efficient to print domain type II with printing system 24.

Domain type III has a surface 8 that is either recessed or crowned along two directions beyond a height different threshold such as 0.5 millimeters. This surface may require the use of printing system 24, since use of printing system 26 may result in a degradation in the quality of the metal traces being printed.

Table 5 lists a number of possible printing sequences that can be utilized to form the conductive trace pattern 6. The numbers 1 and 2 indicate the order in which a given printing system is utilized.

TABLE 5

| SEQUENCE | AEROSOL BEAM | PIEZO ARRAY | POSSIBLE DOMAINS |
|---|---|---|---|
| A | 1 | NOT USED | I, II, III |
| B | 1 | 2 | I, II, III |
| C | NOT USED | 2 | I, II |

Sequence A only utilizes aerosol printhead 80 to print the entire conductive trace pattern 6. This sequence may be necessary for example if all traces to be printed are in a recess, or on a crowned surface for which the piezo array would suffer degraded printed quality. This sequence may also be efficient for printing a small number of fine traces.

Sequence B includes the use of aerosol printhead 80 followed by piezo array printhead 140. This sequence can print all domain types effectively.

Sequence C only utilizes the piezo array printhead 140. This can be effective for example if the surface 8 is close to flat or has only one significant radius of curvature that is convex.

Referring to FIG. 18, an exemplary embodiment of a method for manufacturing a portion of an article of manufacture 2 is depicted in flow chart form. Some or all of the steps of FIG. 18 can be controlled by a computer by executing instructions stored on a non-volatile memory. Alternatively, some of the manufacturing steps depicted by FIG. 17 can be performed by a user utilizing portions of fabrication system 20 (FIG. 2).

According to step 172, one or more file(s) 23 defining a conductive trace pattern 6 are received by file processor 22. According to step 174, the file processor 22 analyzes the file(s) and then divides the conductive trace pattern up into domains such as domains I-III discussed with respect to Table 4. The domains can be e.g., separated by boundaries along surface 8, or they can be separated according to portions of the conductive trace pattern 6, or yet according to other schemes. The domains collectively define the entire conductive trace pattern 6. In an exemplary embodiment, the domains are divided up according to surface geometry and metallic trace coverage density.

According to step 176, candidate print sequences are identified based on the domains identified in step 174. According to step 178, process metrics such as cycle time are evaluated for the alternative process sequences. According to step 180, an optimal sequence is selected. Step 180 includes mapping each domain to a printing system 24 or 26.

There may be boundaries between domains that are printed with different printing systems across each boundary. Along such boundaries, the traces are extended so that they overlap according to step 182. They may be extended for both printing systems or just extended for one of the printing systems. According to step 184 portions of the input file 23 including any trace extensions from step 182 are transformed into print files each specific to the printer mapped to the domain.

According to steps 186 and 188, the selected print sequence is executed. According to step 190, the article of manufacture is cured (e.g., baked) to remove solvent vehicles from conductive ink.

Example

Consider the conductive trace pattern 6 illustrated in FIGS. 1A, 1B, and 1C. This trace pattern includes domains I and III. Examples of domain I include the very wide traces such as those illustrated in FIG. 1A which have a very high metallization density. An example of domain type III is the recessed portion 12 of surface 8. Print sequence B would be most effective for printing the trace pattern 6. The aerosol printhead 80 would print the traces in recessed portion 12 of surface 8 and piezo array printhead 140 can be used to print the remaining traces.

The methods described for FIGS. 16 and 18 have assumed that the piezo array printhead 140 employed is capable of printing fine conductive traces 14 in a raster-type printing mode. In some situations, it may be desirable to utilize a piezo array printhead 140 having a lower resolution structure. For example, suppose that piezo array printhead 140 can print a dot array on a substrate 8 having a resolution of 250 dots per inch. That would be a center-to-center pattern that is about 100 microns. Using such a piezo array printhead 140 to define 100 micron wide traces in a raster print mode would be less than effective. To define narrow traces, the piezo array would need to be operated in a "vector" mode whereby nozzles 148 would be used to "trace out" the traces in a manner similar to the way printhead 80 or 100 is used.

FIG. 19 depicts domain numbers (types) to illustrate printing utilizing an aerosol printhead 80 and a lower resolution piezo array printhead 140. For this example, the printing system 24 utilizes aerosol printhead 80, and the printing system 26 utilizes piezo array printhead 140. Table 6 below lists the relevant domain types.

TABLE 6

| DOMAIN NUMBER | FEATURE TYPE | SURFACE GEOMETRY | PRINTHEAD USED |
|---|---|---|---|
| I | LARGE INSIDE | PROUD, SA CURVE | 140 RASTER |
| II | LARGE PERIMETER | PROUD, SA CURVE | 140 VECTOR OR 80 |
| III | NARROW | PROUD, SA CURVE | 140 VECTOR OR 80 |
| IV | LARGE OR NARROW | RECESSED OR DA CURVE | 80 |

Domain type I is an inner portion of a wide feature, such as a wide trace. This is most efficiently printed using piezo array printhead 140 in raster print mode.

Domain type II is a perimeter portion of a wide feature. This can be printed using either piezo array printhead 140 in vector mode, or using aerosol printhead 80.

Domain type III is a narrow trace array. This can be printed using either piezo array printhead 140 in vector mode, or using aerosol printhead 80.

Domain type IV is an array of traces inside of a recess (or crowned feature) that precludes the use of piezo array printhead 140. For such an area, the aerosol printhead 80 is optimal.

A print sequence for forming the conductive trace pattern 6 of FIG. 19 can include the following: (1) domains III and IV are both printed using aerosol printhead 80 in vector mode (extending the traces into domain II); (2) domain I is printed using piezo array printhead 140 in raster mode; and. (3) domain II is printed using piezo array printhead 140 in vector mode whereby nozzles "trace out" the boundary.

An alternative embodiment for forming domains I and II of FIG. 19 are the following: either aerosol printhead 80 or 140 is used to form outer perimeter domain II. The height of domain II is sufficient to act as a fluid dam. Piezo array printhead 140 or a spray nozzle is utilized to "fill up" interior domain I. Domain II acts as a dam to prevent overflow of conductive fluid beyond the confines of domain II.

FIG. 20 depicts another embodiment of a method of printing the conductive trace pattern 6, using in this case another embodiment of the fabrication system 20 which implements two printing systems 24 and 26. Printing system 24 includes a piezo array printhead 140, and can operate in both vector and raster print modes and ejects drops of desired size (e.g., having a dry volume between 1 and 100 picoliters). An exemplary piezo array printhead 140 has been described with respect to FIGS. 15A and 15B. The printing system 26 utilizes a fluid dispense printhead 100 that dispenses very large drops having a dry volume between 500 and 10,000 picoliters. The fluid dispense printhead 100 has been described with respect to FIGS. 9, 10, 10A, 10B, 11A, 11B, and 12.

Table 7 (below) describes a trace pattern 6 in terms of exemplary types of domains. This design has particular requirements for a printing system. Exemplary domain I is flat or nearly flat to within 0.5 mm. The metal in domain I is a solid area fill of metal. The selected printing system for domain I will include piezo array printhead 140 operating in a raster (area fill) print mode.

Exemplary domain II is flat or nearly flat to within 0.5 mm like domain I. However, domain II has an arrangement of very fine traces. The selected printing system for domain II will include piezo array printhead 140 operating in vector mode to enable the definition of very fine traces.

Exemplary domain III is highly curved and not amenable to piezo array printhead 140. The traces are mostly antenna traces and, as such, are relatively wide and thick to provide an appropriate skin depth multiple. The selected printing system for domain III is fluid dispense printhead 100 operating in vector mode.

TABLE 7

| DOMAIN NUMBER | SURFACE GEOMETRY | METAL PATTERN | PREFERABLE PRINTING SYSTEM AND MODE |
|---|---|---|---|
| I | FLAT OR NEARLY FLAT | SOLID AREA FILL | 24 RASTER |
| II | FLAT OR NEARLY FLAT | FINE TRACES | 24 VECTOR |
| III | RECESSED OR VERY CURVED | WIDE ANTENNA TRACES | 26 VECTOR |

Referring again to FIG. 20, an exemplary embodiment of forming a conductive trace pattern 6 having the domains of Table 7 onto an exemplary article of manufacture 2 is now described. According to step 200 of the method of FIG. 2, the file processor 22 receives one or more files defining a geometry of surface 4 and trace pattern 6. According to step 202, the file processor 22 analyzes the received file(s) and divides the trace pattern into non-overlapping domains I, II, and III of Table 7 above. Each domain may not be contiguous—for example, there may be more than one separate area fill feature and thus domain I may have more than one unconnected area.

According to step 204, an analysis and print sequence optimization may be performed. For illustrative purposes, a particular printing sequence is described.

According to step 206, traces are extended to provide overlap. In one embodiment, the wider traces of domain III are extended slightly to overlap traces of adjacent domains. The magnitude of the extension is equal at least to a misalignment tolerance between printing systems.

According to step 208, defined traces for each domain are converted into appropriate data structures (e.g., print files). According to step 208, the traces of domain I are converted in to raster print files for the printing system 24 utilizing piezo array printhead 140. Also according to step 208, the traces of domain type II are converted into vector print files for the printing system 24 utilizing piezo array printhead 140. Yet also according to step 208, the traces of domain type III are converted into vector print files for the printing system 26 utilizing fluid dispense printhead 100. Traces for domain type III have been extended such that the print files for the printing system 26 will extending into and overlap print files defined for printing system 24.

According to step 210, the printing system 24 executes the print file defined from domain I, and thereby forms metallic area fill patterns by operating piezo array printhead 140 in raster area fill mode. According to step 212 the printing system 24 executes the print file from domain II and thereby forms fine traces by operating piezo array printhead 140 in vector mode.

If there is a delay between using the first printing system 24 and second printing system 26, the article of manufacture 2 can be baked according to step 214. According to step 216, the printing system 26 executes the print file defined from domain III and therefore forms wide antenna traces by operating fluid dispense head 100 in vector mode. As a note, the wide antenna traces overlap metallization of domains I and/or II. According to step 218, the article of manufacture is baked.

Figure 21A:
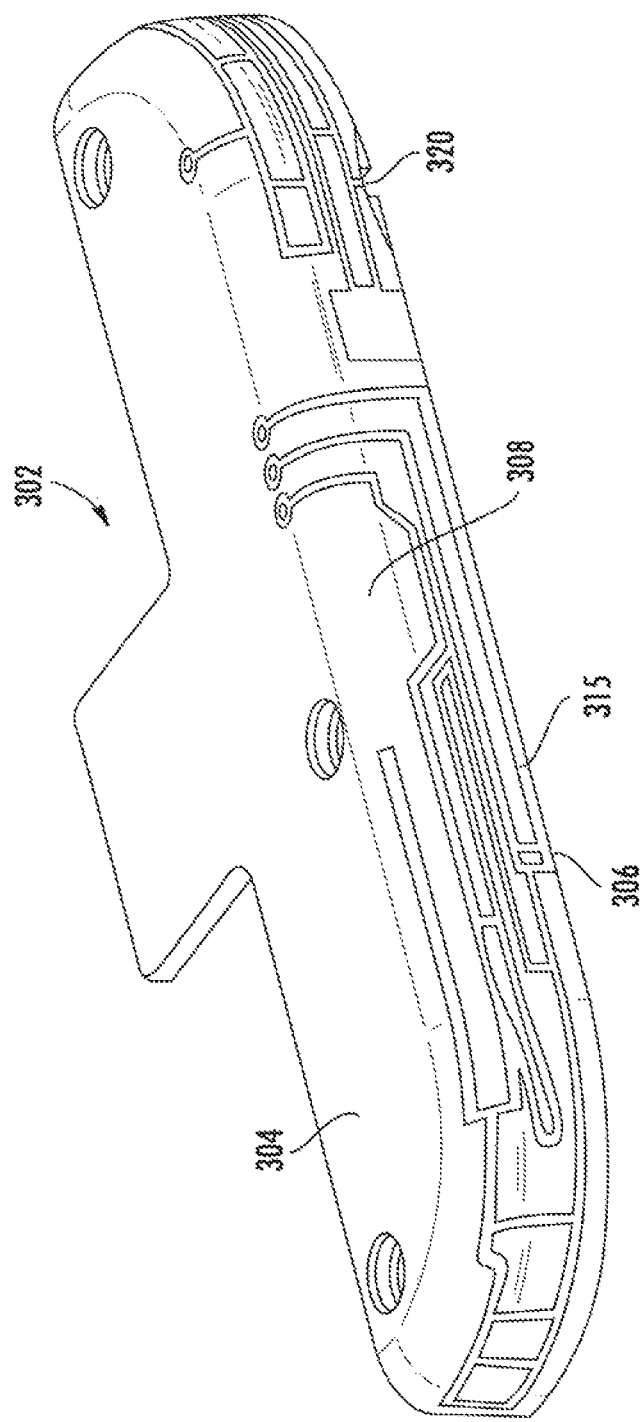
FIG. 21A is a top view of an exemplary embodiment of an article of manufacture comprising a conductive trace pattern.
Figure 21B:
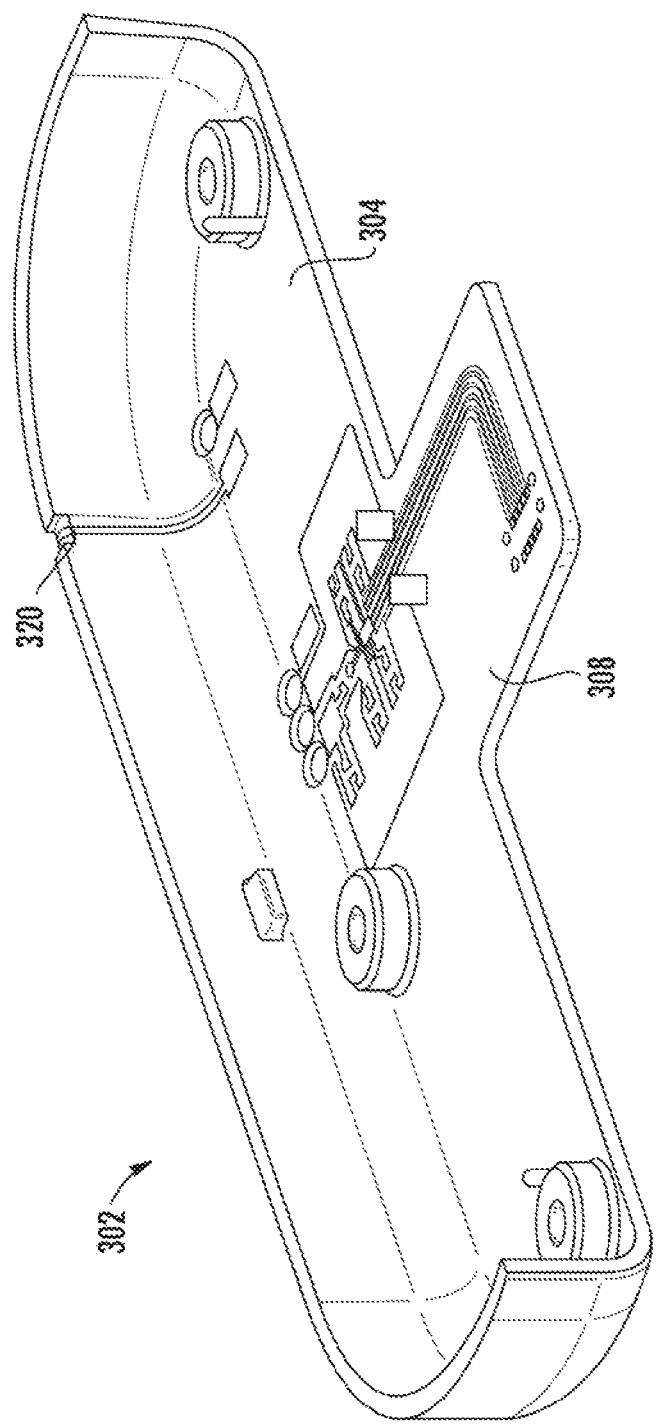
FIG. 21B is a bottom view of the exemplary embodiment of an article of manufacture with a conductive trace pattern of FIG. 21A.

FIGS. 21A and 21B depict outside and inside views, respectively, of an exemplary embodiment of article of manufacture 302. Article of manufacture 302 includes a partly curved base substrate 304 with a conductive trace pattern 306 formed on substrate surface 308. The conductive trace pattern 306 can be formed, e.g., according to the method described with respect to FIG. 20.

Figure 21C:
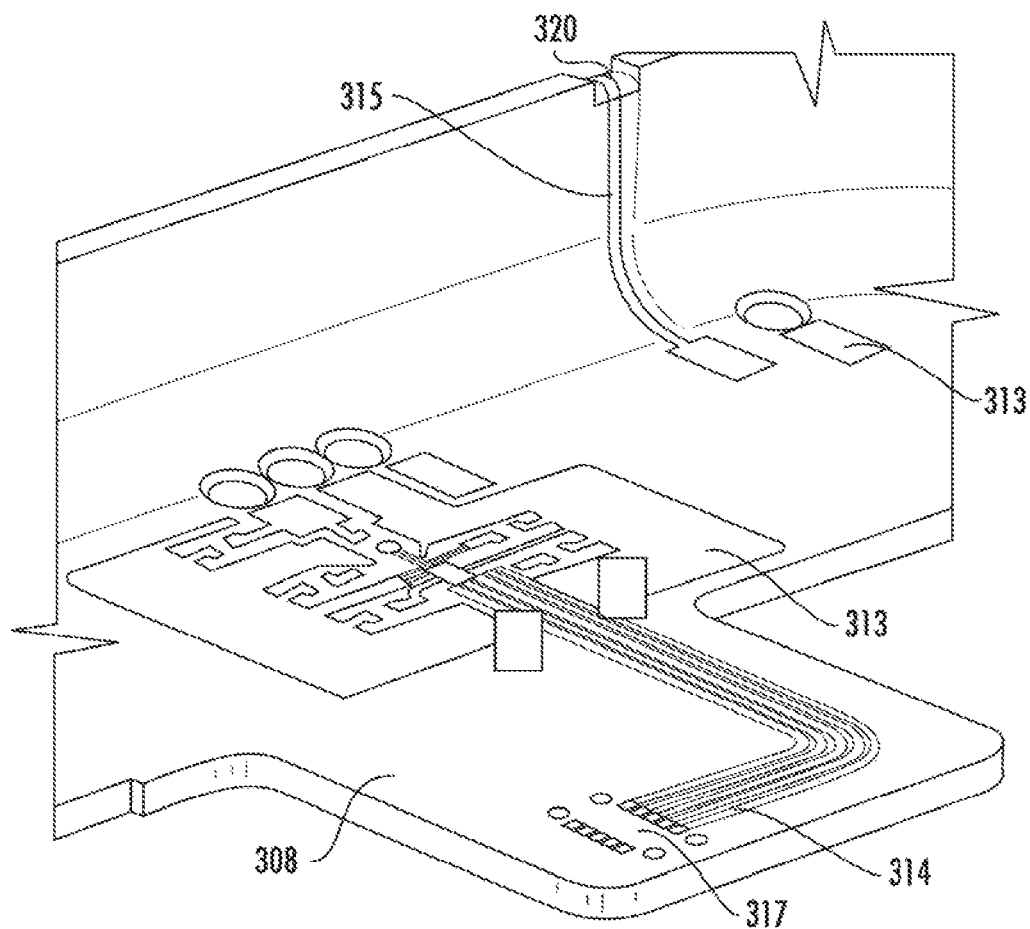
FIG. 21C is a detailed view taken from FIG. 21B.

FIG. 21C is a more detailed view taken from FIG. 21B, depicting a portion of the substrate surface 308 with a portion of the conductive trace pattern 306. Part of the substrate surface is quite flat and includes domains I and II according to Table 7. Domain I of the conductive trace pattern 306 includes area fill patterns 313. The area fill patterns 313 are printed using the piezo array printhead 140 operating in a raster area fill print mode.

Domain II of the conductive trace pattern 306 includes fine traces 314. The fine traces 314 are printed using the piezo array printhead 140 operating in a vector print mode mode. The fine traces 314 define electrical connections to a chip mounting location 317.

Domain III of the conductive trace pattern include wide traces 315. The wide traces 315 are printed using fluid dispense printhead 100 operating in a vector print mode. FIG. 21C depicts an exemplary configuration of a wide trace 315 coupled passing through a notch 320 formed into the substrate 304. The notch 320 couples opposing surfaces 308 of the substrate 304 including a relatively convex outer side of the surface 308 depicted in FIG. 21A and a relatively concave inner side of the surface 308 depicted in FIGS. 21B and 21C.

FIG. 21D depicts another example of a conductive trace pattern 306 that can be formed using a piezo array printhead 140 operating in raster area fill and vector print modes. Depicted are fine traces 314 coupling to a sensor chip mounting location 317. Also depicted are conductive pads 322 defining locations 324 for e.g., capacitors.

FIGS. 22A and 22B depict an embodiment of an inkjet printing system 500 that may be used to print relatively flat portions of conductive trace pattern 6 or 306. FIG. 22A is a top elevation view, and FIG. 22B is a side view of printing system 500. In an exemplary embodiment, the printing system 500 can be utilized as the first printing system 24 as depicted in FIG. 2 prior to the use of a fluid dispensing system 26 which utilizes the fluid dispense printhead 100.

The printing system 500 includes a transport belt 502 that imparts motion to the articles 504 as depicted from left to right in FIGS. 22A and 22B. The article 504 may be similar to article of manufacture 2 depicted in FIGS. 1A-C, or it may include other features or components such as e.g., a pallet for supporting an article of manufacture 2. One purpose of a pallet would be to support the article of manufacture so that a printed surface would have a proper orientation and height relative to printing system 500. A pallet can also provide a measure of stability in transport, as well as other benefits.

The exemplary printing system 500 includes one or more loading zones 506 upon which articles 504 are loaded. Once loaded, the articles 504 are transported via the belt 502. The printing system 500 includes one or more cameras and/or sensors 508 which is/are utilized by the printing system 500 to align the articles 504 relative to other portions of printing system 500, including the printheads 510. In one embodiment, the printheads 510 are piezo printheads similar to piezo array printhead 140 described with respect to FIGS. 15A and 15B, although other configurations may be used.

The printing system 500 optionally includes an IR lamp 512 or other curing source/agent/process to partially cure or dry ink ejected from a printhead 510 before an article passes (shown as left to right) to a second printhead 510. The printing system 500 also may includes a cure lamp 514 for more completely drying ink ejected from printheads 510 after printing is complete. The printing system includes a controller 516 that is coupled to the cameras/sensors 508, printheads 510, and optionally a device (not shown) that provides information concerning the speed of belt 502 or other conveyance mechanism.

An exemplary embodiment of a printing operation for a given article 504 (which may include a pallet or other such component) includes the following: (1) The article 504 is loaded onto the belt 502 at the loading zone 506. The belt 502 then begins transporting article along a direction belt motion direction. (2) The article 504 passes under the camera 508. The camera 508 captures an image of the article 504 that is very rapidly timestamped by the controller 514. The controller 514 utilizes the image, timestamp, and a sensed or input belt speed (of the belt 502) to synchronize the printheads 510. (3) The article 504 passes under the printhead 510 that then prints a conductive trace pattern onto the article 504. FIGS. 1A-C depict one exemplary conductive trace pattern 6 and FIGS. 21A-D depict another exemplary conductive trace pattern 306 part of which can be printed by printheads 510. (4) Optionally, the article 504 passes under an IR lamp 512 that partially dries the printed conductive trace pattern. (5) Optionally, the article 504 passes under a printhead 510 a second time to print another portion of a conductive trace pattern. One reason for the use of multiple printhead passes is to build up a sufficient conductive trace thickness. (6) The article 504 passes under an IR lamp 514 that provides a partial or complete cure or drying of the conductive trace pattern.

While the printing system 500 has been described with respect to a belt 502, other options are possible. For example, an alternative printing system may utilize a chain of pallets into which individual articles 504 are loaded. This would have the advantage of enabling a more precise location of articles 504 but would tend to be a more costly system. Also, pick-and-place and/or other types of conveyances may be used consistent with the disclosure.

In some embodiments of the disclosure, it may be desirable to form non-conductive features such as semiconductors and/or insulators. The semiconductors and/or insulators would form a portion of article 2, and can be electrically coupled to conductive trace pattern 6. Any or all of the systems, printheads, or methods discussed above can be applicable to printing such semiconductors and/or insulators. The print fluids utilized can include without limitations any or all of conductors, semiconductors, dielectrics, and/or insulators whether of an organic and/or inorganic nature. The print fluids can take the form of liquid solutions, dispersion, and/or suspension. The print fluids can include other materials such as conductive polymers, conductive oxides (e.g., indium tin oxide), carbon nanotubes, or graphene, to name a few examples.

Figure 23B:
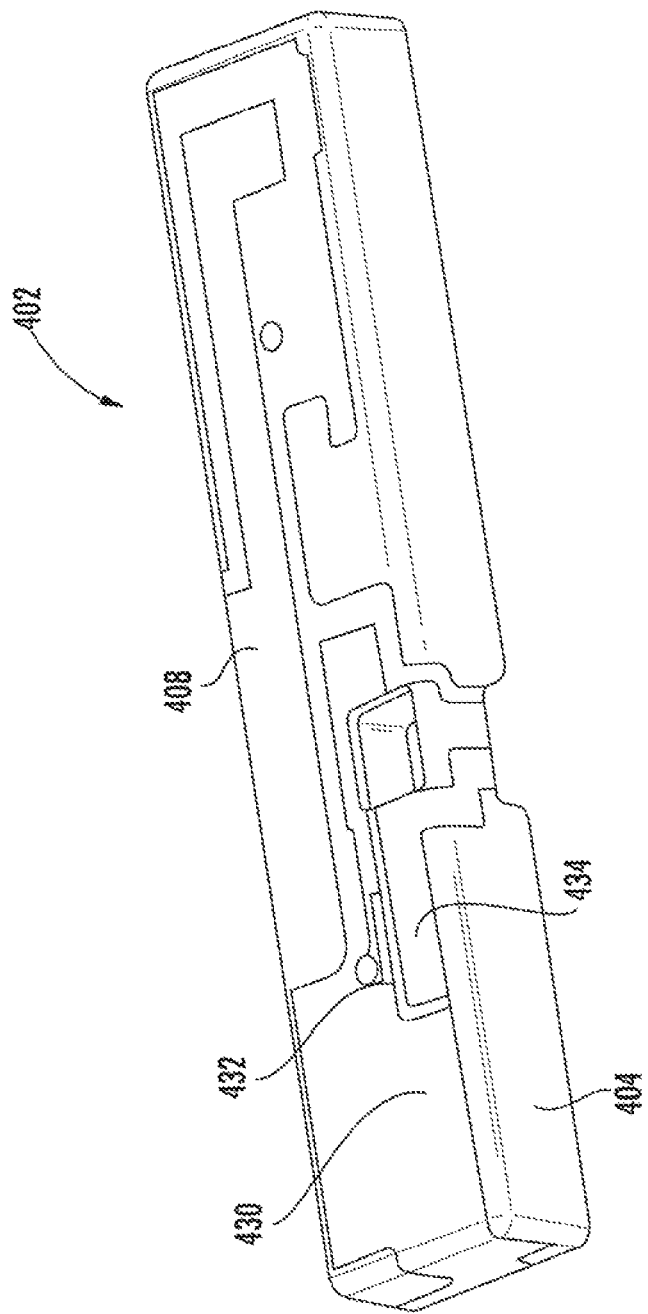
FIG. 23B is a top view of the article of manufacture of FIG. 23A.

FIGS. 23A and 23B depict the an exemplary configuration of an article of manufacture 402, and the formation of conductors and non-conductive insulators on the substrate 404. FIG. 23A is an "exploded view" to depict a capacitive arrangement of a lower conductive layer 430, insulating layer 432, and upper conductive layer 434 formed upon substrate surface 408. These layers 430-434 are formed using one or more of the aforementioned printing systems such as with an aerosol printhead 80, a fluid dispense printhead 100, and/or a piezo array printhead 140.

FIG. 23B depicts the layers 430, 432, and 434 in a printed state. A process sequence to form these layers would, in an exemplary implementation, include (1) printing the lower conductive layer 430, (2) baking the lower conductive layer 430, (3) printing the insulating layer 432 over the lower conductive layer 430, (4) baking the insulating layer 432, (5) printing the upper conductive layer 434 over the insulating layer 432, and (6) baking the upper conductive layer 434. This process sequence can also be part of a larger process sequence that may include process steps described with respect to any of FIG. 4, 13, 16, 18, or 20 depending on factors such as the surface geometry and/or the trace geometrical requirements.

Printing systems that can be used as one of the printing systems described with respect to FIGS. 2 and 3 can in some embodiments include any or all of a wide variety of printing systems, including digital and/or analog technologies. Digital technologies include without limitation technologies that may be referred to as thermal inkjet, piezo inkjet, micro piezo inkjet, and bubble jet. Analog technologies include without limitation technologies that may be referred to as screen printing, rotogravure printing, flexographic printing, engraving printing, pad printing, rotary printing, rotary screen printing, stencil printing, and others. Thus, possible printing systems that can be utilized with fabrication system 20 or 30 is not considered to be limiting per the above description, as will be recognized by those of ordinary skill given the present disclosure.

The present disclosure also provides an example of mass customization. Mass customization is a new and expanding frontier in manufacturing industries. Shorter runs driven by mass customization, and resultant smaller lot sizes, for e.g., traditional wire-wound inductive devices (such as e.g., inductive reactors/choke coils, transformers, etc.) heretofore has required extensive setup and overhead costs (e.g. adjusting flyers, shields, guiding elements etc.). It is arguably not possible to face tomorrow's market requirements (such as small lot sizes or high product flexibility) with current manufacturing approaches. The new approaches described herein for trace deposition, such as for an improved inductive device, allows for accurate wire placement, wire width, and wire gaps by using, for example, generalized printing techniques. These can be digitally constructed with each layout being unique, down to even a single manufacturing unit. For example, the use of flexible computer-aided printing systems in manufacturing can be used to produce custom layouts item-by-item. These systems have advantages when combined with low costs from mass-produced planar windings with the flexibility of individual customization. Consequently, the number of manufacturing steps can be reduced, and flexibility around a given job design specification can be realized. A benefit of this innovation is a tremendous increase in variety and customization without a corresponding increase in costs that would be incurred under available prior art approaches.

The present disclosure advantageously may be used to replace various processes that were heretofore inflexible and capital intensive, such as laser direct sintering (LDS) for the purposes of fabricating antennas or other components. In replacing LDS, the present disclosure has a number of advantages, including without limitation (1) compression of supply (consolidation of steps), (2) reduced cycle time for development and production (consolidation to the point of production), (3) flexible manufacturing ("on the fly" design changes), (4) faster response to manufacturing demand changes, (5) less environmental impact relative to electroplating, (6) less inventory requirements (since LDS requires building up an inventory at one site before shipment to another site), and/or (7) improved working capital.

While being described relative to antennas, the present disclosure applies to other electrical components as well such as a sensor coil. More generally as used herein, the terms "electrical component" and "electronic component" are used interchangeably and can refer to components adapted to provide some electrical and/or signal conditioning function, including without limitation inductive reactors ("choke coils"), transformers, filters, transistors, gapped core toroids, inductors (coupled or otherwise), capacitors, resistors, operational amplifiers, and diodes, whether discrete components or integrated circuits, whether alone or in combination.

It will be appreciated that while certain steps and aspects of the various methods and apparatus described herein may be performed by a human being, the disclosed aspects and individual methods and apparatus are generally computerized/computer-implemented. Computerized apparatus and methods are necessary to fully implement these aspects for any number of reasons including, without limitation, commercial viability, practicality, and even feasibility (i.e., certain steps/processes simply cannot be performed by a human being in any viable fashion).

It will be recognized that while certain aspects of the disclosure are described in terms of a specific sequence of steps of a method, these descriptions are only illustrative of the broader methods of the disclosure, and may be modified as required by the particular application. Certain steps may be rendered unnecessary or optional under certain circumstances. Additionally, certain steps or functionality may be added to the disclosed embodiments, or the order of performance of two or more steps permuted. All such variations are considered to be encompassed within the disclosure disclosed and claimed herein.

While the above detailed description has shown, described, and pointed out novel features of the disclosure as applied to various embodiments, it will be understood that various omissions, substitutions, and changes in the form and details of the device or process illustrated may be made by those skilled in the art without departing from the disclosure. This description is in no way meant to be limiting, but rather should be taken as illustrative of the general principles of the disclosure. The scope of the disclosure should be determined with reference to the claims. The specific embodiments and applications thereof described above are for illustrative purposes only and do not preclude modifications and variations encompassed by the scope of the following claims.

What is claimed:

1. A method of manufacturing an article of manufacture with a conductive trace pattern thereon, the method comprising:

receiving information defining the conductive trace pattern;

analyzing the information to define at least first and second domains, the first and second domains comprising respective first and second portions of the conductive trace pattern, the first and the second domains differing based at least upon a geometric factor associated with the conductive trace pattern;

generating a first output relating at least in part to the first domain, and a second output relating at least in part to the second domain;

sending the first output to a first printing apparatus for use thereby; and sending the second output to a second printing apparatus for use thereby, the second printing apparatus having different printing capabilities from the first printing apparatus.

2. The method of claim 1, further comprising:

printing a first portion of the conductive trace pattern using the first printing apparatus; and printing a second portion of the conductive trace pattern using the second printing apparatus;

wherein the first and second portions overlap in at least one location so as to provide electrical continuity therebetween.

3. The method of claim 1, further comprising:

printing a first portion of the conductive trace pattern using the first printing apparatus; and printing a second portion of the conductive trace pattern using the second printing apparatus;

wherein the first portion is within the first domain, and the second portion is within the second domain.

4. The method of claim 1, further comprising:

printing a first portion of the conductive trace pattern using the first printing apparatus; and printing a second portion of the conductive trace pattern using the second printing apparatus;

wherein the first and second domains are defined at least in part by respective first and second regions which overlap in at least one location.

5. An article of manufacture with a conductive trace pattern thereon, the conductive trace pattern formed according to the method comprising:

receiving at least one data structure defining the conductive trace pattern;

analyzing at least portions of the at least one data structure to define at least two domains comprising a first domain and a second domain, the first and second domains being different based at least upon a geometry-related threshold, the at least two domains defining the entire conductive trace pattern and having a boundary therebetween;

generating a first print file based at least upon the first domain, and a second print file based at least upon the second domain, one or more traces described in the first print file extending to overlap one or more traces described in the second print file by a distance at least exceeding a misalignment tolerance between two printing systems;

sending the first print file to a first of the two printing systems; and sending the second print file to a second of the two printing systems;

wherein the first of the two printing systems is configured to deposit a conductive fluid having a different size attribute from that of the second one of the two printing systems.

6. The article of manufacture of claim 5, wherein the method further comprises:

printing a first portion of the conductive trace pattern using the first printing system; and printing a second portion of the conductive trace pattern using the second printing system.

7. The article of manufacture of claim 6, wherein the first portion comprises a first subset of a plurality of traces defined in the conductive trace pattern, and the second portion comprises a second subset of the plurality of traces.

8. The article of manufacture of claim 7, wherein the first subset includes traces having a trace width less than a preset threshold, and all traces of the second subset of the conductive trace pattern have trace widths that meet or exceed the preset threshold.

9. The article of manufacture of claim 7, wherein the first printing system includes a printhead that generates a stream of aerosol particles to define the first subset of conductive traces.

10. The article of manufacture of claim 9, wherein the second printing system utilizes a nozzle that dispenses a viscous conductive fluid to define the second subset of conductive traces.

11. The article of manufacture of claim 7, wherein printing the first subset is performed before printing the second subset.

12. The article of manufacture of claim 6, wherein the first printing system forms traces based primarily upon silver nanoparticles that have a major dimension of less than 100 nanometers.

13. The article of manufacture of claim 12, wherein the second printing system forms traces based primarily upon silver flakes that have a major dimension between 1000 nanometers and 20 microns.

14. The article of manufacture of claim 6, wherein the second printing system forms traces based primarily upon silver flakes that have a major dimension between 1000 nanometers and 20 microns.

15. The method of claim 2, further comprising drying the first and the second portions of the conductive trace pattern using an oven.

16. The method of claim 15, further comprising drying the first portion of the conductive trace pattern separately from the second portion of the conductive trace pattern, the drying of the first portion of the conductive trace pattern occurring before the printing of the second portion of the conductive trace pattern.

17. The method of claim 2, further comprising printing a third portion of the conductive trace pattern using a third printing apparatus.

18. The method of claim 2, wherein:

the first portion of the conductive trace pattern comprises at least a first subset of a plurality of traces defined in the conductive trace pattern;

the second portion of the conductive trace pattern comprises at least a second subset of a plurality of traces defined in the conductive trace pattern;

the first subset of the plurality of traces comprises a first width; and the second subset of the plurality of traces comprises a second width different from the first width.

19. The method of claim 18, wherein:

the printing of the first portion of the conductive trace pattern comprises printing using a first nozzle configured to dispense a conductive fluid to define the first portion of the conductive trace pattern;

the printing of the second portion of the conductive trace pattern comprises printing using a second nozzle configured to dispense the conductive fluid to define the second portion of the conductive trace pattern.

20. The method of claim 19, wherein the first nozzle and the second nozzle are each configured to eject droplets comprising a fluid volume of 0.2 to 200 pL.

* * * * *